US011421153B2

(12) United States Patent
Lim

(10) Patent No.: US 11,421,153 B2
(45) Date of Patent: Aug. 23, 2022

(54) QUANTUM DOT-CONTAINING COMPLEX, AND LIGHT-EMITTING DEVICE, OPTICAL MEMBER, AND DEVICE, EACH INCLUDING THE SAME

(71) Applicant: Samsung Display Co., Ltd., Yongin-si (KR)

(72) Inventor: Ho Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/060,499

(22) Filed: Oct. 1, 2020

(65) Prior Publication Data
US 2021/0130686 A1     May 6, 2021

(30) Foreign Application Priority Data

Nov. 1, 2019  (KR) .................. 10-2019-0138770

(51) Int. Cl.
*C09K 11/62*    (2006.01)
*C01B 25/08*    (2006.01)
(Continued)

(52) U.S. Cl.
CPC ............ *C09K 11/62* (2013.01); *C01B 25/087* (2013.01); *C01G 9/08* (2013.01); *C09K 11/02* (2013.01); *C09K 11/025* (2013.01); *C09K 11/565* (2013.01); *H01L 31/035218* (2013.01); *H01L 33/502* (2013.01); *H01L 51/004* (2013.01); *H01L 51/0065* (2013.01); *H01L 51/0067* (2013.01); *H01L 51/0069* (2013.01); *H01L 51/0072* (2013.01); *H01L 51/0073* (2013.01); *H01L 51/502* (2013.01); *B82Y 20/00* (2013.01); *B82Y 30/00* (2013.01); *B82Y 40/00* (2013.01);
(Continued)

(58) Field of Classification Search
CPC ...... C09K 11/025; C09K 11/565; C09K 11/62
See application file for complete search history.

(56) References Cited

U.S. PATENT DOCUMENTS 8,394,976 B2 *  3/2013  Pickett .................. B82Y 30/00
                                                              556/9
9,139,670 B2    9/2015  Joly et al.
(Continued)

FOREIGN PATENT DOCUMENTS

KR    10-2017-0048220    5/2017
KR       10-1825884      2/2018
(Continued)

OTHER PUBLICATIONS

Andrea L. Rodarte et al., "Tuning Quantum-Dot Organization in Liquid Crystals for Robust Photonic Applications", CHEMPHYSCHEM. 2014, vol. 15. pp. 1413-1421, May 1, 2014.*
(Continued)

*Primary Examiner* — C Melissa Koslow
(74) *Attorney, Agent, or Firm* — H.C. Park & Associates, PLC

(57) ABSTRACT

A quantum dot-containing complex that may be used in a light emitting device, an optical member or devices including same includes: a quantum dot; and at least one ligand coordinated to the surface of the quantum dot and being a monomer represented by Formula 1, as defined herein.

19 Claims, 2 Drawing Sheets

(51) Int. Cl.
    *C01G 9/08*     (2006.01)
    *C09K 11/02*     (2006.01)
    *C09K 11/56*     (2006.01)
    *H01L 31/0352*     (2006.01)
    *H01L 51/00*     (2006.01)
    *H01L 51/50*     (2006.01)
    *H01L 33/50*     (2010.01)
    *C08F 220/28*     (2006.01)
    *B82Y 20/00*     (2011.01)
    *B82Y 30/00*     (2011.01)
    *B82Y 40/00*     (2011.01)
    *C08F 292/00*     (2006.01)

(52) U.S. Cl.
    CPC ........ *C08F 220/282* (2020.02); *C08F 292/00* (2013.01)

(56) References Cited

U.S. PATENT DOCUMENTS

| | | | |
|---|---|---|---|
| 10,100,256 | B2 | 10/2018 | Lan |
| 10,246,634 | B2 | 4/2019 | Yang et al. |
| 2006/0068203 | A1* | 3/2006 | Ying ......................... C30B 7/00 428/403 |
| 2006/0169971 | A1* | 8/2006 | Cho ..................... H01G 9/2031 257/14 |
| 2007/0141726 | A1* | 6/2007 | Ying .................. G01N 21/6489 436/525 |
| 2014/0155640 | A1 | 6/2014 | Pickett et al. |
| 2018/0215695 | A1* | 8/2018 | Chen .................... C09K 11/025 |
| 2019/0010391 | A1 | 1/2019 | Chae et al. |
| 2019/0218453 | A1 | 7/2019 | Qiu et al. |
| 2019/0382655 | A1* | 12/2019 | Kuwana ................. C09K 11/08 |

FOREIGN PATENT DOCUMENTS

| | | |
|---|---|---|
| KR | 10-1898746 | 9/2018 |
| KR | 10-2019-0051989 | 5/2019 |
| WO | 2018110406 | 6/2018 |

OTHER PUBLICATIONS

Hyungsuk Moon et al., Stability of Quantum Dots, Quantum Dot Films, and Quantum Dot Light-Emitting Diodes for Display Applications, Advanced Materials, 2019, 14 pages.

Andrea L. Rodarte et al.. Tuning Quantum-Dot Organization in Liquid Crystals for Robust Photonic Applications, CHEMPHYSCHEM, 2014, vol. 15, pp. 1413-1421.

* cited by examiner

QUANTUM DOT-CONTAINING COMPLEX, AND LIGHT-EMITTING DEVICE, OPTICAL MEMBER, AND DEVICE, EACH INCLUDING THE SAME

CROSS REFERENCE TO RELATED APPLICATION

This application claims priority from and the benefit of Korean Patent Application No. 10-2019-0138770, filed on Nov. 1, 2019, which is hereby incorporated by reference for all purposes as if fully set forth herein.

BACKGROUND

Field

Exemplary implementations of the invention relate generally to a quantum dot-containing complex, and more particularly to a light-emitting device, an optical member, and a device, each including the same.

Discussion of the Background

Quantum dots are nanocrystals of semiconductor materials and materials exhibiting a quantum confinement effect. When the quantum dots receive light from an excitation source and reach the energy excited state, the quantum dots themselves emit energy according to a corresponding energy band gap. In this regard, even in a case of the same material, as wavelength varies depending on a particle size, light of a wavelength band, excellent color purity, and high luminescence efficiency may be obtained by adjusting sizes of the quantum dots. Accordingly, the quantum dots are applicable to various devices.

In addition, the quantum dots may be used as materials for performing various optical functions (for example, a light conversion function) of optical members. The quantum dots, as nano-sized semiconductor nanocrystals, may have different energy band gaps by controlling sizes of nanocrystals and compositions, thereby emitting light of various emission wavelengths.

Optical members including quantum dots may have thin-film forms, for example, thin-film forms in which each subpixel is patterned. The optical members may be used as color conversion members of devices including various light sources.

However, as quantum dots are easily oxidized by moisture and oxygen, the efficiency is reduced. In order to solve this problem, a method of coordinating reactive ligands around the quantum dots has been suggested, but it is difficult to efficiently prevent the oxidation of the quantum dots by desorption and rearrangement of the ligands.

The above information disclosed in this Background section is only for understanding of the background of the inventive concepts, and, therefore, it may contain information that does not constitute prior art.

SUMMARY

A quantum dot-containing complex and devices including the same constructed according to the principles and exemplary implementations of the invention have improved stability by introducing a polymerizable group into a reactive ligand coordinated with a quantum dot, and a device using the same.

Additional features of the inventive concepts will be set forth in the description which follows, and in part will be apparent from the description, or may be learned by practice of the inventive concepts.

According to one aspect of the invention, a quantum dot-containing complex includes: a quantum dot; and at least one ligand coordinated to the surface of the quantum dot and being a monomer represented by Formula 1:

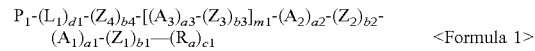  <Formula 1>

  <Formula 2> wherein, in Formulae 1 and 2

$A_1$ to $A_3$ are each, independently from one another, a substituted or unsubstituted $C_3$-$C_{60}$ carbocyclic group or a substituted or unsubstituted $C_1$-$C_{60}$ heterocyclic group;

a1 is an integer from 1 to 6, and a2 and a3 are each, independently from one another, an integer from 0 to 6;

$Z_1$ to $Z_6$ are each, independently from one another, *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S—*', *—SCF$_2$—*', *—(CH$_2$)$_{n1}$—*', *—CF$_2$CH$_2$—*', *—CH$_2$CF$_2$—*', *—(CF$_2$)$_{n1}$—*', *—CH=CH—*', *—CF=CF—*', *—C≡C—*', *—CH=CH—C(=O)O—*', *—OC(=O)—CH=CH—*', *—C($Q_1$)($Q_2$)—*', *—CH(—($S_p$)$_{e1}$—P$_3$)—*', *—CH$_2$CH(—($S_p$)$_{e1}$—P$_3$)—*', *—(CH(—($S_p$)$_{e1}$—P$_3$)CH(—($S_p$)$_{e2}$—P$_3$)—*', or *—O—(CH$_2$)—O(C=O)—(CH$_2$)$_{n2}$—*';

n1 is an integer from 1 to 4, and n2 is an integer from 0 to 2;

b1 to b6 are each, independently from one another, an integer from 0 to 6;

m1 is an integer from 0 to 6;

$L_1$ is a substituted or unsubstituted $C_3$-$C_{60}$ carbocyclic group, a substituted or unsubstituted $C_1$-$C_{60}$ heterocyclic group, *—S(=O)($Q_1$)—*', *—S(=O)$_2$—*', *—P(=O)($Q_1$)—*', *—P(=O)$_2$—*', *—P(=S)($Q_1$)—*', or *—P(=S)$_2$—*';

d1 is an integer from 0 to 4;

$S_p$ is a spacer group or a single bond;

e1 to e2 are each, independently from one another, an integer from 1 to 4;

$R_a$ is an anchoring group;

c1 is an integer from 1 to 6;

$P_1$ to $P_3$ are each, independently from one another, a polymerizable group;

at least one substituent of the substituted $C_3$-$C_{60}$ carbocyclic group and the substituted $C_1$-$C_{60}$ heterocyclic group is a group of Formula 2, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

$Q_1$ to $Q_2$ and $Q_{11}$ to $Q_{13}$ are each, independently from one another, hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group; and

* and *' each indicate a binding site to a neighboring atom.

The variables $A_1$ to $A_3$ may each be, independently from one another:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each, independently from one another, optionally substituted with at least one of a group of Formula 2, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N($Q_1$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$) and —P(=O)($Q_{11}$)($Q_{12}$);

wherein $Q_{11}$ to $Q_{13}$ are each, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group.

The variables *-($A_1$)—*' to *-($A_3$)—*' may be each, independently from one another, a group of Formulae A-1 to A-22, as defined herein.

wherein, in Formulae A-1 to A-22;
* and *' each indicate a binding site to a neighboring atom and a1 to a3 have the same meanings as the above.

The spacer group may be *—N($Q_1$)—*', *—O—*', *—S—*', *—Si($Q_1$)($Q_2$)—*', a divalent $C_1$-$C_{20}$ alkyl group, or a divalent $C_1$-$C_{20}$ alkoxy group; wherein each of the divalent $C_1$-$C_{20}$ alkyl group and divalent $C_1$-$C_{20}$ alkoxy group, independently from one another, optionally substituted with at least one of deuterium, —F, —Cl, —Br, —I, a hydroxyl group, a cyano group, a $C_1$-$C_{10}$ alkyl group, a $C_1$-$C_{10}$ alkoxy group, —NCO, —NCS, —OCN, and —SCN;

wherein $Q_1$ to $Q_2$ may each be, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group; and

* and *' may each indicate a binding site to a neighboring atom.

The variables *—$(S_p)_{e1}$—*' and *—$(S_p)_{e2}$—*' may each be, independently from one another, a single bond, *—$(CH_2)_{i1}$—*', *—$(CH_2CH_2O)_{i1}$—$CH_2CH_2$—*', *—$CH_2CH_2$—S—$CH_2CH_2$—*', *—$CH_2CH_2$—NH—$CH_2CH_2$—*', or *—$(SiQ_1Q_2\text{-O})_{i1}$—*'; wherein i1 is an integer from 1 to 12;

$Q_1$ to $Q_2$ may each be, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group; and

* and *' each indicate a binding site to a neighboring atom.

The variable $R_a$ may be an organic salt, *—OH, *—$NO_2$, *—COOH, —F, —Cl, —Br, —I, *—(O(C($Q_1$)($Q_2$))$_{n3}$—O—C($Q_3$)($Q_4$)(Q))$_{n4}$, *—N($Q_1$)($Q_2$), a substituted or unsubstituted $C_1$-$C_{30}$ alcohol group, a substituted or unsubstituted $C_1$-$C_{30}$ carboxylic acid group, a substituted or unsubstituted $C_3$-$C_{60}$ carbocyclic group, or a substituted or unsubstituted $C_1$-$C_{60}$ heterocyclic group; and at least one substituent of the substituted $C_3$-$C_{60}$ carbocyclic group, the substituted $C_1$-$C_{60}$ heterocyclic group, the substituted $C_1$-$C_{30}$ alcohol group, and the substituted $C_1$-$C_{30}$ carboxylic acid group is a group of Formula 2, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

wherein $Q_1$ to $Q_5$ and $Q_{11}$ to $Q_{13}$ may each be, independently from one another, hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{60}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group;

n3 and n4 may each be, independently from one another, an integer from 1 to 6; and

* may indicate a binding site to a neighboring atom.

The variable $R_a$ may be a group of Formulae E-1 to E-28, as defined herein.

The variables $P_1$ to $P_3$ may each be, independently from one another, a group of Formulae P-1 to P-10, as defined herein.

The at least one ligand is one or more of ligand 1 to ligand 14, as defined herein.

The quantum dot may include a core including a first semiconductor having a crystal structure and a shell including a second semiconductor having a crystal structure, or may be a Perovskite compound.

The first semiconductor and the second semiconductor may each be, independently from one another, may include Group 12-Group 16-based compounds, Group 13-Group 15-based compounds, Group 14-Group 16-based compounds, Group 14-based compounds, Group 11-Group 13-Group 16-based compounds, Group 11-Group 12-Group 13-Group 16-based compounds, or any combination thereof.

The first semiconductor and the second semiconductor may each, independently from one another, include: CdS, CdSe, CdTe, ZnS, ZnSe, ZnTe, ZnO, HgS, HgSe, HgTe, MgS, and MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, and MgZnSe; CdZnSeS, CdZnSeTe, CdZnSTe, CdHgSeS, CdHgSeTe, CdHgSTe, HgZnSeS, HgZnSeTe, and HgZnSTe;

GaN, GaP, GaAs, GaSb, AlN, AlP, AlAs, AlSb, InN, InP, InAs, and InSb; GaNP, GaNAs, GaNSb, GaPAs, GaPSb, AlNP, AlNAs, AlNSb, AlPAs, AlPSb, InGaP, InAP, InNP, InNAs, InNSb, InPAs, InPSb, and GaAlNP; GaAlNAs, GaAlNSb, GaAPAs, GaAPSb, GaInNP, GaInNAs, GaInNSb, GaInPAs, GaInPSb, InAlNP, InAlNAs, InAlNSb, InAlPAs, and InAPSb;

InZnP;

SnS, SnSe, SnTe, PbS, PbSe, and PbTe; SnSeS, SnSeTe, SnSTe, PbSeS, PbSeTe, PbSTe, SnPbS, SnPbSe, and SnPbTe; SnPbSSe, SnPbSeTe, and SnPbSTe;

Si, Ge, SiC, and SiGe;

AgInS, $AgInS_2$, CuInS, $CuInS_2$, $CuGaO_2$, $AgGaO_2$, and $AgAlO_2$; or any combination thereof.

The first semiconductor may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

The average particle diameter (D50) of the quantum dot may be about 2 to about nm.

A light-emitting device may include: a first electrode; a second electrode facing the first electrode; and an emission layer disposed between the first electrode and the second electrode, wherein the emission layer may include the quantum dot-containing complex defined above.

An optical member may include the quantum dot-containing complex defined above.

The optical member may include a color conversion member.

A device may include the quantum dot-containing complex defined above.

The quantum dot-containing complex may be located in a path of light to be emitted from the light source.

The light source may include an organic light emitting diode or a light-emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
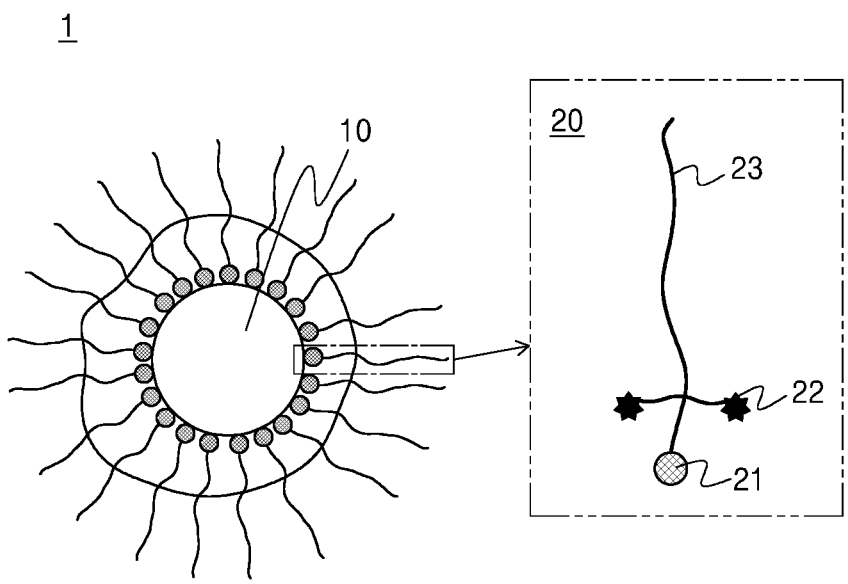
FIG. 1 is a schematic diagram of an exemplary embodiment illustrating a structure of a quantum dot-containing complex constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Quantum Dot-Containing Complex

FIG. 1 is a schematic diagram of an exemplary embodiment illustrating a structure of a quantum dot-containing complex constructed according to the principles of the invention.

Referring to FIG. 1, the quantum dot-containing complex 1 includes: a quantum dot 10; and at least one ligand 20 coordinated to the surface of the quantum dot 10 and represented by Formula 1.

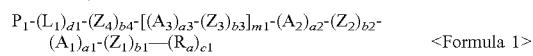  <Formula 1>

  <Formula 2>

In Formula 1, $A_1$ to $A_3$ may each independently be a substituted or unsubstituted $C_3$-$C_{60}$ carbocyclic group or a substituted or unsubstituted $C_6$-$C_{60}$ heterocyclic group.

For example, $A_1$ to $A_3$ may each independently be selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group, each substituted with at least one selected from a group represented by Formula 2, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), wherein $Q_{11}$ to $Q_{13}$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

In Formula 1, a1 may be an integer from 1 to 6, and a2 and a3 may each independently be an integer from 0 to 6.

a1 to a3 are the numbers of $A_1$ to $A_3$, respectively, when a1 is 2 or more, two or more $A_1$(s) may be identical to or different from each other, when a2 is 2 or more, two or more $A_2$(s) may be identical to or different from each other, when a3 is 2 or more, two or more $A_3$(s) may be identical to or different from each other, when a2 is 0, -($A_2$)$_{a2}$- may be a single bond, and when a3 is 0, -($A_3$)$_{a3}$- may be a single bond.

For example, *-($A_1$)$_{a1}$-*' to *-($A_3$)$_{a3}$-*' may each independently be selected from a group represented by Formulae A-1 to A-22:

A-1

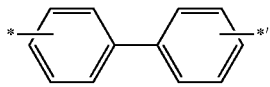
A-2

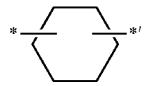
A-3

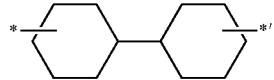
A-4

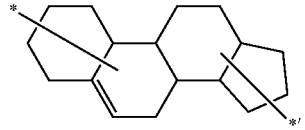
A-5

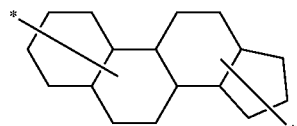
A-6

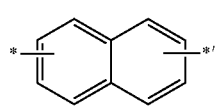
A-7

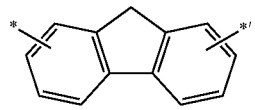
A-8

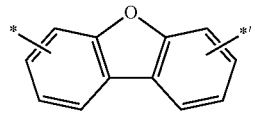
A-9

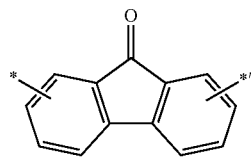
A-10

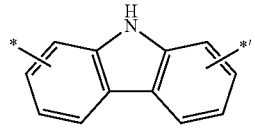
A-11

A-12

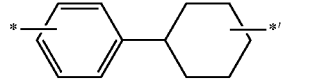
A-13

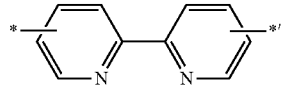
A-14

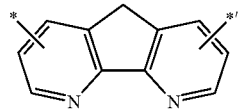
A-15

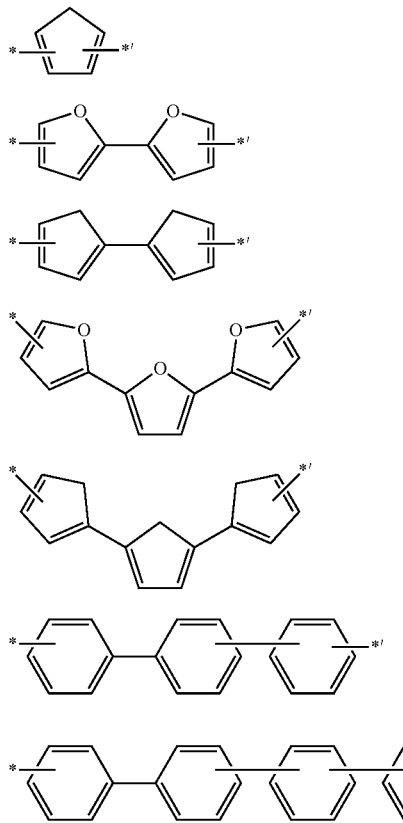

A-16
A-17
A-18
A-19
A-20
A-21
A-22

In Formulae 1 and 2, $Z_1$ to $Z_6$ may each independently be selected from *—O—*', *—S—*', *—C(=O)—*', *—C(=O)O—*', *—OC(=O)—*', *—O—C(=O)—O—*', *—OCH$_2$—*', *—SCH$_2$—*', *—CH$_2$S—*', *—CF$_2$O—*', *—OCF$_2$—*', *—CF$_2$S—*', *—SCF$_2$—*', *—(CH$_2$)$_{n1}$—*', *—CF$_2$CH$_2$—*', *—CH$_2$CF$_2$—*', *—(CF$_2$)$_{n1}$—*', *—CH=CH—*', *—CF=CF—*', *—C≡C—*', *—CH=CH—C(=O)O—*', *—OC(=O)—CH=CH—*', *—C(Q$_1$)(Q$_2$)—*', *—CH(—(S$_p$)$_{e1}$—P$_3$)*', *—CH$_2$CH(—(S$_p$)$_{e1}$—P$_3$)—*', *—(CH(—(S$_p$)$_{e1}$—P$_3$)CH(—(S$_p$)$_{e2}$—P$_3$)—*', and *—O(CH$_2$)—O(C=O)—(CH$_2$)$_{n2}$—*', n1 may be an integer from 1 to 4, and n2 may be an integer from 0 to 2, and b1 to b6 may each independently be an integer from 0 to 6.

b1 to b6 are the numbers of $Z_1$ to $Z_6$, respectively, when b1 is 2 or more, two or more $Z_1$(s) may be identical to or different from each other, when b2 is 2 or more, two or more $Z_2$(s) may be identical to or different from each other, when b3 is 2 or more, two or more $Z_3$(s) may be identical to or different from each other, when b4 is 2 or more, two or more $Z_4$(s) may be identical to or different from each other, when b5 is 2 or more, two or more $Z_5$(s) may be identical to or different from each other, when b6 is 2 or more, two or more $Z_6$(s) may be identical to or different from each other, when b1 is 0, —(Z$_1$)$_{b1}$— may be a single bond, when b2 is 0, —(Z$_2$)$_{b2}$— may be a single bond, when b3 is 0, —(Z$_3$)$_{b3}$— may be a single bond, when b4 is 0, —(Z$_4$)$_{b4}$— may be a single bond, when b5 is 0, —(Z$_5$)$_{b5}$— may be a single bond, and when b6 is 0, —(Z$_6$)$_{b6}$— may be a single bond.

In Formula 1, m1 may be an integer from 0 to 6.

m1 is the number of groups represented by "—[(A$_3$)$_{a3}$-(Z$_3$)$_{b3}$]—", when m1 is 2 or more, groups represented by "—[(A$_3$)$_{a3}$-(Z$_3$)$_{b3}$]—" may be identical to or different from each other, and when m1 is 0, a group represented by "—[(A$_3$)$_{a3}$-(Z$_3$)$_{b3}$]—" may be a single bond.

In Formula 1, $L_1$ may be selected from a substituted or unsubstituted $C_3$-$C_{60}$ carbocyclic group, a substituted or unsubstituted $C_1$-$C_{60}$ heterocyclic group, *—S(=O)(Q$_1$)—*', *—S(=O)$_2$—*', *—P(=O)(Q$_1$)—*', *—P(=O)$_2$—*', *—P(=S)(Q$_1$)—*', and *—P(=S)$_2$—*'.

For example, $L_1$ may be selected from:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, an imidazopyrimidine group, *—S(=O)(Q$_1$)—*', *—S(=O)$_2$—*', *—P(=O)(Q)-*', *—P(=O)$_2$—*', *—P(=S)(Q$_1$)—*', and *—P(=S)$_2$—*'; and a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, and an imidazopyrimidine group, each substituted with at least one selected from a group represented by Formula 2, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N(Q₁₁)₂, —Si(Q₁₁)(Q₁₂)(Q₁₃), —N(Q₁₁)(Q₁₂), —B(Q₁₁)(Q₁₂), —C(=O)(Q₁₁), —S(=O)₂(Q₁₁), and —P(=O)(Q₁₁)(Q₁₂), wherein $Q_1$ and $Q_{11}$ to $Q_{13}$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

In Formula 1, d1 may be an integer from 0 to 4.

d1 is the number of $L_1$(s), when d1 is 2 or more, two or more $L_1$(s) may be identical to or different from each other, and when d1 is 0, -(L₁)$_{d1}$- may be a single bond.

In Formulae 1 and 2, $S_p$ is a spacer group or a single bond.

Here, the spacer group may connect a core group $A_1$ to a polymerizable group or a core group $A_1$ to an anchoring group.

For example, the spacer group may be selected from: *—N(Q₁)—*', *—O—*', *—S—*', *—Si(Q₁)(Q₂)—*', a divalent $C_1$-$C_{20}$ alkyl group, and a divalent $C_1$-$C_{20}$ alkoxy group; and a divalent $C_1$-$C_{20}$ alkyl group and a divalent $C_1$-$C_{20}$ alkoxy group, each substituted with at least one of deuterium, —F, —Cl, —Br, —I, a hydroxyl group, a cyano group, a $C_1$-$C_{10}$ alkyl group, a $C_1$-$C_{10}$ alkoxy group, —NCO, —NCS, —OCN, and —SCN, wherein $Q_1$ to $Q_2$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group, and

* and *' each indicate a binding site to a neighboring atom.

In Formulae 1 and 2, e1 to e2 may each independently be an integer from 1 to 4.

Each of e1 to e2 is the number of $S_p$(s), and when e1 or e2 is 2 or more, two or more $S_p$(s) may be identical to or different from each other.

For example, *—(S$_p$)$_{e1}$—*' and *—(S$_p$)$_{e2}$—*' may each independently be selected from a single bond, *—(CH₂)—*', *—(CH₂CH₂O)$_{i1}$—CH₂CH₂—*', *—CH₂CH₂—S—CH₂CH₂—*', *—CH₂CH₂—NH—CH₂CH₂—*', and *—(SiQ₁Q₂-O)$_{i1}$—*', wherein i1 may be an integer from 1 to 12, $Q_1$ to $Q_2$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group, and

* and *' each indicate a binding site to a neighboring atom.

In Formula 1, $R_a$ is an anchoring group 21.

Here, when the ligand 20 is coordinated with the quantum dot 10, the anchoring group 21 is a coupler for adsorbing the ligand 20 on the quantum dot 10.

For example, $R_a$ may be selected from an organic salt, *—OH, *—NO₂, *—COOH, —F, —Cl, —Br, —I, *—(O(C(Q₁)(Q₂)))$_{n3}$—O—C(Q₃)(Q₄)(Q))$_{n4}$, *—N(Q₁)(Q₂), a substituted or unsubstituted $C_1$-$C_{30}$ alcohol group, a substituted or unsubstituted $C_1$-$C_{30}$ carboxylic acid group, a substituted or unsubstituted $C_3$-$C_{60}$ carbocyclic group, and a substituted or unsubstituted $C_1$-$C_{60}$ heterocyclic group, wherein at least one substituent of the substituted $C_3$-$C_{60}$ carbocyclic group, the substituted $C_1$-$C_{60}$ heterocyclic group, the substituted $C_1$-$C_{30}$ alcohol group, and the substituted $C_1$-$C_{30}$ carboxylic acid group may be selected from a group represented by Formula 2, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —NCO, —NCS, —OCN, —SCN, —C(=O)N(Q₁₁)₂, —Si(Q₁₁)(Q₁₂)(Q₁₃), —N(Q₁₁)(Q₁₂), —B(Q₁₁)(Q₁₂), —C(=O)(Q₁₁), —S(=O)₂(Q₁₁), and —P(=O)(Q₁₁)(Q₁₂), $Q_1$ to $Q_5$ and Q to $Q_{13}$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, n3 and n4 may each independently be an integer from 1 to 6, and

* may indicate a binding site to a neighboring atom.

Here, the "organic salt" is not particularly limited as long as it is a salt of an organic group, but may be, for example, a salt of an imide group, a salt of a carboxyl group, a salt of a sulfonic acid group, a salt of a phosphoric acid, and the like.

For example, $R_a$ may be selected from a group represented by Formulae E-1 to E-28:

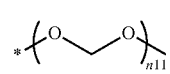

E-1

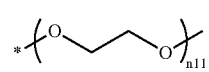

E-2

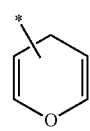

E-3

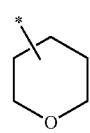

E-4

E-5

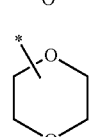

E-6

E-7

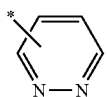
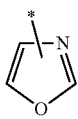
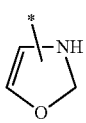
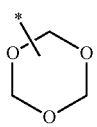
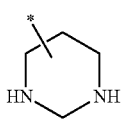
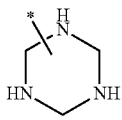
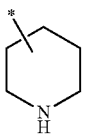
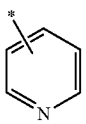
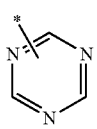
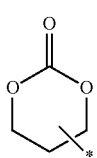
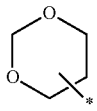

E-8

$*-N\begin{smallmatrix}(CH_2)_{n12}-OH \\ (CH_2)_{n11}-OH\end{smallmatrix}$    E-20

E-9

$*-N\begin{smallmatrix}(CH_2)_{n12}-CH_3 \\ (CH_2)_{n11}-OH\end{smallmatrix}$    E-21

\*—OH    E-22

E-10

\*—NH$_2$    E-23

\*—NO$_2$    E-24

\*—COOH    E-25

E-11

I—Cl    E-26

\*—Br    E-27

\*—I    E-28

E-12

In Formulae E-1 to E-28,
n11 and n12 may each independently be an integer from 1 to 12, and
\* indicates a binding site to a neighboring atom.

In Formula 1, c1 may be an integer from 1 to 6.

E-13 c1 is the number of $R_a$(s), and when c1 is 2 or more, two or more $R_a$(s) may be identical to or different from each other.

In Formulae 1 and 2, $P_1$ to $P_3$ may each independently be a polymerizable group 22.

E-14

The ligand 20 is a monomer including the polymerizable group 22, and after each polymerizable group 22 of neighboring ligands is polymerized with each other by heating or the like, a network between the ligands is formed to exhibit thermosetting properties. Through the network, the ligand 20 may be prevented from desorption or rearrangement.

E-15

For example, $P_1$ to $P_3$ may each independently be selected from a group represented by Formulae P-1 to P-10:

P-1

![methacryloyl group]

E-16

P-2

![acryloyl group]

E-17

P-3

![vinyl group]

P-4

![ethynyl group]

E-18

P-5

![butadiynyl group]

P-6

![α-methylene-γ-butyrolactone group]

E-19

P-7

![vinyloxycarbonyl group]

P-8

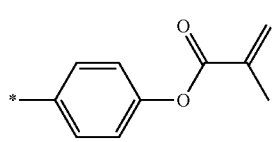

P-9

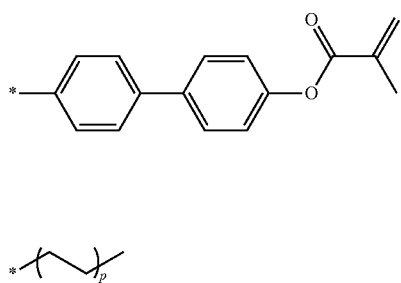

P-10

In Formulae P-1 to P-10,
p may be an integer from 1 to 20, and
* indicates a binding site to a neighboring atom.

At least one substituent of the substituted C3-C60 carbocyclic group and the substituted C1-C60 heterocyclic group may be selected from a group represented by Formula 2, deuterium, —F, —Cl, —Br, —I, a hydroxyl group, a cyano group, a nitro group, an amidino group, a hydrazine group, a hydrazone group, a C1-C60 alkyl group, a C2-C60 alkenyl group, a C2-C60 alkynyl group, a C1-C60 alkoxy group, a C3-C10 cycloalkyl group, a C1-C10 heterocycloalkyl group, a C3-C10 cycloalkenyl group, a C1-C10 heterocycloalkenyl group, a C6-C60 aryl group, a C6-C60 aryloxy group, a C6-C60 arylthio group, a C1-C60 heteroaryl group, a monovalent non-aromatic condensed polycyclic group, a monovalent non-aromatic condensed heteropolycyclic group, —NCO, —NCS, —OCN, —SCN, —C(=O)N(Q11)2, —Si(Q11)(Q12)(Q13), —N(Q11)(Q12), —B(Q11)(Q12), —C(=O)(Q11), —S(=O)2(Q11), and —P(=O)(Q11)(Q12), wherein $Q_1$ to $Q_3$ and $Q_{11}$ to $Q_{13}$ may each independently be selected from hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* and *' each indicate a binding site to a neighboring atom.

In one or more exemplary embodiments, in Formula 1, A1 may be substituted with at least one group represented by Formula 2.

The group substituted with A1 and represented by Formula 2 may be a dispersion group 23.

The dispersion group 23 may improve dispersion of ligands such that when ink and photoresist are manufactured by using quantum dots, the quantum dots may be uniformly dispersed in a matrix.

For example, the ligand 20 may be at least one selected from ligand 1 to ligand 14:

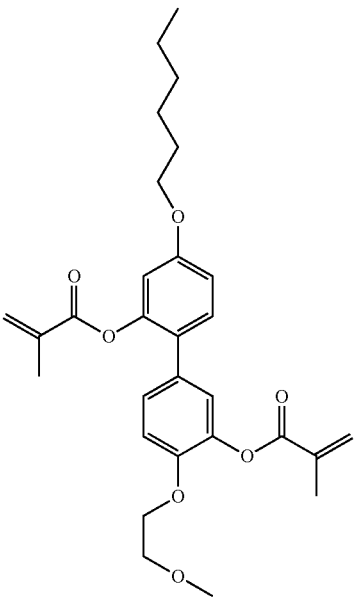

1

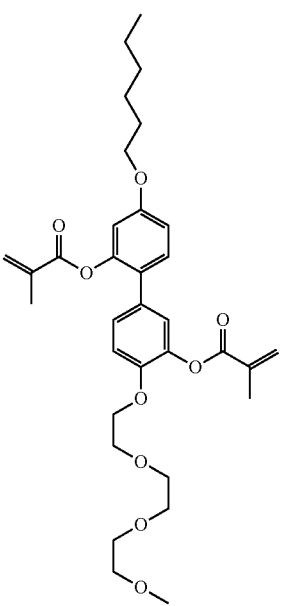

2

3
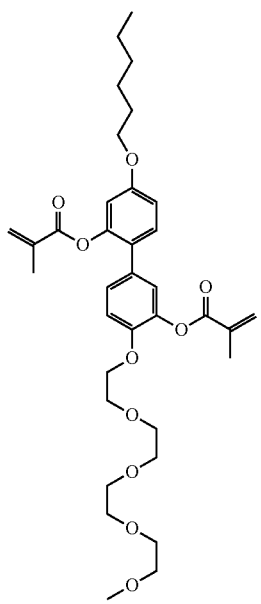
5
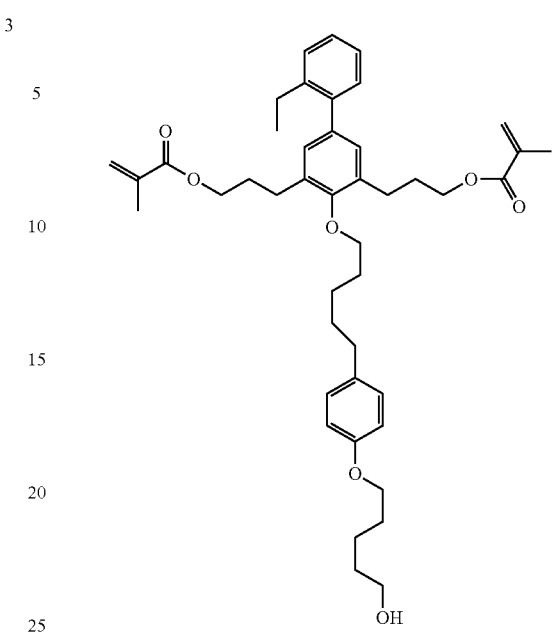
4
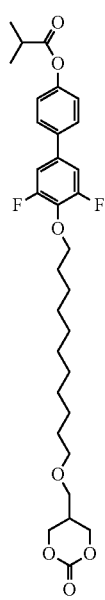
6
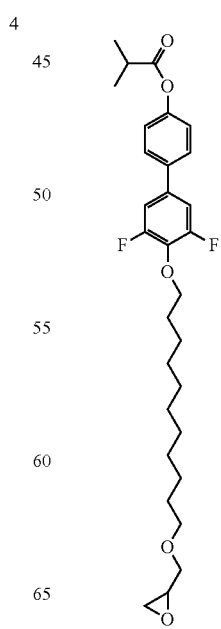

-continued
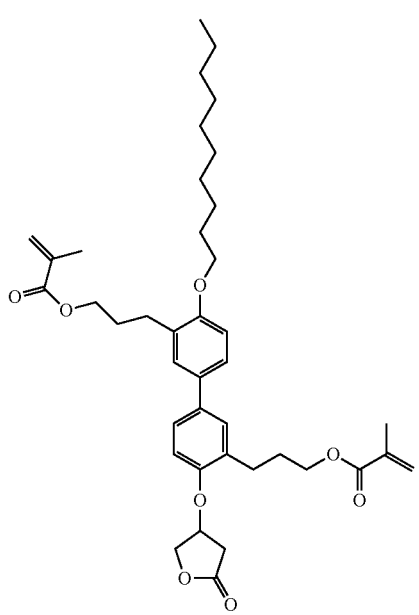
7
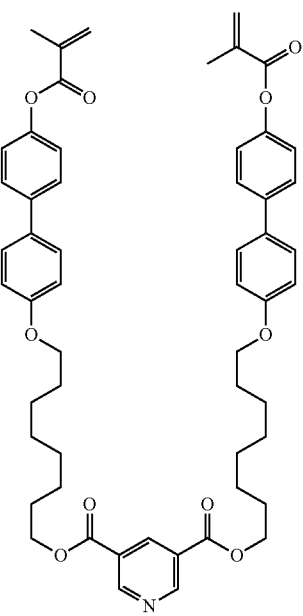
8
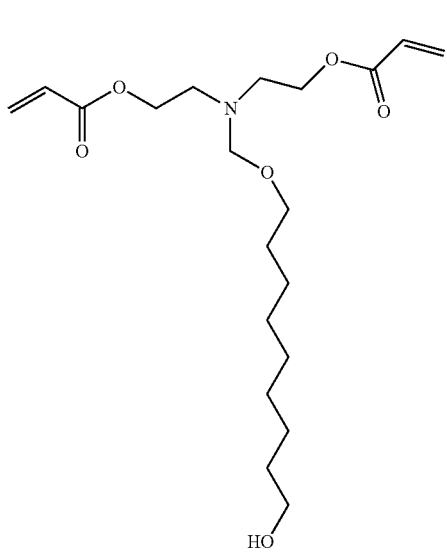
9
10
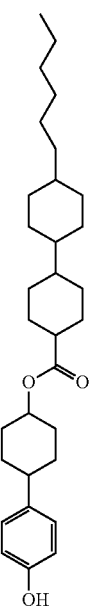

23
-continued
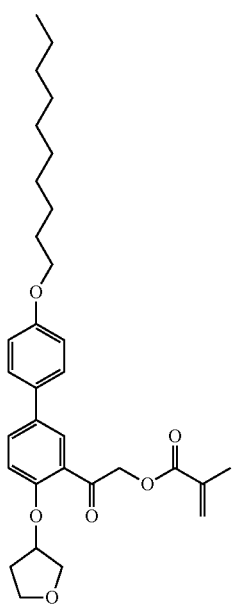
24
-continued
11
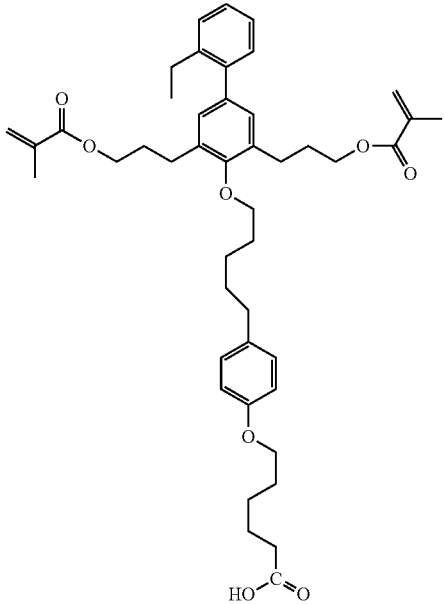
12
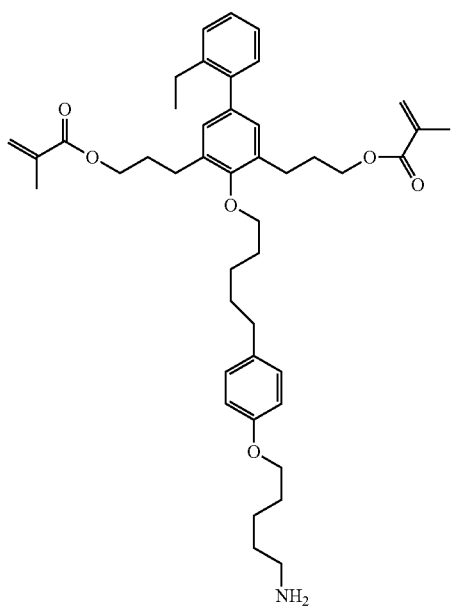
13
14
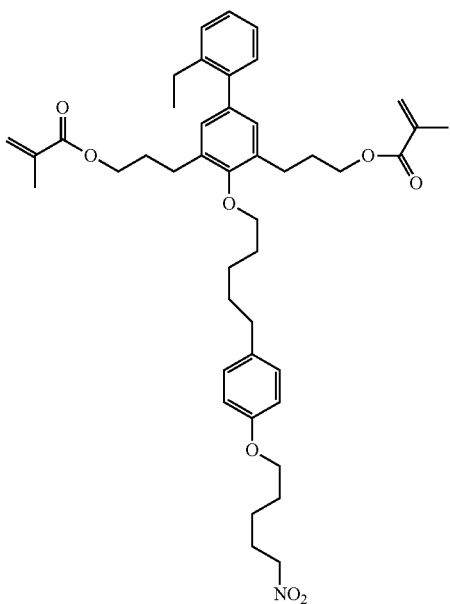

As described above, the ligand 20 is a monomer including the polymerizable group 22, and after each polymerizable group 22 of neighboring ligands are polymerized with each other by heating or the like, a network between the ligands is formed to exhibit thermosetting properties. Through the network, the ligand 20 may be prevented from desorption and rearrangement. Accordingly, a stable quantum dot may be manufactured.

In contrast, when the ligand is not polymerized, the equilibrium state may be changed by changes in concentration, pressure, temperature, and the like in a state where the ligand is adsorbed on the surface of the quantum dot. In this regard, when the ligand adsorbed on the surface of the quantum dot is desorbed from the surface of the quantum dot, degradation of the quantum dot may be accelerated.

The quantum dot 10 is a spherical semiconductor nanomaterial having the size of about several to several hundreds of nm and may include a core formed of a material having a small band gap and a shell disposed to surround the core.

In one or more exemplary embodiments, the quantum dot 10 may have a core-shell structure including a core including a first semiconductor having a crystal structure and a shell including a second semiconductor having a crystal structure, or may be a Perovskite compound.

In one or more exemplary embodiments, the first semiconductor and the second semiconductor may each independently include Group 12-Group 16-based compounds, Group 13-Group 15-based compounds, Group 14-Group 16-based compounds, Group 14-based compounds, Group 11-Group 13-Group 16-based compounds, Group 11-Group 12-Group 13-Group 16-based compounds, and any combination thereof.

For example, the first semiconductor and the second semiconductor may each independently include CdS, CdSe, CdTe, ZnS, ZnSe, ZnTe, ZnO, HgS, HgSe, HgTe, MgS, MgSe;

CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, and MgZnSe; CdZnSeS, CdZnSeTe, CdZnSTe, CdHgSeS, CdHgSeTe, CdHgSTe, HgZnSeS, HgZnSeTe, and HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAP, InNP, InNAs, InNSb, InPAs, InPSb, GaAlNP; GaAlNAs, GaAlNSb, GaAPAs, GaAPSb, GaInNP, GaInNAs, GaInNSb, GaInPAs, GaInPSb, InAlNP, InAlNAs, InAlNSb, InAlPAs, and InAPSb;

InZnP;

SnS, SnSe, SnTe, PbS, PbSe, and PbTe; SnSeS, SnSeTe, SnSTe, PbSeS, PbSeTe, PbSTe, SnPbS, SnPbSe, and SnPbTe; SnPbSSe, SnPbSeTe, and SnPbSTe;

Si, Ge, SiC, and SiGe;

AgInS, $AgInS_2$, CuInS, $CuInS_2$, $CuGaO_2$, $AgGaO_2$, and $AgAlO_2$; and any combination thereof.

For example, the first semiconductor may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, and any combination thereof.

The Perovskite compound is a material having a three-dimensional crystal structure related to a crystal structure of $CaTiO_3$.

For example, the Perovskite compound may be represented by Formula 4:

$$[A][B_m][X]_3 \qquad <\text{Formula 4}>$$

In Formula 4,

A may be at least one monovalent organic-cation, a monovalent inorganic-cation, or any combination thereof, B may be at least one divalent inorganic-cation, m may a real number satisfying $0<m\leq 1$, and X may be at least one monovalent anion.

An average particle diameter (D50) of the quantum dot 10 may be in a range of about 2 to about 10 nm.

An average particle diameter (D50) of the quantum dot-containing complex 1 may be in a range of about 40 nm to about 1,000 nm, for example, about 50 nm to about 1,000 nm or about 100 nm to about 500 nm, and, as another example, about 100 nm to about 200 nm. When the average particle diameter (D50) of the quantum dot-containing complex 1 is within the range, the quantum dot-containing complex 1 may have an excellent degree of dispersion while including a relatively large amount of quantum dots 10.

Light-Emitting Device

Figure 2:
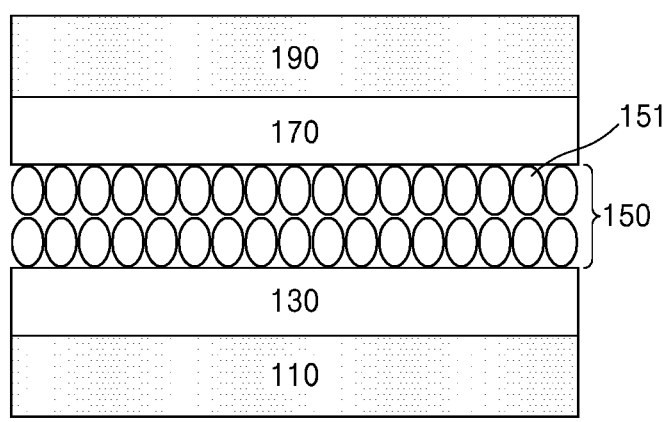
FIG. 2 is a schematic diagram of an exemplary embodiment illustrating a structure of a light-emitting device constructed according to the principles of the invention.

FIG. 2 is a schematic diagram of an exemplary embodiment illustrating a structure of a light-emitting device constructed according to the principles of the invention.

A structure of the light-emitting device 100 according to an exemplary embodiment and a method of manufacturing is described in connection with FIG. 2.

Referring to FIG. 2, the light-emitting device 100 according to an exemplary embodiment includes: a first electrode 110; a second electrode 190 facing the first electrode 110; is an emission layer 150 disposed between the first electrode 110 and the second electrode 190, wherein the emission layer 150 includes a quantum dot-containing complex 151.

The quantum dot-containing complex 151 is described herein.

In one or more exemplary embodiments, the light-emitting device 100 may further include at least one of a hole transport region 130 disposed between the first electrode 110 and the emission layer 150 and an electron transport region 170 disposed between the emission layer 150 and the second electrode 190.

First Electrode 110

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

In FIG. 2, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be a reflective electrode, a semi-transmissive electrode, or a transmissive electrode. When the first electrode 110 is a transmissive electrode, a material for forming the first electrode 110 may be selected from an indium tin oxide (ITO), an indium zinc oxide (IZO), a tin oxide ($SnO_2$), a zinc oxide (ZnO), and any combinations thereof, but exemplary embodiments are not limited thereto. In one or more exemplary embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but exemplary embodiments are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Hole Transport Region 130

The hole transport region 130 may have i) a single-layered structure consisting of a single layer consisting of a single material, ii) a single-layered structure consisting of a single layer consisting of a plurality of different materials, or iii) a multi-layered structure having a plurality of layers consisting of a plurality of different materials.

The hole transport region 130 may include at least one layer selected from a hole injection layer, a hole transport layer, an emission auxiliary layer, and an electron blocking layer.

For example, the hole transport region 130 may have a single-layered structure consisting of a single layer consisting of a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituent layers are sequentially stacked from the first electrode 110 in this stated order, but the structure of the hole transport region is not limited thereto.

The hole transport region may include at least one selected from 4,4',4"-tris[phenyl(m-tolyl)amino]triphenylamine (m-MTDATA); 1-N,1-N-bis[4-(diphenylamino) phenyl]-4-N,4-N-diphenylbenzene-1,4-diamine (TDATA), 4,4',4"-tris[2-naphthyl(phenyl)amino]triphenylamine (2-TNATA); N,N'-di(naphtalene-1-yl)-N,N'-diphenyl-benzidine (NPB or NPD); N4,N4'-di(naphthalen-2-yl)-N4,N4'-diphenyl-[1,1'-biphenyl]-4,4'-diamine (β-NPB); N,N'-bis(3-methylphenyl)-N,N'-diphenyl-[1,1-biphenyl]-4,4'-diamine (TPD); 4(N,N'-bis(3-methylphenyl)-N,N'-diphenyl-9,9-spirobifluorene-2,7-diamine (spiro-TPD); 2,7-bis[N-(1-naphthyl)anilino]-9,9'-spirobi[9H-fluorene] (spiro-NPB); 2,2'-dimethyl-N,N'-di-[(1-naphthyl)-N,N'-diphenyl]-1,1'-biphenyl-4,4'-diamine (methylated-NPB); 4,4'-cyclohexylidene bis[N,N-bis(4-methylphenyl) benzenamine] (TAPC); 4,4'-bis[N,N'-(3-tolyl)amino]-3,3'-dimethylbiphenyl (HMTPD); 4,4',4"-tris(N-carbazolyl) triphenylamine (TCTA); polyaniline/ dodecylbenzenesulfonic acid (PANI/DBSA); poly(3,4-ethylenedioxythiophene)/poly(4-styrenesulfonate) (PEDOT/PSS); polyaniline/camphor sulfonic acid (PANI/CSA), polyaniline/poly(4-styrenesulfonate) (PANI/PSS); a compound represented by Formula 201, and a compound represented by Formula 202:

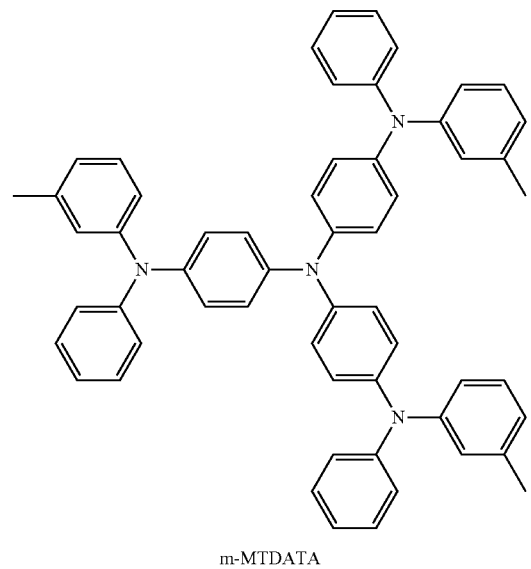

m-MTDATA

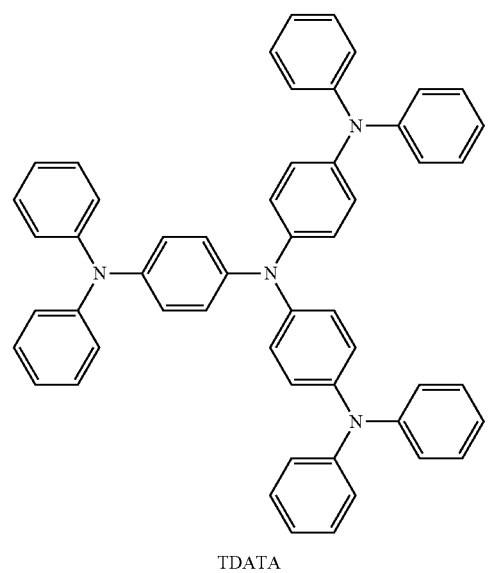

TDATA

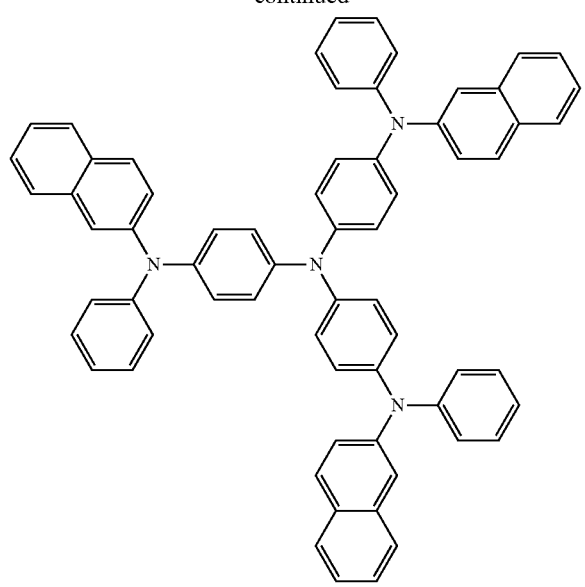
2-TNATA
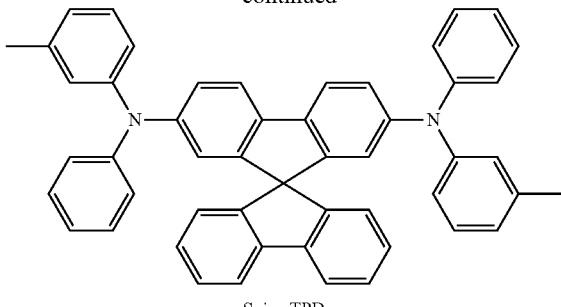
Spiro-TPD
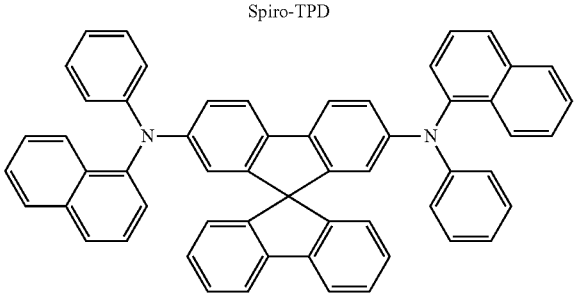
Spiro-NPB
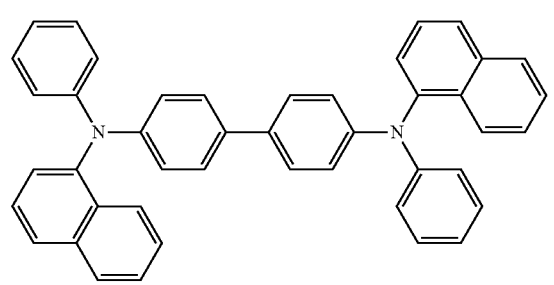
NPB
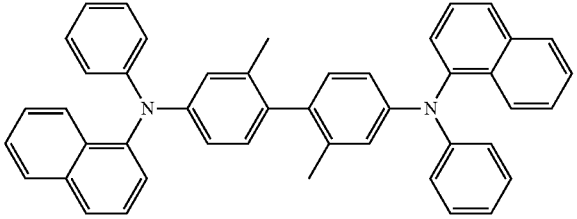
methylated NPB
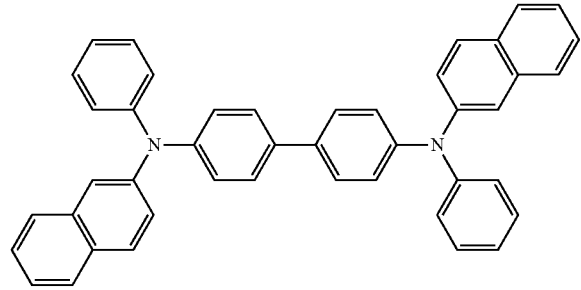
β-NPB
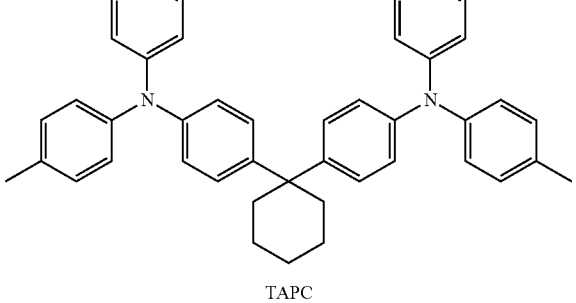
TAPC
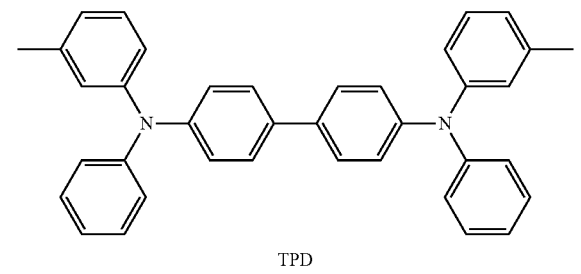
TPD
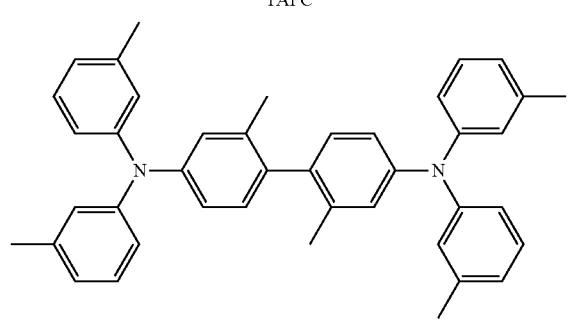
HMTPD
<Formula 201>
$$R_{201}\!-\!(L_{201})_{xa1}\!-\!N\!\begin{array}{c}(L_{202})_{xa2}\!-\!R_{202}\\ (L_{203})_{xa3}\!-\!R_{203}\end{array}$$

<Formula 202>

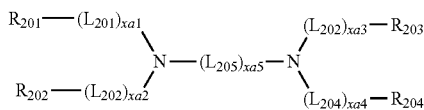

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{20}4$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more exemplary embodiments, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one or more exemplary embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more exemplary embodiments, xa1 to xa4 may each independently be 0, 1, or 2.

In one or more exemplary embodiments, xa5 may be 1, 2, 3, or 4.

In one or more exemplary embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ are the same as described above.

In one or more exemplary embodiments, at least one of $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cyclo-heptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but exemplary embodiments are not limited thereto.

In one or more exemplary embodiments, in Formula 202, i) $R_{201}$ and $R_{202}$ may be linked to each other via a single bond, and/or ii) $R_{203}$ and $R_{204}$ may be linked to each other via a single bond.

In one or more exemplary embodiments, at least one of $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but exemplary embodiments are not limited thereto.

The compound represented by Formula 201 may be represented by Formula 201-1 below:

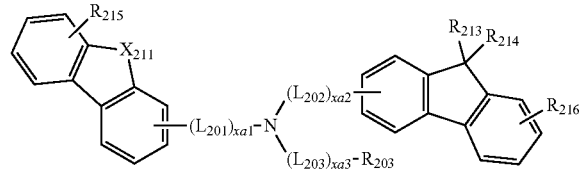

<Formula 201-1>

In one exemplary embodiment, the compound represented by Formula 201 may be represented by Formula 201-2 below, but exemplary embodiments are not limited thereto:

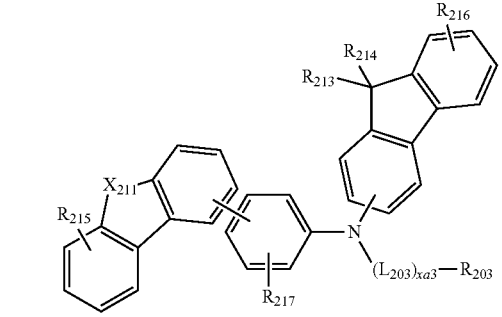

<Formula 201-2>

In one or more exemplary embodiments, the compound represented by Formula 201 may be represented by Formula 201-2(1) below, but exemplary embodiments are not limited thereto:

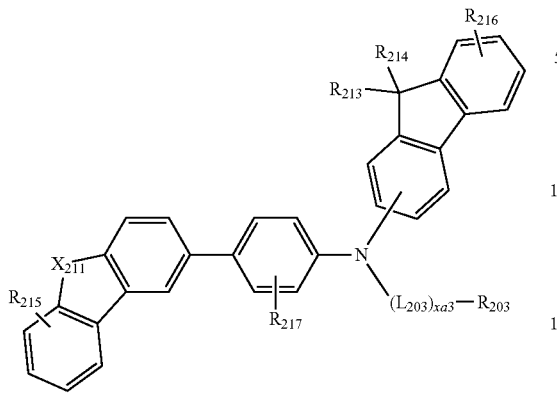

<Formula 201-2(1)>

The compound represented by Formula 201 may be represented by Formula 201A below:

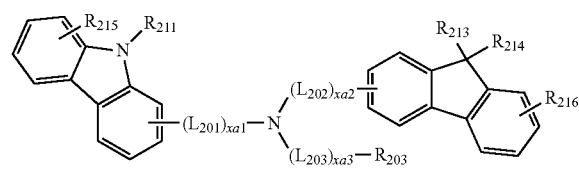

<Formula 201A>

In one exemplary embodiment, the compound represented by Formula 201 may be represented by Formula 201A(1) below, but exemplary embodiments are not limited thereto:

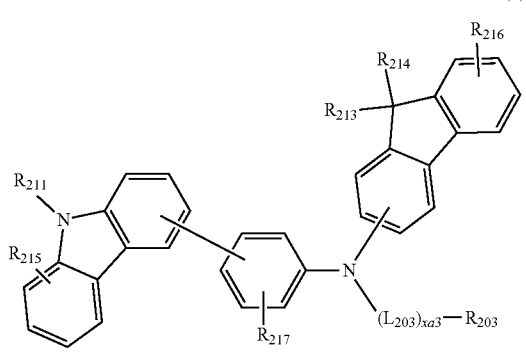

<Formula 201A(1)>

In one or more exemplary embodiments, the compound represented by Formula 201 may be represented by Formula 201A-1 below, but exemplary embodiments are not limited thereto:

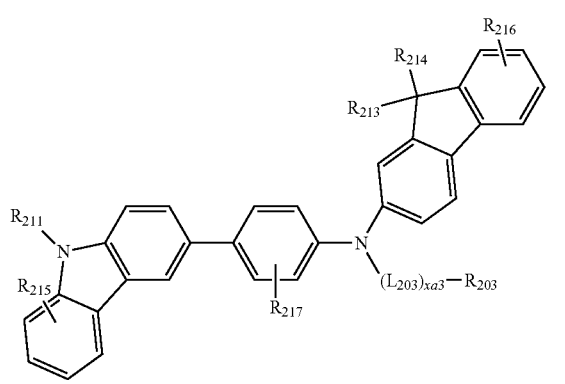

<Formula 201A-1>

In one exemplary embodiment, the compound represented by Formula 202 may be represented by Formula 202-1 below:

<Formula 202-1>

In one or more exemplary embodiments, the compound represented by Formula 202 may be represented by Formula 202-1(1) below:

<Formula 202-1(1)>

In one exemplary embodiment, the compound represented by Formula 202 may be represented by Formula 202A below:

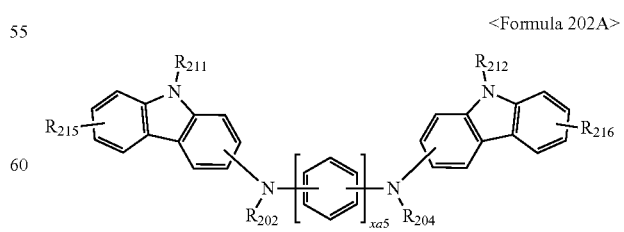

<Formula 202A>

In one or more exemplary embodiments, the compound represented by Formula 202 may be represented by Formula 202A-1 below:

<Formula 202A-1>

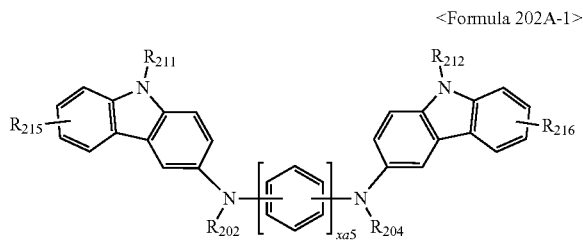

In Formulae 201-1, 201-2, 201-2(1), 201A, 201A(1), 201A-1, 202-1, 202-1(1), 202A, and 202A-1, $L_{201}$ to $L_{203}$, xa1 to xa3, xa5, and $R_{202}$ to $R_{204}$ may each be understood by referring to the corresponding descriptions thereof presented herein, $L_{205}$ may be selected from a phenylene group and a fluorenylene group, $X_{211}$ may be selected from O, S, and N($R_{211}$), $X_{212}$ may be selected from O, S, and N($R_{212}$), $R_{211}$ and $R_{212}$ may each be understood by referring to the descriptions provided in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region 130 may include at least one compound selected from Compounds HT1 to HT48, but exemplary embodiments are not limited thereto:

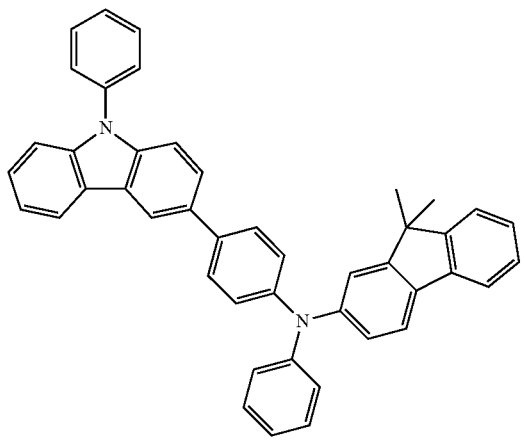

HT1

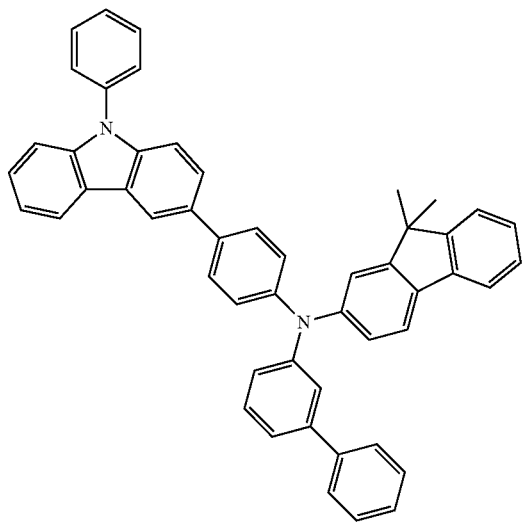

HT2

-continued
HT3
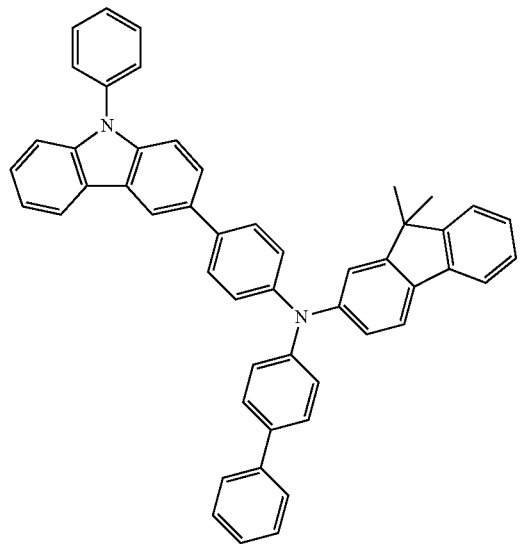
HT4
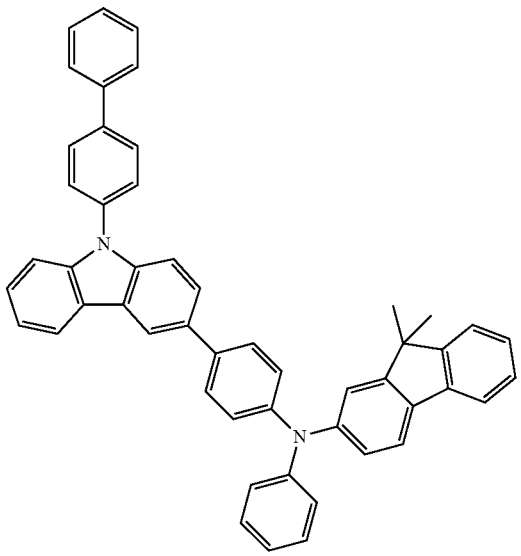
HT5
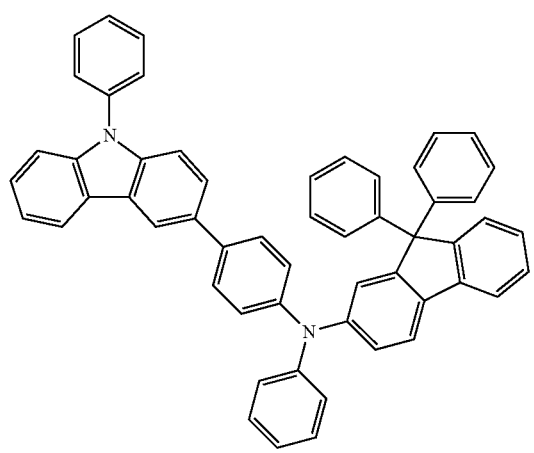
HT6
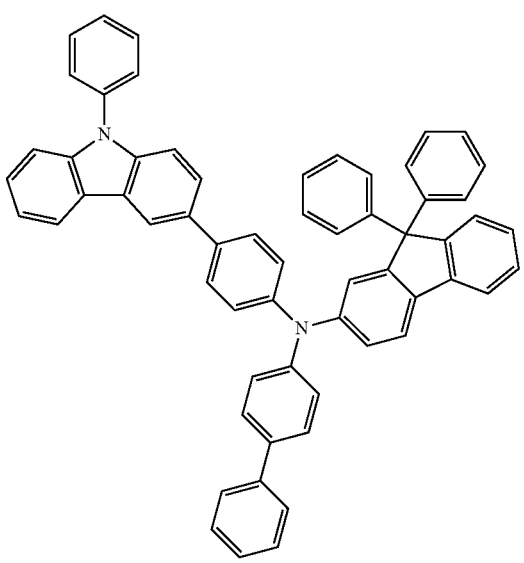

-continued
HT7
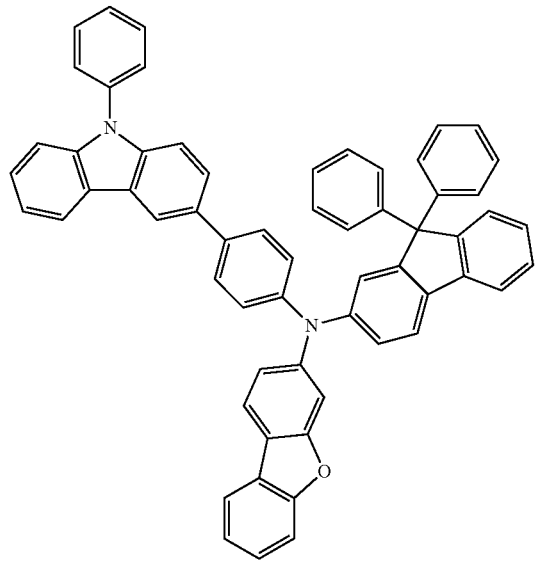
HT8
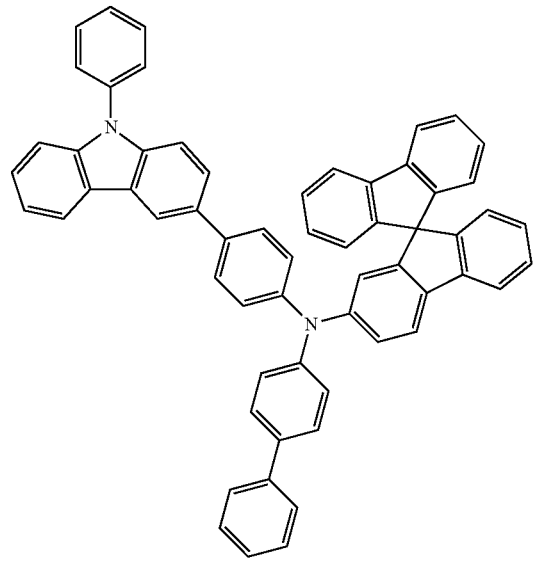
HT9
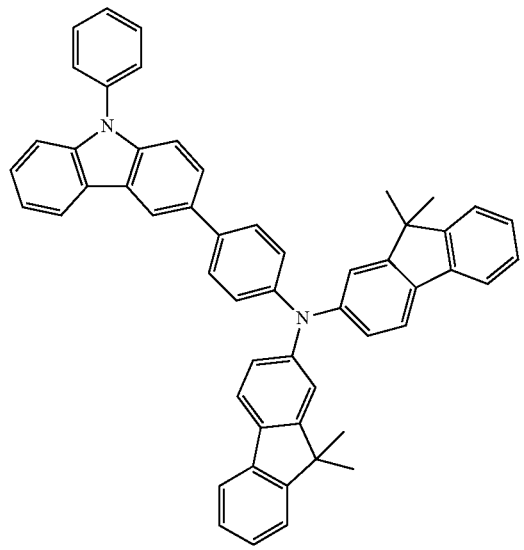
HT10
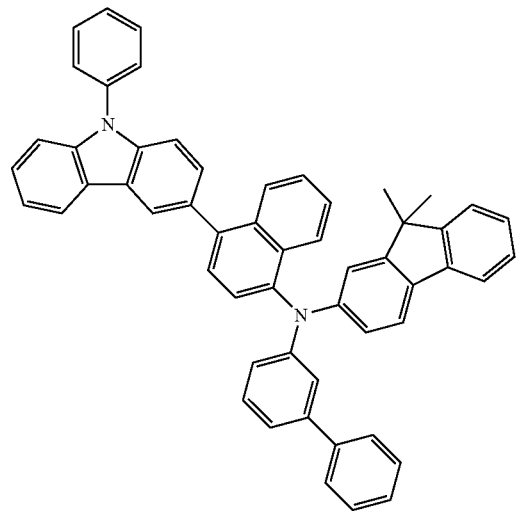
HT11
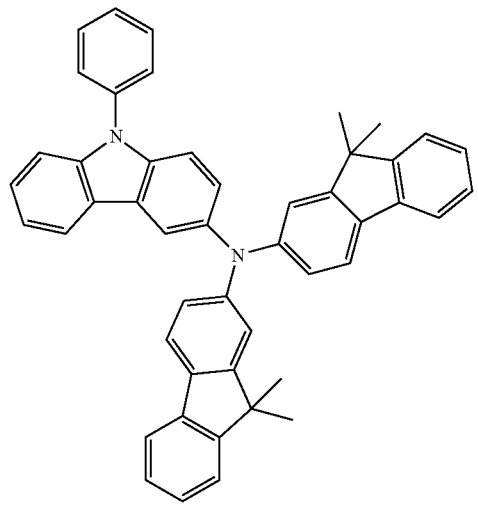
HT12
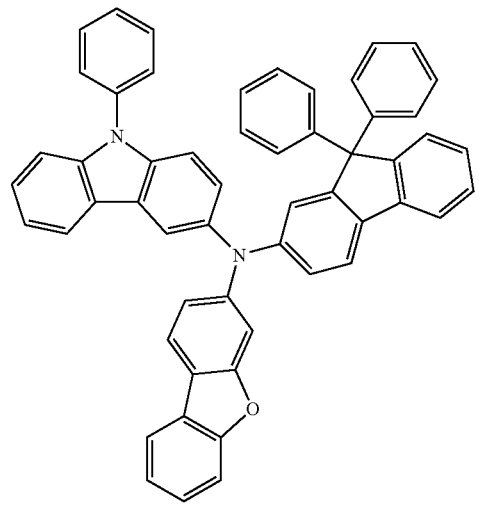

-continued
HT13
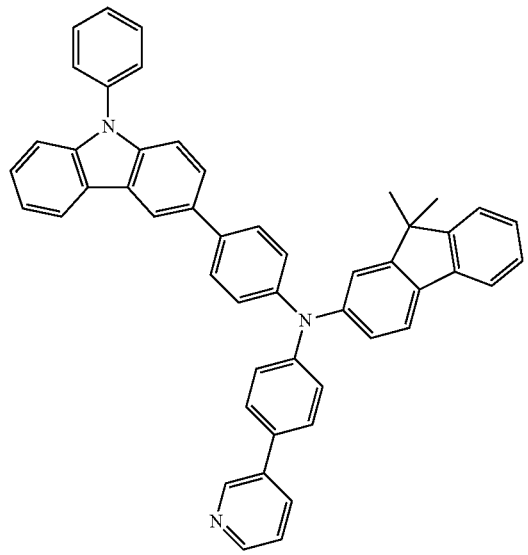
HT14
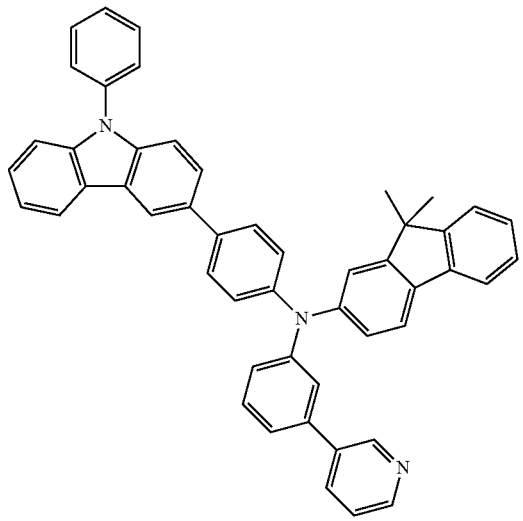
HT15
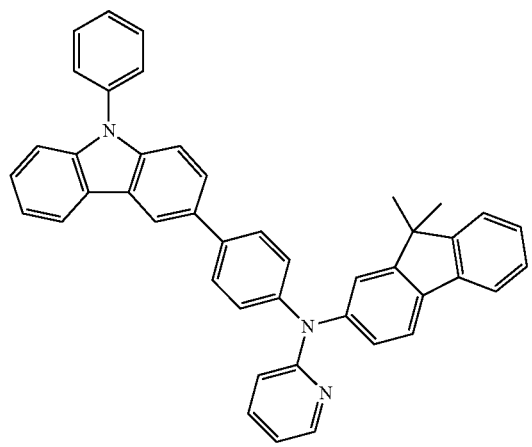
HT16
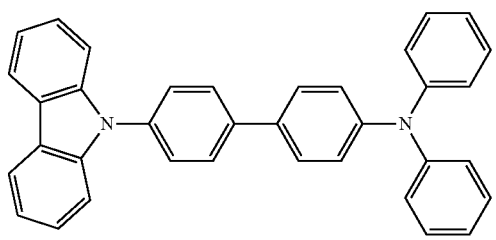
HT17
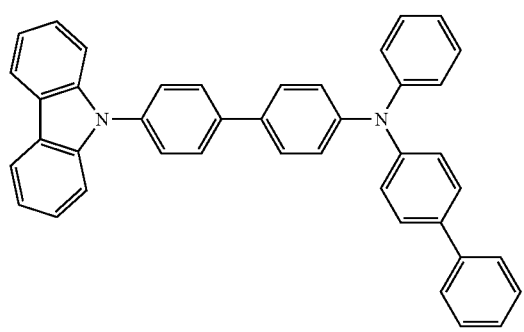
HT18
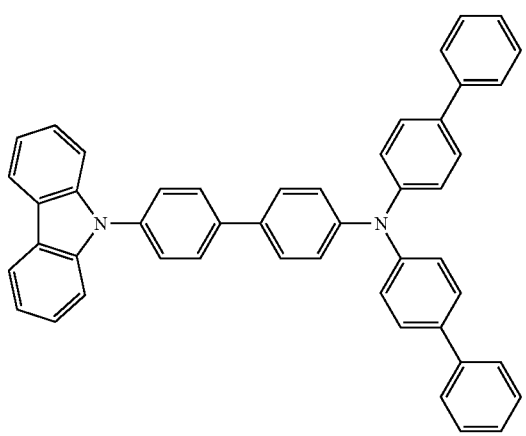

-continued
HT19
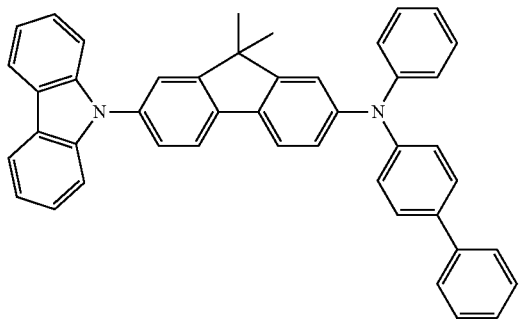
HT20
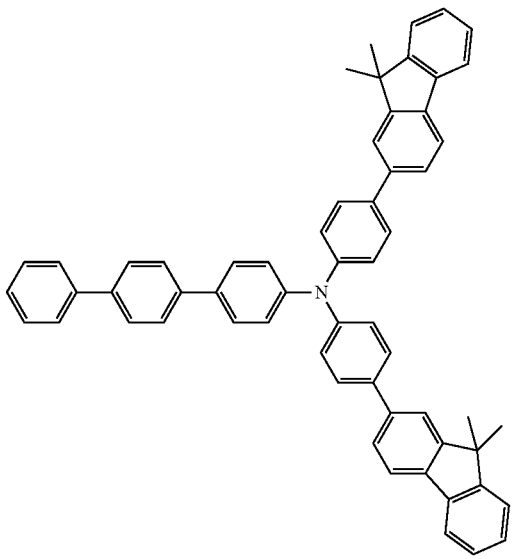
HT21
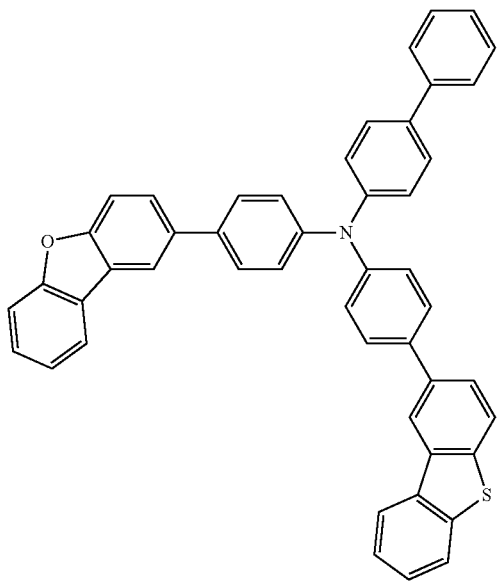
HT22
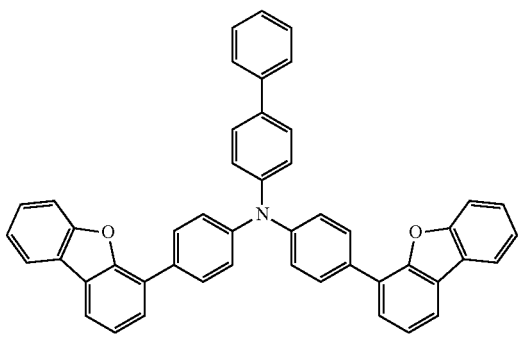
HT23
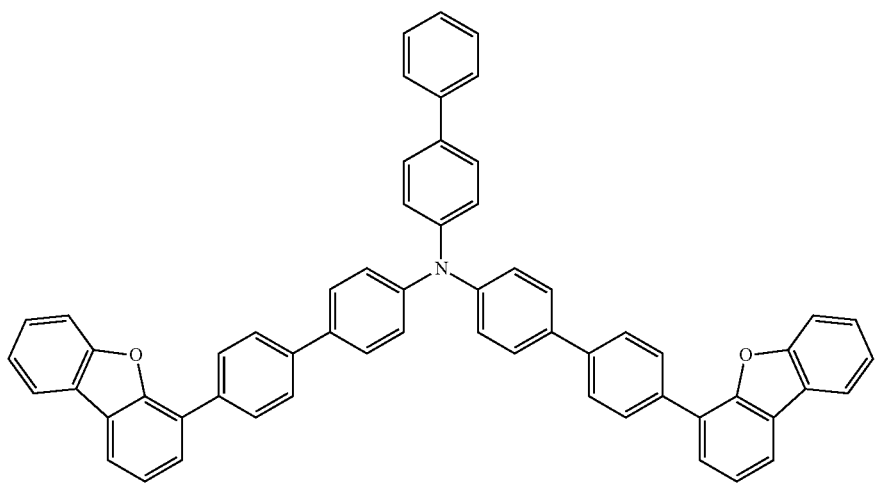

-continued
HT24
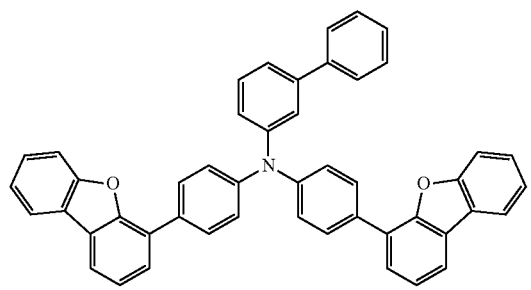
HT25
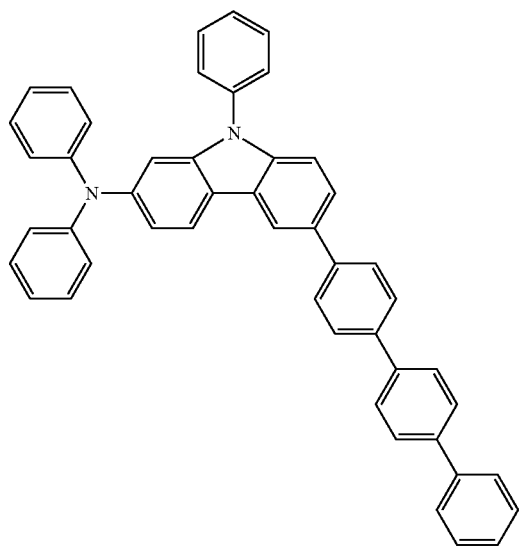
HT26
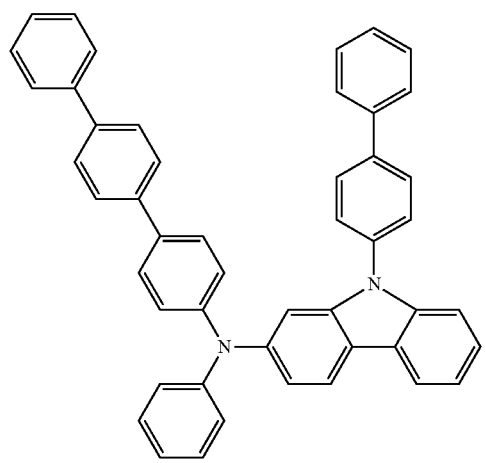
HT27
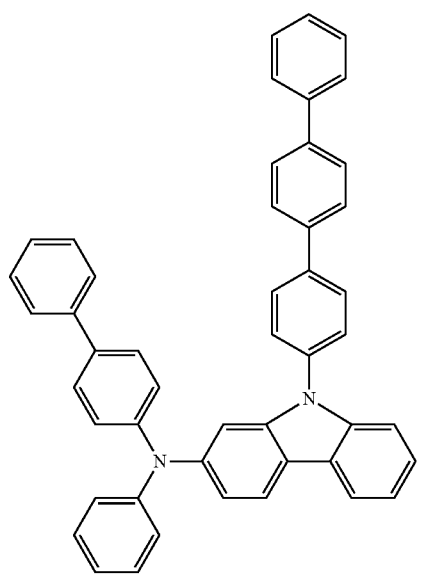
HT28
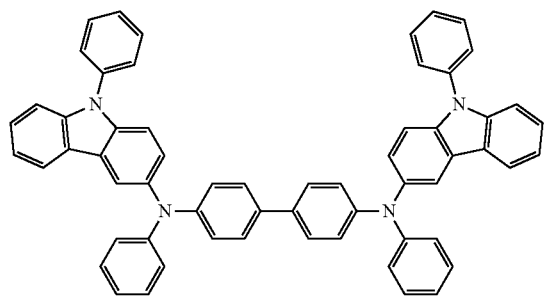
HT29
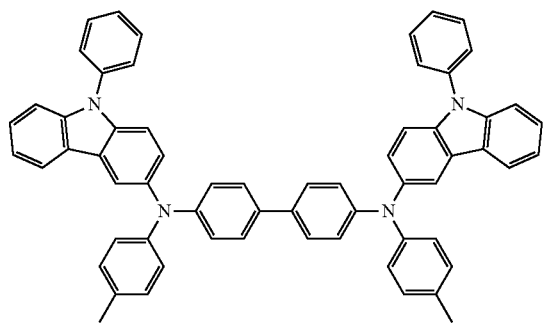

-continued
HT30
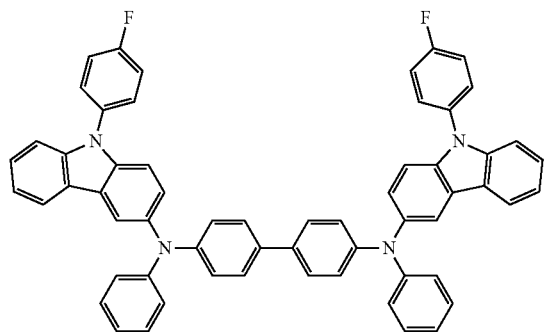
HT31
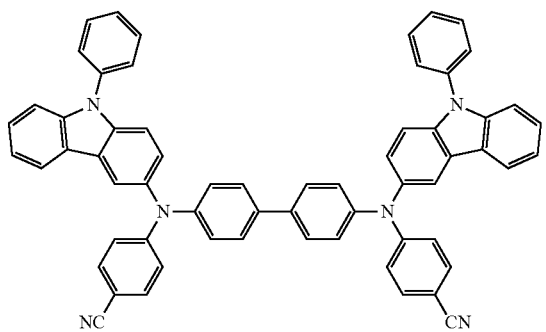
HT32
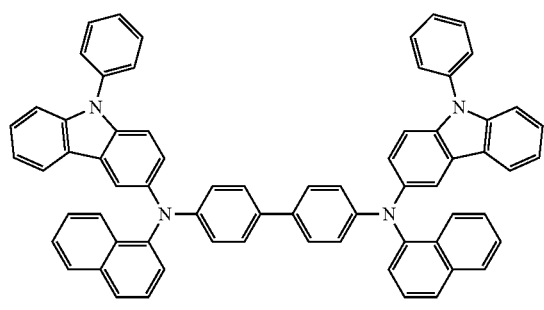
HT33
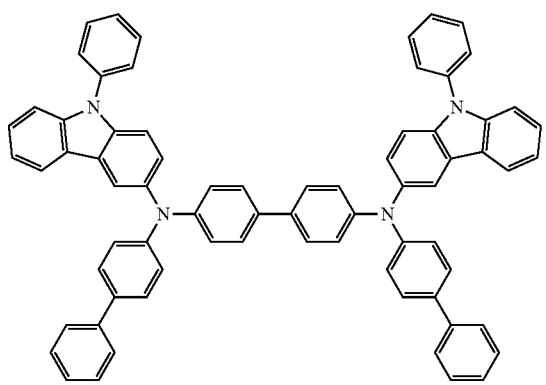
HT34
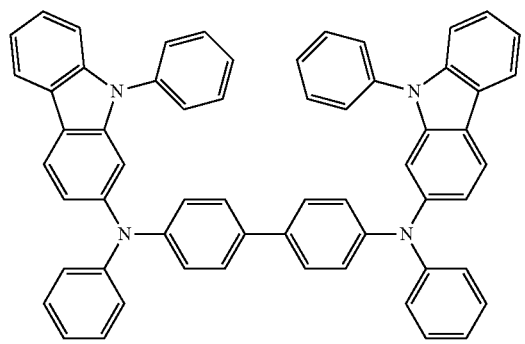
HT35
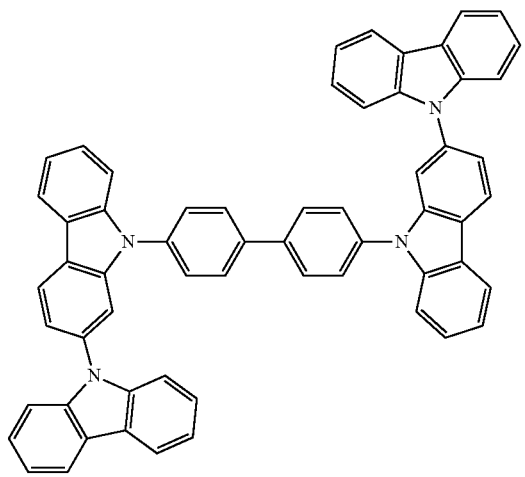

-continued
HT36
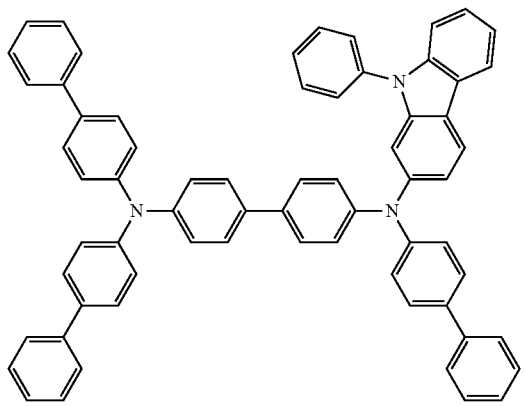
HT37
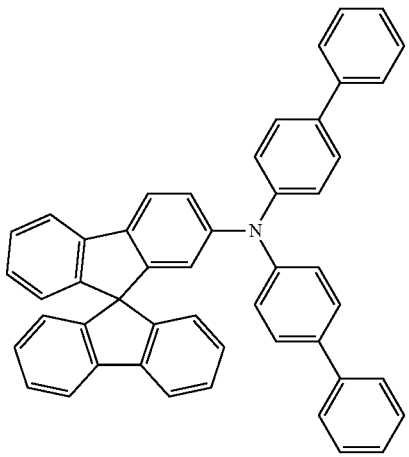
HT38
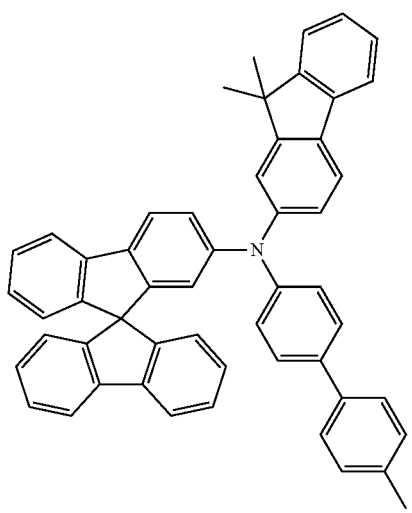
HT39
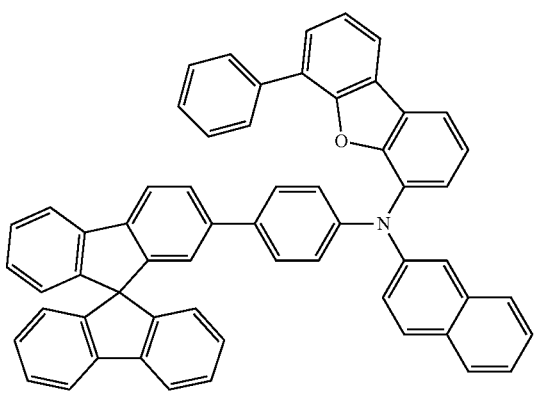
HT40
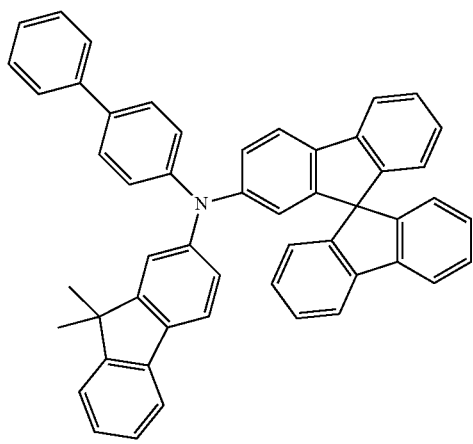
HT41
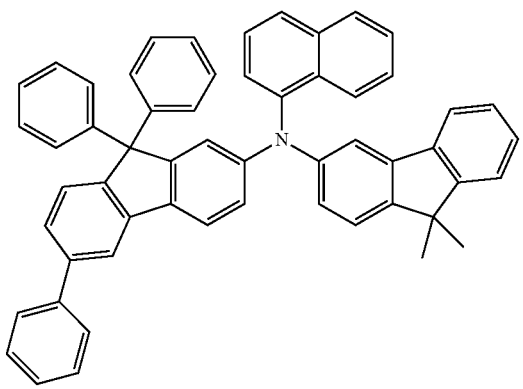

-continued
HT42
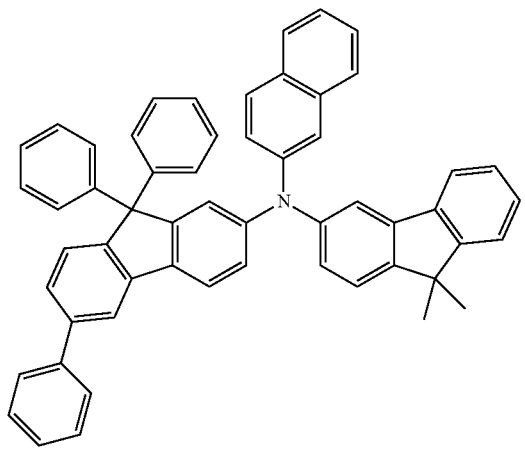
HT43
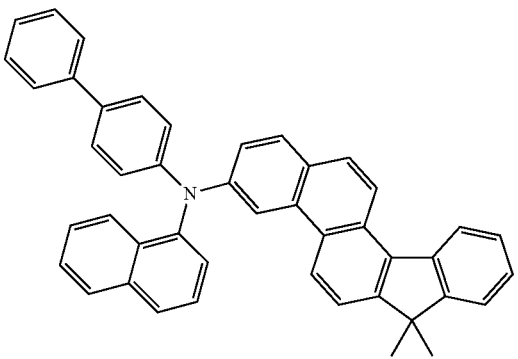
HT44
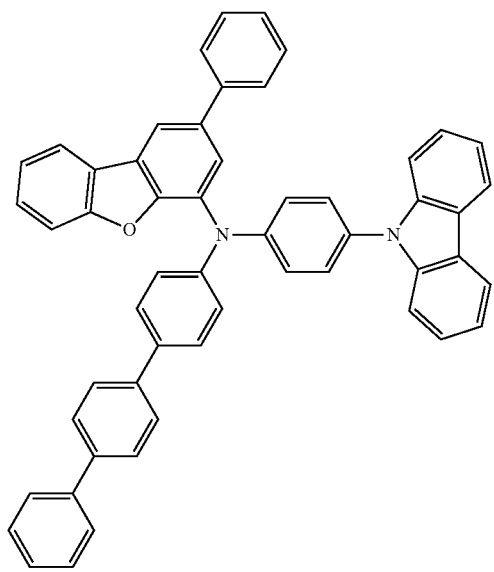
HT45
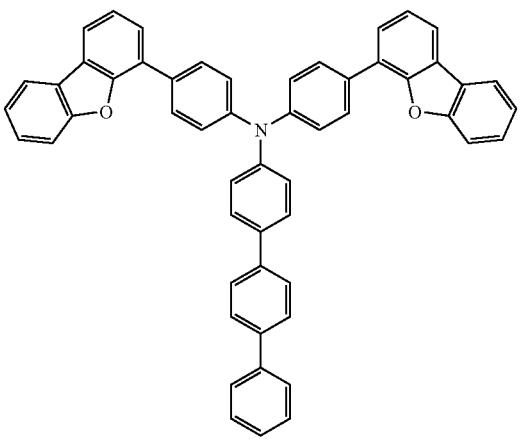
HT46
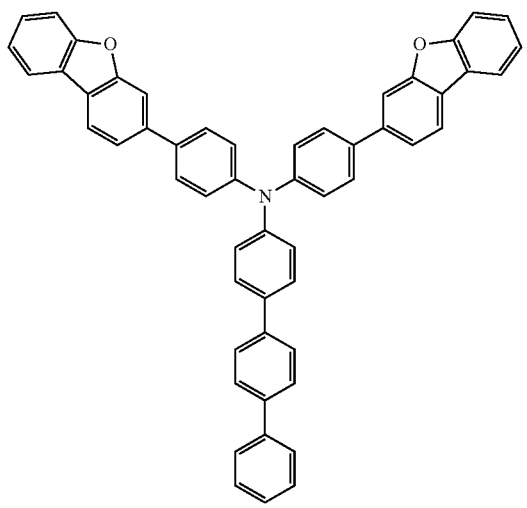
HT47
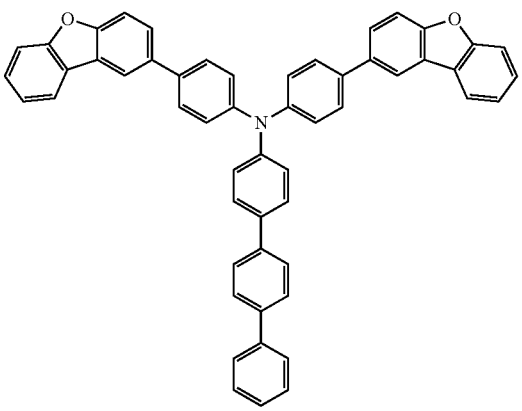

HT48

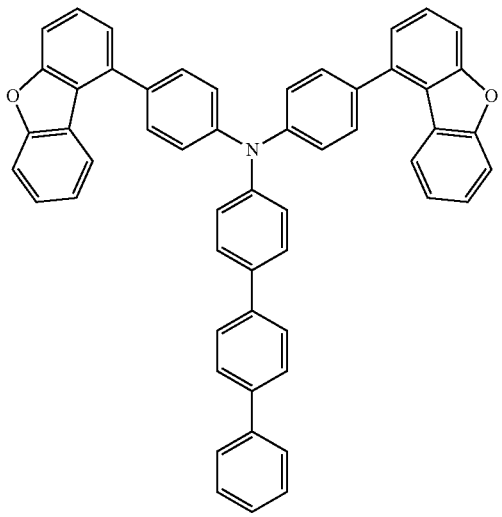

For example, the hole transport region 130 may include a metal oxide.

The thickness of the hole transport region 130 may be in a range of about 100 Å to about 10,000 Å, for example, about 100 Å to about 1,000 Å. When the thickness of the hole transport region 130 is within the range described above, satisfactory hole transportation characteristics may be obtained without a substantial increase in driving voltage.

The emission auxiliary layer may increase light-emission efficiency by compensating for an optical resonance distance according to the wavelength of light emitted by the emission layer, and the electron blocking layer may block the flow of electrons from the electron transport region. The emission auxiliary layer and the electron blocking layer may include the materials as described above.

Emission Layer 150

The emission layer 150 may be a structure having a single layer or two or more layers stacked therein. For example, the emission layer 150 may be a structure having a single layer or about two to about ten layers stacked therein.

The emission layer 150 includes at least one quantum dot-containing complex 151 (hereinafter, even described as "quantum dot") described above.

A quantum dot is dispersed in a naturally coordinated form in a dispersion medium such as an organic solvent or a polymer resin, and the dispersion medium may be any transparent medium as long as the medium is not deteriorated by light or the medium does not reflect light, and the medium does not cause light absorption, while not affecting wavelength conversion performance of the quantum dot. For example, the organic solvent may include at least one of toluene, chloroform, and ethanol, and the polymer resin may include at least one selected from an epoxy, a silicone, a polyethylene, and an acrylate.

A quantum dot has a discontinuous band gap energy, unlike a material in the bulk state, due to a quantum confinement effect. In addition, a quantum dot is characterized in that an interval between the energy band gap is different depending on the size of the quantum dot, and thus the same quantum dots having different sizes may emit light of different wavelengths. The smaller the size of a quantum dot is, the higher a band gap energy is, and thus the wavelength of light emitted therefrom becomes shorter.

Based on these characteristics of the quantum dot, growth conditions of a nanocrystal may be appropriately varied to adjust the size of the quantum dot such that light of a wavelength region of the exemplary embodiments may be obtained. Accordingly, by introducing such quantum dot into a light-emitting device, the light-emitting device having excellent luminance efficiency and color purity may be implemented.

Electron Transport Region 170

The electron transport region 170 may have i) a single-layered structure consisting of a single layer consisting of a single material, ii) a single-layered structure consisting of a single layer consisting of a plurality of different materials, or iii) a multi-layered structure having a plurality of layers consisting of a plurality of different materials.

The electron transport region 170 may include at least one layer selected from a buffer layer, a hole blocking layer, an electron control layer, an electron transport layer (ETL), and an electron injection layer, but exemplary embodiments are not limited thereto.

For example, the electron transport region 170 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituent layers are sequentially stacked from the emission layer 150 in this stated order. However, exemplary embodiments of the structure of the electron transport region 170 are not limited thereto.

The electron transport region 170 (for example, a buffer layer, a hole blocking layer, an electron control layer, or an electron transport layer in the electron transport region 170 may include a metal-free compound containing at least one 7 electron-depleted nitrogen-containing ring.

The "n electron-depleted nitrogen-containing ring" indicates a $C_1$-$C_{60}$ heterocyclic group having at least one *—N=*' moiety as a ring-forming moiety.

For example, the "n electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Non-limiting examples of the 7 electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but the exemplary embodiments are not limited thereto.

For example, the electron transport region 170 may include a compound represented by Formula 601 below:

$[Ar_{601}]_{xe11}\text{-}[(L_{601})_{xe1}\text{-}R_{601}]_{xe21}$  <Formula 601>

In Formula 601, $Ar_{601}$ may be a substituted or unsubstituted $C_5$-$C_{60}$ carbocyclic group or a substituted or unsubstituted $C_1$-$C_{10}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one or more exemplary embodiments, at least one of $Ar_{601}$(s) in the number of xe11 and $R_{601}$(s) in the number of xe21 may include the 7 electron-depleted nitrogen-containing ring.

In one or more exemplary embodiments, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more exemplary embodiments, $Ar_{601}$ in Formula 601 may be an anthracene group.

In one or more exemplary embodiments, a compound represented by Formula 601 may be represented by Formula 601-1 below:

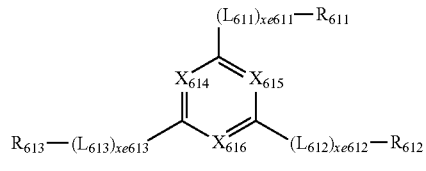

<Formula 601-1>

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each be understood by referring to the descriptions provided in connection with $L_{601}$, xe611 to xe613 may each be understood by referring to the description presented in connection with xe1, $R_{611}$ to $R_{613}$ may each be understood by referring to the descriptions provided in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more exemplary embodiments, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but exemplary embodiments are not limited thereto.

In one or more exemplary embodiments, xe1 and xe611 to xe613 in Formulae 601 and 601-1 may each independently be 0, 1, or 2.

In one or more exemplary embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ are the same as described above.

The electron transport region 170 may include at least one compound selected from Compounds ET1 to ET36, but exemplary embodiments are not limited thereto:

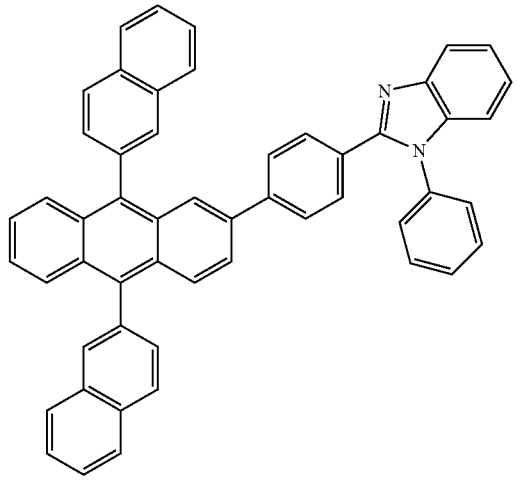

ET1

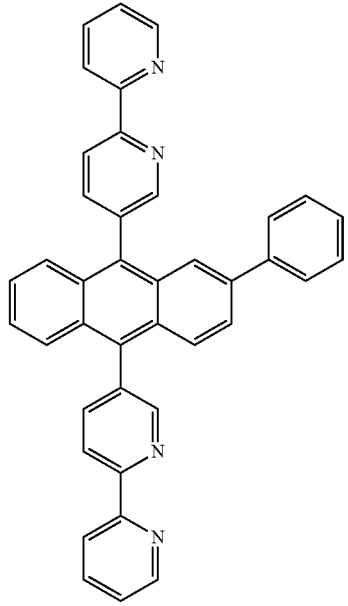

ET2

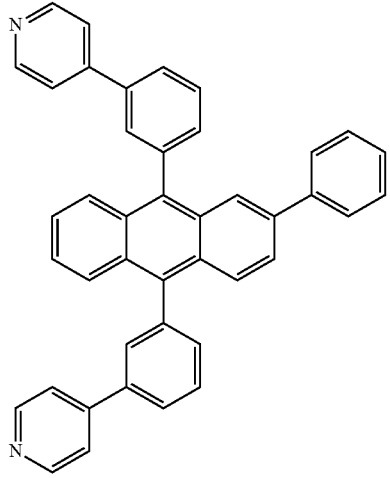

ET3

ET4
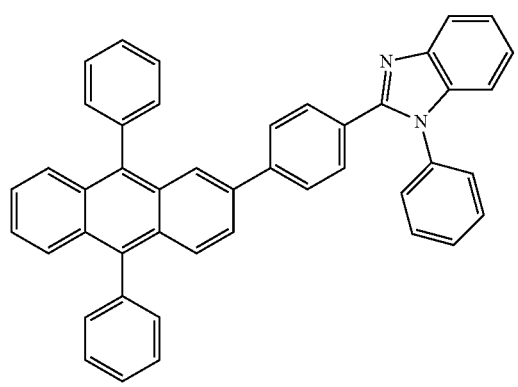
ET5
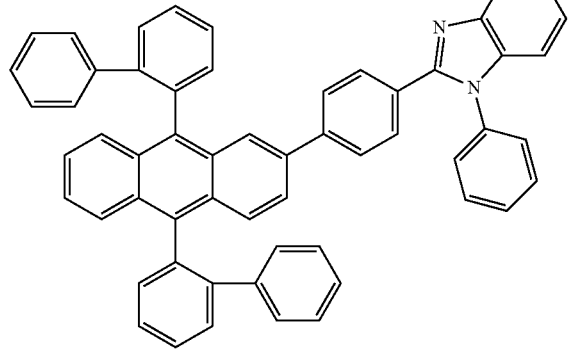
ET6
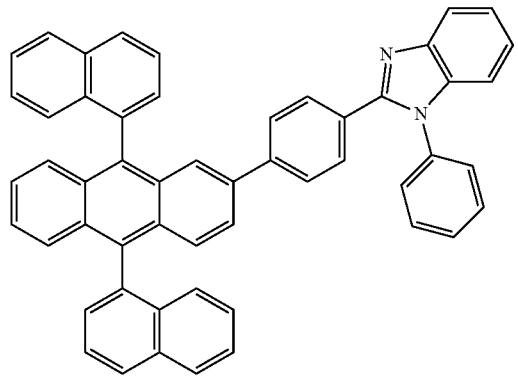
ET7
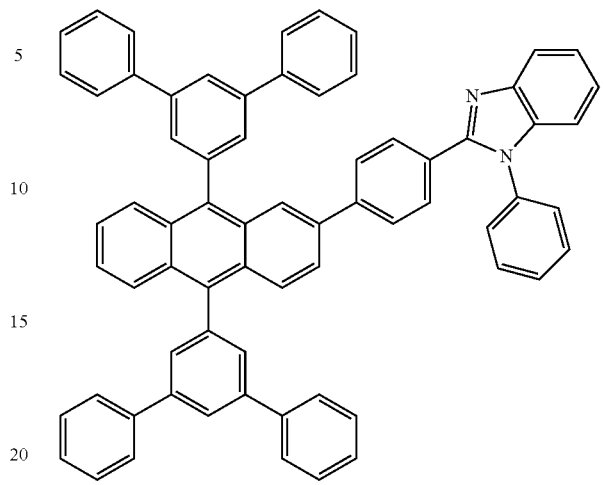
ET8
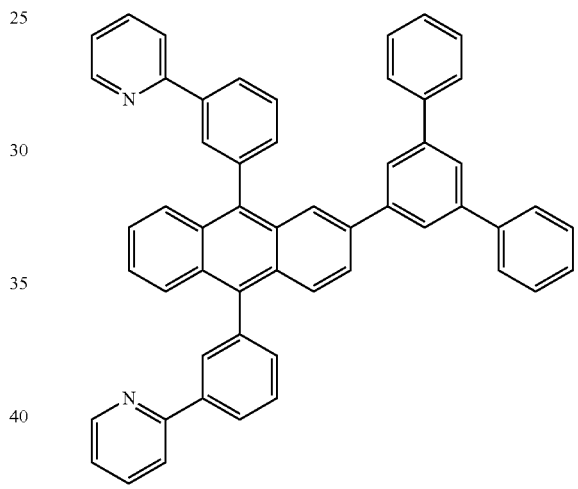
ET9
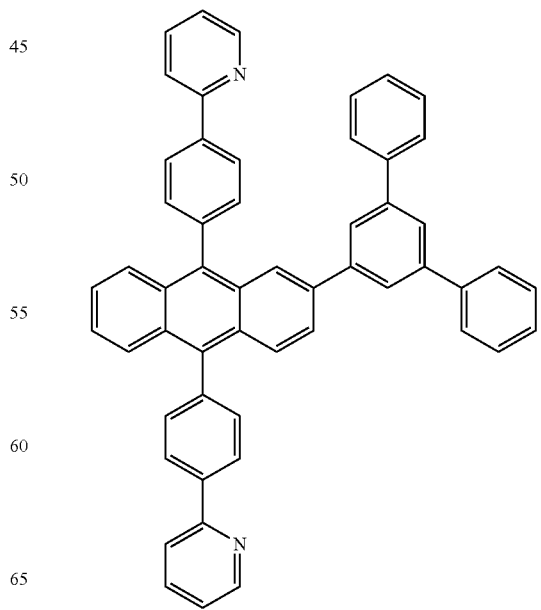

ET10
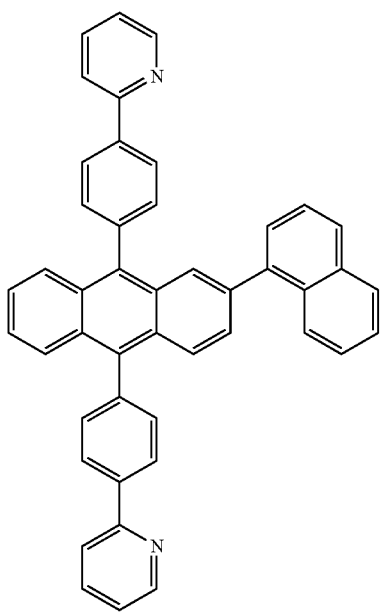
ET11
ET13
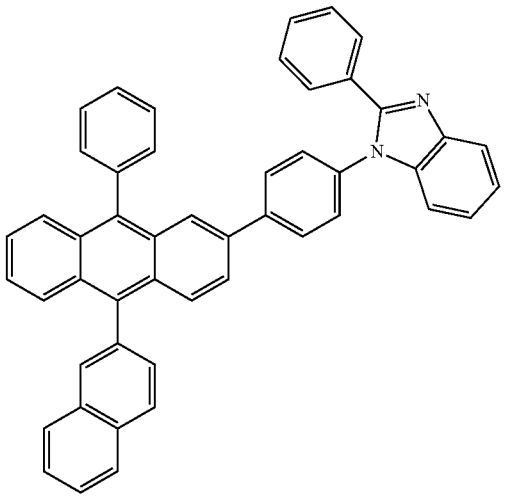
ET14
ET12
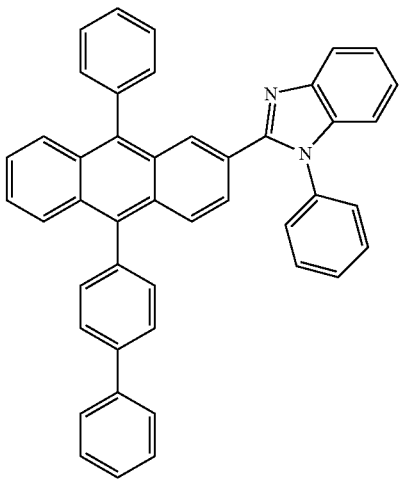
ET15
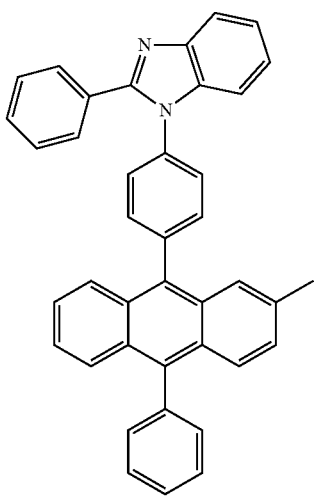

ET16
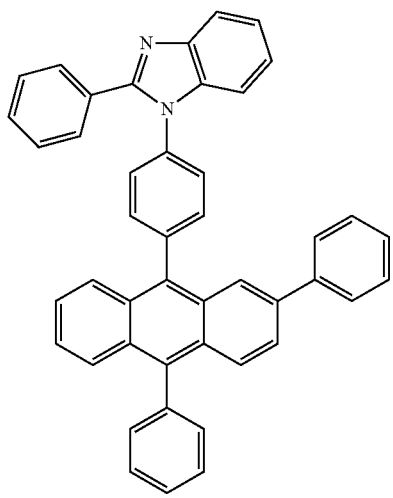
ET17
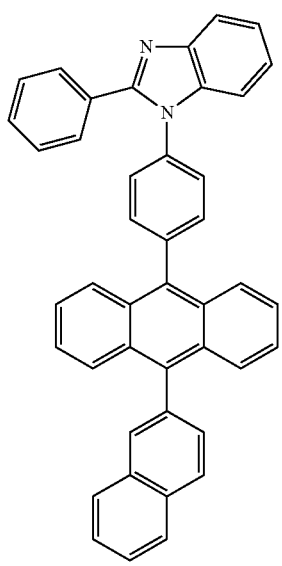
ET18
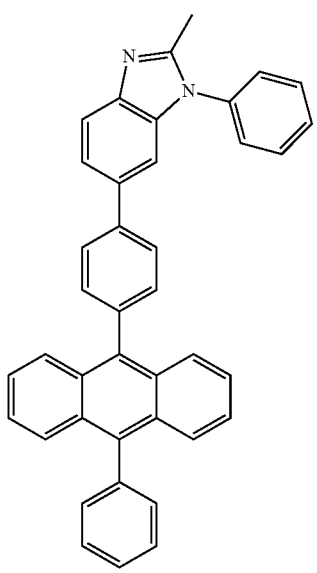
ET19
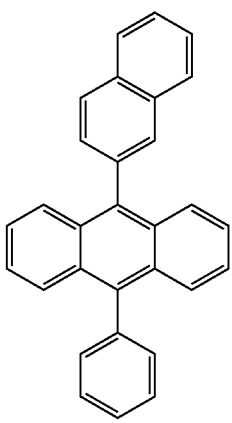
ET20
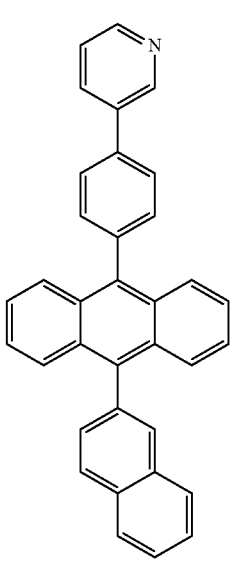
ET21
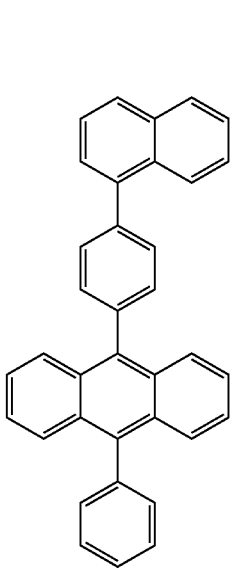

ET22
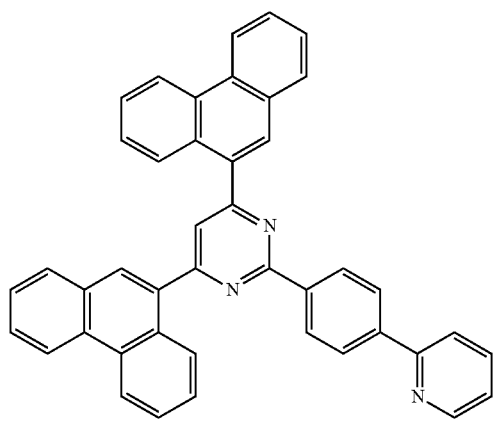
ET25
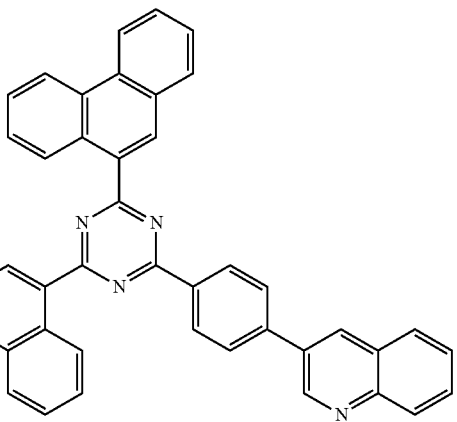
ET23
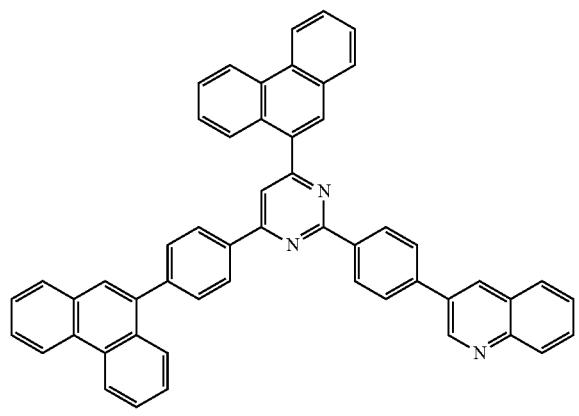
ET26
ET24
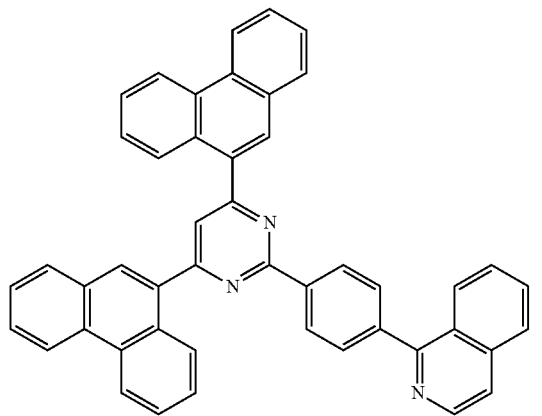
ET27
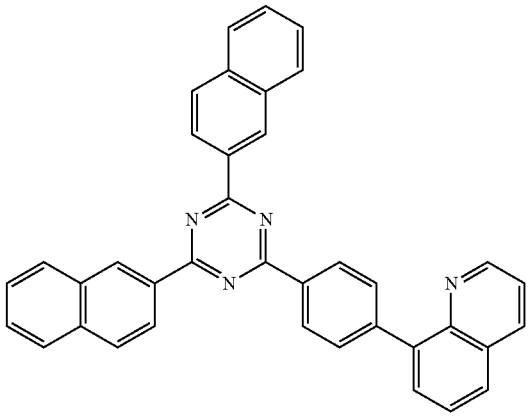

ET28
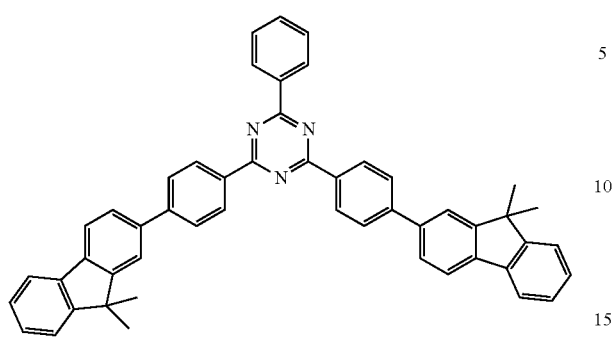
ET29
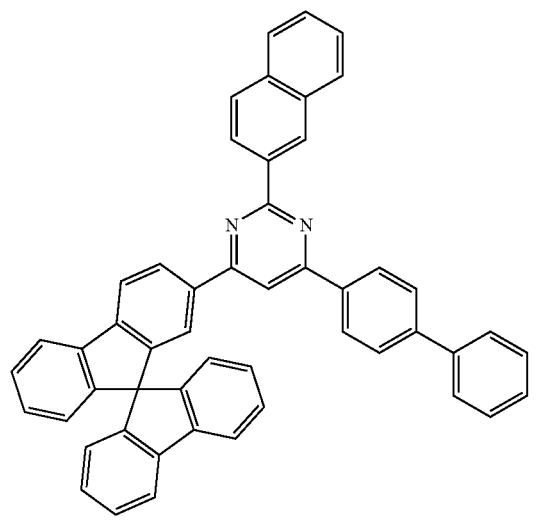
ET30
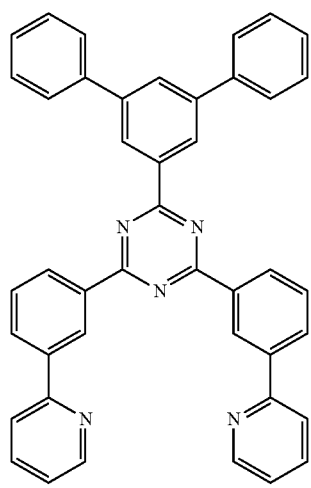
ET31
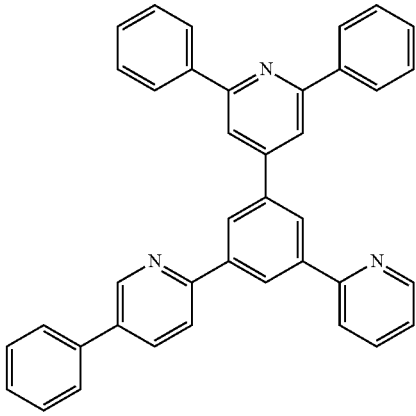
ET32
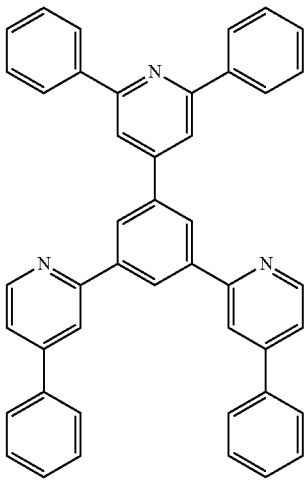
ET33
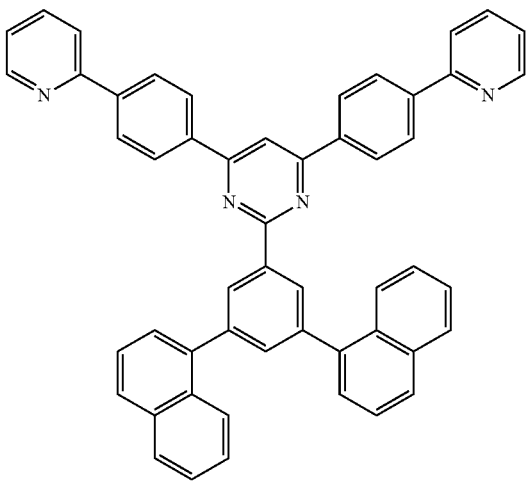

ET34

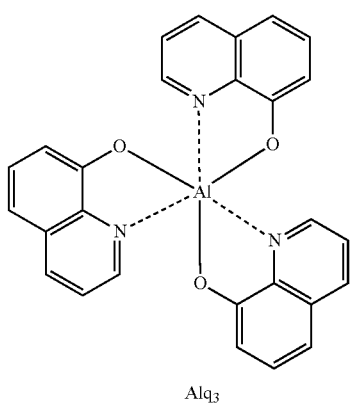

Alq₃

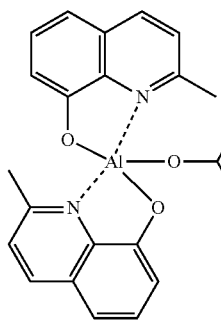 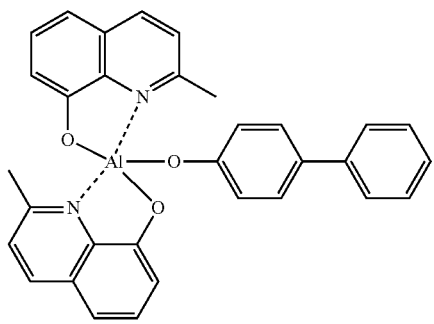

BAlq

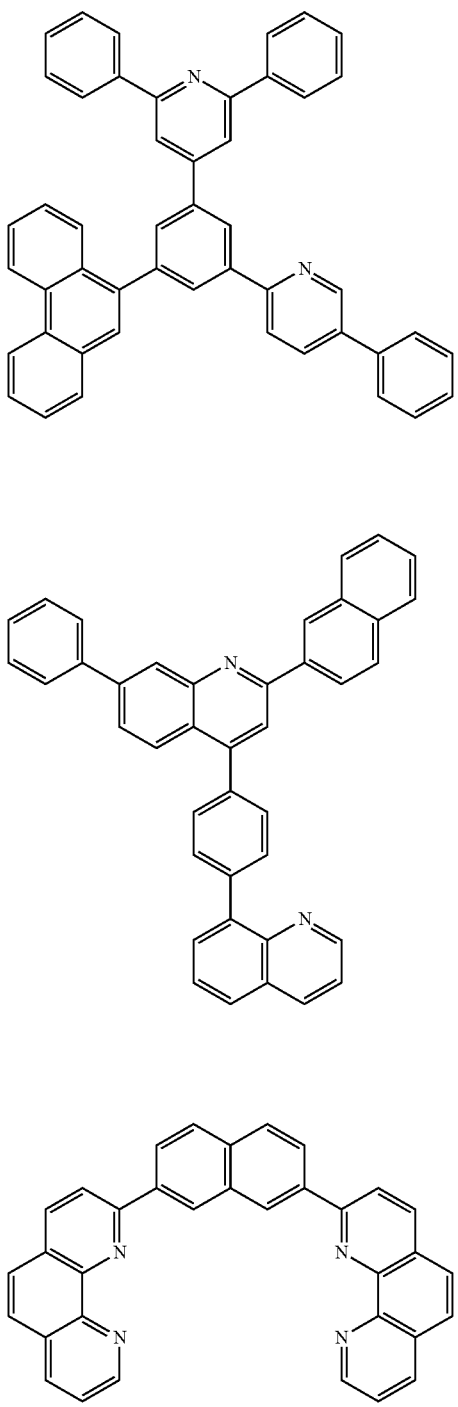

ET35

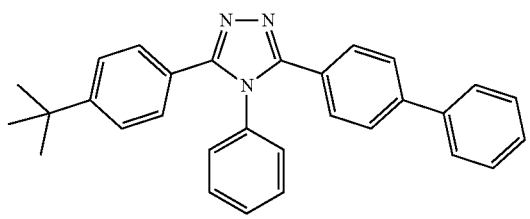

TAZ

ET36

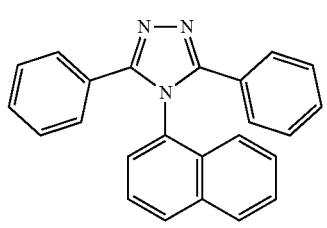

NTAZ

In one or more exemplary embodiments, the electron transport region 170 may include at least one compound selected from 2,9-dimethyl-4,7-diphenyl-1,10-phenanthroline (BCP), 4,7-diphenyl-1,10-phenanthroline (Bphen), tris-(8-hydroxyquinoline)aluminum (Alq3), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), and 4-(naphthalen-1-yl)-3,5-diphenyl-4H-1,2,4-triazole (NTAZ).

The thickness of the buffer layer, the hole blocking layer, or the electron control layer may be in a range of about 20 Å to about 1,000 Å, for example, about 30 Å to about 300 Å. When the thicknesses of the buffer layer, the hole blocking layer, and the electron control layer are within these ranges, excellent hole blocking characteristics or electron control characteristics may be obtained without a substantial increase in driving voltage.

The thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region 170 (for example, the electron transport layer in the electron transport region 170) may further include, in addition to the materials described above, a metal-containing material.

The metal-containing material may include at least one selected from an alkali metal complex and an alkaline earth-metal complex. The alkali metal complex may include a metal ion selected from a $L_1$ ion, a Na ion, a K ion, an Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but exemplary embodiments are not limited thereto.

For example, the metal-containing material may include a $L_1$ complex. The $L_1$ complex may include, for example, Compound ET-D1 (lithium quinolate, LiQ) or ET-D2 below.

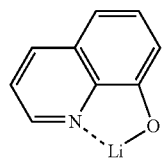

ET-D1

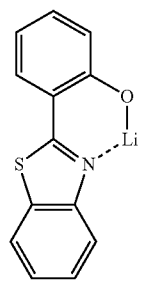

ET-D2

The electron transport region 170 may include an electron injection layer that facilitates injection of electrons from the second electrode 190. The electron injection layer may be in direct contact with the second electrode 190.

The electron injection layer may have i) a single-layered structure consisting of a single layer consisting of a single material, ii) a single-layered structure consisting of a single layer consisting of a plurality of different materials, or iii) a multi-layered structure having a plurality of layers consisting of a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from $L_1$, Na, K, Rb, and Cs. In one or more exemplary embodiments, the alkali metal may be $L_1$, Na, or Cs. In one or more exemplary embodiments, the alkali metal may be $L_1$ or Cs, but exemplary embodiments are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one or more exemplary embodiments, the alkali metal compound may be selected from LiF, $Li_2O$, NaF, LiI, NaI, CsI, and KI, but exemplary embodiments are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In one or more exemplary embodiments, the alkaline earth-metal compound may be selected from BaO, SrO, and CaO, but exemplary embodiments are not limited thereto.

The rare earth metal compound may be selected from $YbF_3$, $ScF_3$, $Sc_2O_3$, $Y_2O_3$, $Ce_2O_3$, $GdF_3$ and $TbF_3$. In one or more exemplary embodiments, the rare earth metal compound may be selected from $YbF_3$, $ScF_3$, $TbF_3$, $YbI_3$, $ScI_3$, and $TbI_3$, but exemplary embodiments are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but exemplary embodiments are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more exemplary embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix consisting of the organic material.

The thickness of the electron injection layer may be in a range of about 1 Å to about 100 Å, for example, about 3 Å to about 90 Å. When the thickness of the electron injection layer is within the range, satisfactory electron injection characteristics may be obtained without substantial increase in driving voltage.

Second Electrode 190

As described above, the light-emitting device 100 includes the second electrode 190 facing the first electrode 110. The second electrode 190 is the same as described above. The second electrode 190 may be the cathode, which is an electron injection electrode, and as the material for the second electrode 190, a metal, an alloy, an electrically conductive compound, or any combination thereof, each having a low work function, may be used.

The second electrode 190 may include lithium ($L_1$), silver (Ag), magnesium (Mg), aluminum (Al), aluminum-lithium (Al—Li), calcium (Ca), magnesium-indium (Mg—In), magnesium-silver (Mg—Ag), An ITO, an IZO, or any combination thereof, but exemplary embodiments are not limited thereto. The second electrode 190 may be a transmissive electrode, a semi-transmissive electrode, or a reflective electrode.

The second electrode 190 may have a single-layered structure, or a multi-layered structure including two or more layers.

Capping Layer

A first capping layer may be located outside the first electrode 110, and/or a second capping layer may be located outside the second electrode 190. In detail, the light-emitting device 100 may have a structure in which the first capping layer, the first electrode 110, the emission layer 150, and the second electrode 190 are sequentially stacked in this stated order, a structure in which the first electrode 110, the emission layer 150, the second electrode 190, and the second capping layer are sequentially stacked in this stated order, or a structure in which the first capping layer, the first electrode 110, the emission layer 150, the second electrode 190, and the second capping layer are sequentially stacked in this stated order.

Light generated in the emission layer 150 of the light-emitting device 100 may be extracted toward the outside through the first electrode 110 and the first capping layer, each of which may be a semi-transmissive electrode or a transmissive electrode, or light generated in the emission layer 150 of the light-emitting device 100 may be extracted toward the outside through the second electrode 190 and the second capping layer, each of which may be a semi-transmissive electrode or a transmissive electrode.

The first capping layer and the second capping layer may increase external luminescence efficiency according to the constructive interference.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth-based complex, or a combination thereof. The carbocyclic compound, the heterocyclic compound, and the amine group-containing compound may be optionally substituted with a substituent containing O, N, S, Se, Si, F, Cl, Br, I, or any combination thereof.

In one or more exemplary embodiments, at least one of the first capping layer and the second capping layer may each independently include an amine group-containing compound.

For example, at least one of the first capping layer and second capping layer may each independently include a compound represented by Formula 201, a compound represented by Formula 202, or any combination thereof.

In one or more exemplary embodiments, at least one selected from the first capping layer and the second capping layer may each independently include a compound selected from Compounds HT28 to HT33, Compounds CP1 to CP5, or any combination thereof, but the exemplary embodiments are not limited thereto:

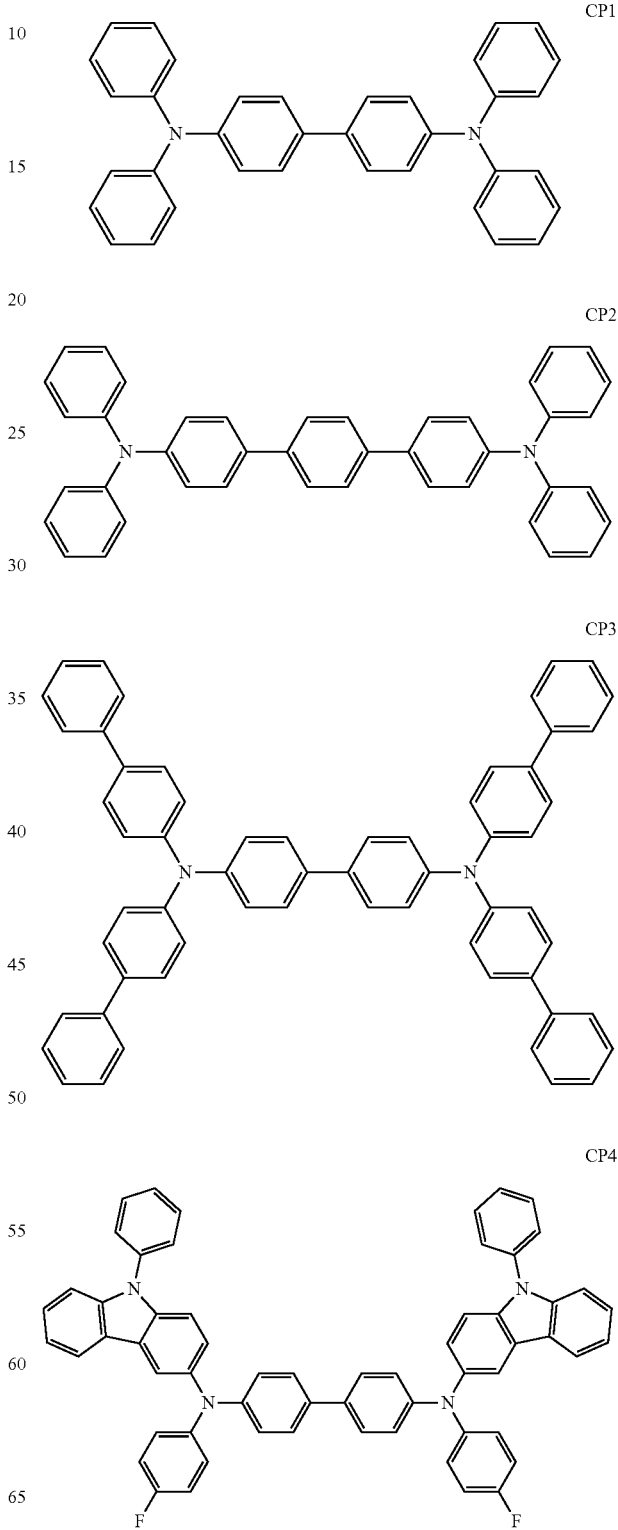

CP5

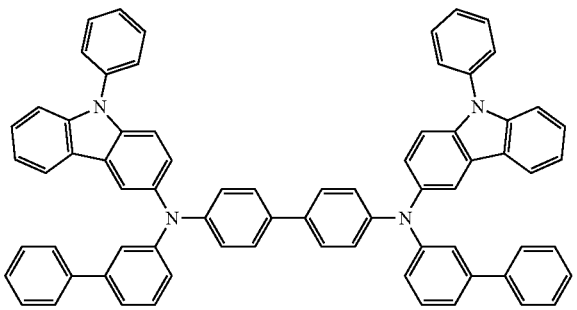

Apparatus

The light-emitting device 100 may be included in various apparatuses. For example, each of a light-emitting apparatus, an authentication apparatus, or an electronic apparatus may include the light-emitting device 100.

The light-emitting apparatus may further include, in addition to the light-emitting device 100, a color filter. The color filter may be located on at least one traveling direction of light emitted from the light-emitting device 100. For example, light emitted from the light-emitting device 100 may be blue light, but exemplary embodiments are not limited thereto. The light-emitting device 100 is the same as described above.

In this regard, the color filter may include the quantum dot-containing complex.

The light-emitting apparatus may include a first substrate. The first substrate may include a plurality of subpixel areas, and the color filter may include a plurality of color filter areas respectively corresponding to the plurality of subpixel areas.

A pixel-defining film may be formed between the plurality of subpixel areas to define each of the subpixel areas.

The color filter may further include light blocking patterns located between the plurality of color filter areas.

The plurality of color filter areas may include a first color filter area emitting first color light, a second color filter area emitting second color light, and/or a third color filter area emitting third color light, and the first color light, the second color light, and/or the third color light may have different maximum emission wavelengths from one another. For example, the first color light may be a red light, the second color light may be a green light, and the third color light may be a blue light, but exemplary embodiments are not limited thereto. For example, each of the plurality of color filter areas may include a quantum dot, but exemplary embodiments are not limited thereto. In detail, the first color filter area may include a red quantum dot, the second color filter area may include a green quantum dot, and the third color filter area may not include a quantum dot. The quantum dot is the same as described above. Each of the first color filter area, the second color filter area, and/or the third color filter area may include a scatter, but exemplary embodiments are not limited thereto.

For example, the light-emitting device 100 may emit first light, the first color filter area may absorb the first light to emit first first-color light, the second color filter area may absorb the first light to emit second first-color light, and the third color filter area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light, but exemplary embodiments are not limited thereto.

The light-emitting apparatus may be used as various displays, light sources, and the like.

The authentication apparatus may be, for example, a biometric authentication apparatus for authenticating an individual by using biometric information of a biometric body (for example, a finger tip, a pupil, or the like).

The authentication apparatus may further include, in addition to the light-emitting device 100, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but exemplary embodiments are not limited thereto.

Hereinbefore, the light-emitting device 100 has been described in connection with FIG. 2, but exemplary embodiments are not limited thereto.

Each layer included in the light-emitting device 100 may be formed in a certain region by using various methods such as vacuum deposition, spin coating, casting, Langmuir-Blodgett (LB) deposition, ink-jet printing, laser-printing, and laser-induced thermal imaging (LITI).

When each layer is formed by vacuum deposition, the deposition may be performed at a deposition temperature of about 100 to about 500° C., a vacuum degree of about $10^{-8}$ to about $10^{-3}$ torr, and a deposition speed of about 0.01 to about 100 Å/sec, by taking into account the material to be formed into the layer and its structure.

When each layer is formed by spin coating, the spin coating may be performed at a coating speed of about 2,000 rpm to about 5,000 rpm and a heat treatment temperature of about 80° C. to about 200° C., by taking into account a material to be included in a layer to be formed, and the structure of a layer to be formed.

Display Apparatus

The light-emitting device 100 may be included in a display apparatus including a thin-film transistor. The thin-film transistor may include a source electrode, a drain electrode, and an activation layer, wherein one of the source electrode and the drain electrode may be in electrical contact with the first electrode 110 of the light-emitting device 100.

The thin-film transistor may further include a gate electrode, a gate insulation film, or the like.

The activation layer may include a crystalline silicon, an amorphous silicon, an organic semiconductor, an oxide semiconductor, or the like, but exemplary embodiments are not limited thereto.

The display apparatus may further include a sealing part for sealing the light-emitting device 100. The sealing part may allow an image from the light-emitting device 100 to be implemented and may block external air and moisture from penetrating into the light-emitting device 100. The sealing part may be a sealing substrate including a transparent glass or a plastic substrate. The sealing part may be a thin-film encapsulation layer including a plurality of organic layers and/or a plurality of inorganic layers. When the sealing part is a thin-film encapsulation layer, the entire flat display apparatus may be flexible.

Optical Member and Device

According to another aspect, provided is an optical member including the quantum dot-containing complex.

The optical member may be a color conversion member.

The color conversion member may include a substrate and a pattern layer formed on the substrate.

The substrate may be the color conversion member itself or may be a region in which the color conversion member is located in various devices (for example, a display device). The substrate may be a glass, a silicon (Si), a silicon oxide ($SiO_x$), or a polymer substrate, and the polymer substrate may be a polyethersulfone (PES), a polycarbonate (PC), or the like.

The pattern layer may include a quantum dot-containing complex having a thin-film form. For example, the pattern layer may be a quantum dot-containing complex having the thin-film form.

The color conversion member including the substrate and the pattern layer may further include a partition wall or a black matrix, which is formed between each pattern layer. The color conversion member may further include a color filter to further improve light conversion efficiency.

The color conversion member may include a red pattern layer capable of emitting red light, a green pattern layer capable of emitting green light, a blue pattern layer capable of emitting blue light, or any combination thereof. The red pattern layer, the green pattern layer, and/or the blue pattern layer may be implemented by controlling a component, a composition, and/or a structure of a quantum dot in the quantum dot-containing complex.

According to another aspect, a device or an optical member includes the quantum dot-containing complex.

The device may further include a light source, and the quantum dot-containing complex (or the optical member including the quantum dot-containing complex) may be located in a path of light emitted from the light source.

The light source may emit blue light, red light, green light, or white light. For example, the light source may emit blue light.

The light source may be an organic light-emitting diode (OLED) or a light-emitting diode (LED).

The light emitted from the light source as described above may be photoconverted by the quantum dot of the quantum dot-containing complex while passing through the quantum dot-containing complex, and light having a different wavelength from the wavelength of the light emitted from the light source may be emitted due to the quantum dot-containing complex.

The device may be various display devices, lighting devices, or the like.

In this regard, the organic light-emitting device includes the first electrode, an organic layer including the emission layer, and the second electrode.

The organic layer may further include at least one of the hole transport region disposed between the first electrode and the emission layer and the electron transport region disposed between the emission layer and the second electrode.

The first electrode, the second electrode, the hole transport region, and the electron transport region are the same as described above.

The emission layer included in the organic light-emitting device is described in detail hereinafter.

Emission Layer in Organic Light-Emitting Device

When the organic light-emitting device is a full-color light-emitting device, the emission layer may be patterned into a red emission layer, a green emission layer, and/or a blue emission layer, according to a representative sub-pixel. In one or more exemplary embodiments, the emission layer may have a stacked structure of two or more layers among the red emission layer, the green emission layer, and the blue emission layer, in which the two or more layers contact each other or are separated from each other. In one or more exemplary embodiments, the emission layer may include two or more materials among a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

In the emission layer, an amount of the dopant may be in a range of about 0.01 parts by weight to about 15 parts by weight based on 100 parts by weight of the host, but exemplary embodiments are not limited thereto.

The thickness of the emission layer may be in a range of about 100 Å to about 1,000 Å, for example, about 200 Å to about 600 Å. When the thickness of the emission layer is within the range, excellent light-emission characteristics may be obtained without a substantial increase in driving voltage.

Host in emission layer of organic light-emitting device

The host may include a compound represented by Formula 301 below:

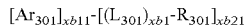

$$[Ar_{301}]_{xb11}\text{-}[(L_{301})_{xb1}\text{-}R_{301}]_{xb21} \qquad \text{<Formula 301>}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ are the same as described in connection with $Q_1$.

For example, xb11 in Formula 301 is 2 or more, two or more $Ar_{301}(s)$ may be linked to each other via a single bond.

In one or more exemplary embodiments, the host may include a compound represented by Formula 301-1, a compound represented by Formula 301-2, or any combination thereof:

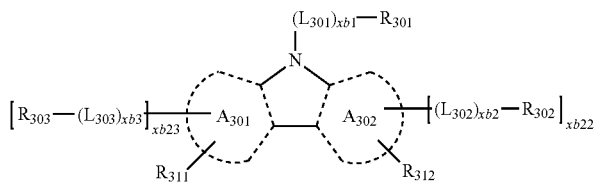

<Formula 301-1>

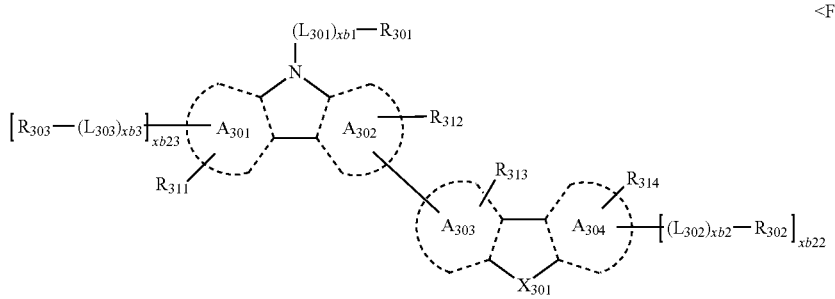

<Formula 301-2>

In Formulae 301-1 to 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described above, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are the same as described in connection with $R_{301}$.

In one or more exemplary embodiments, the host may include an alkaline earth metal complex. For example, the host may include a Be complex (for example, Compound H55), a Mg complex, a Zn complex, or any combination thereof.

In one or more exemplary embodiments, the host may include one of Compounds H1 to H120, 9,10-di(2-naphthyl)anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di-9-carbazolylbenzene (mCP); 1,3,5-tri(carbazol-9-yl)benzene (TCP); or any combination thereof, but exemplary embodiments are not limited thereto:

H1

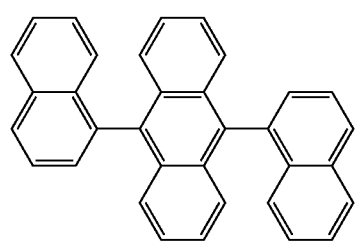

-continued

H2

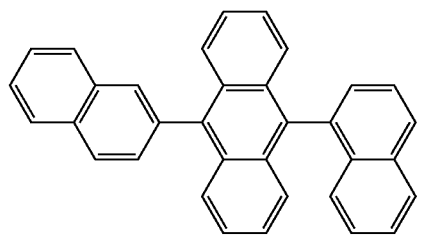

H3

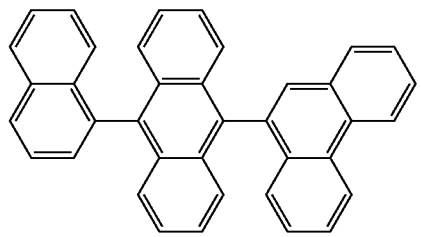

H4

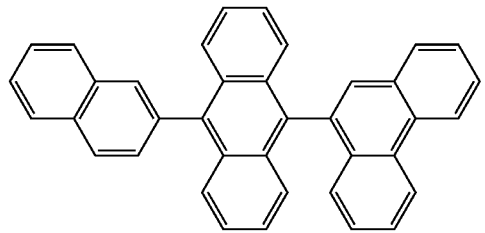

H5

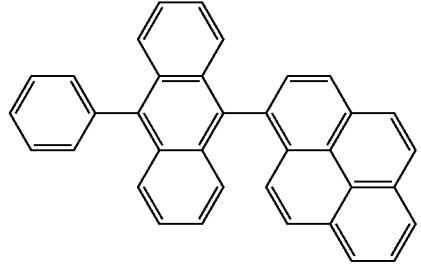

H6
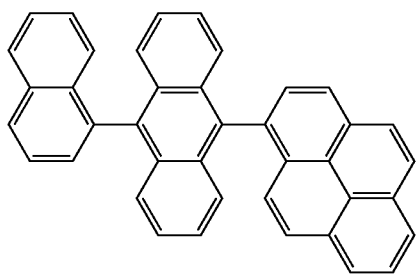
H12
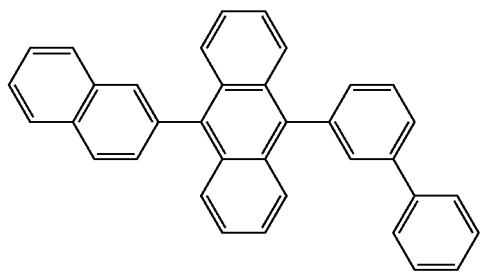
H7
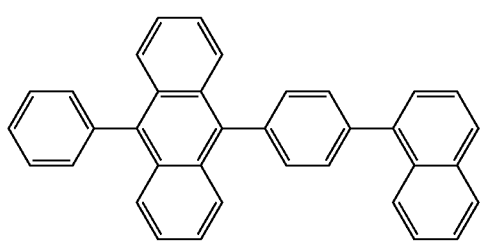
H13
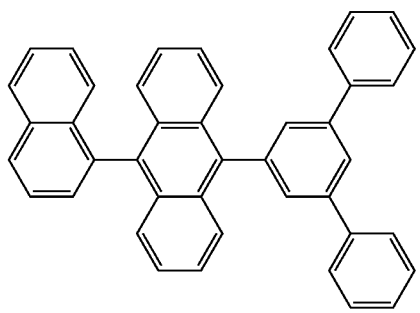
H8
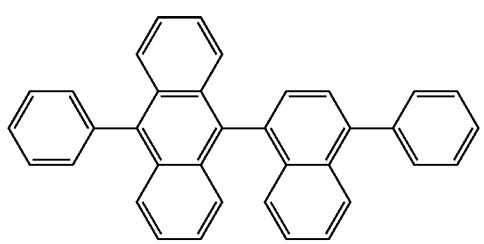
H14
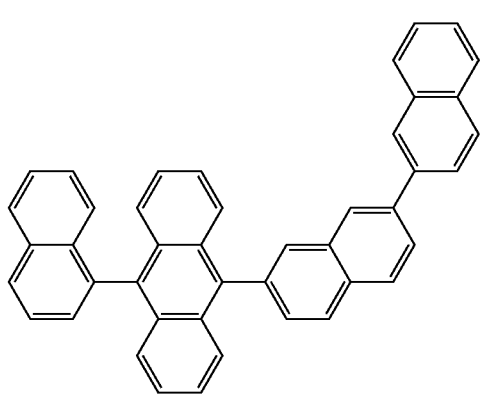
H9
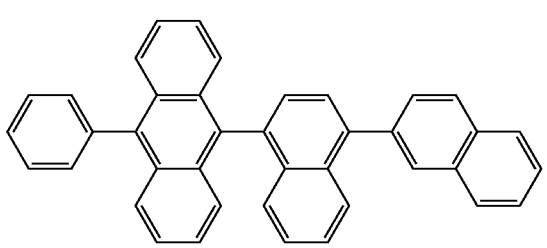
H15
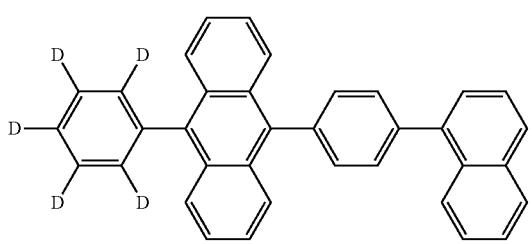
H10
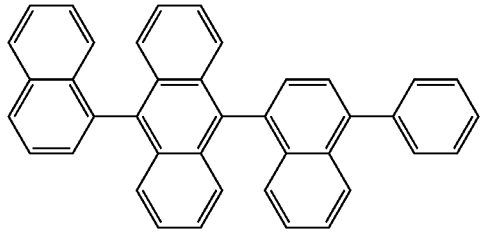
H16
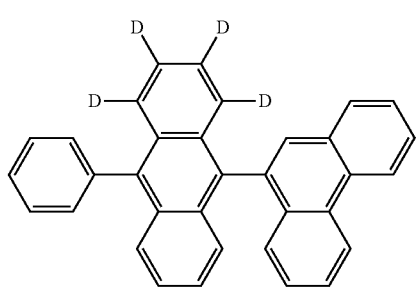
H11
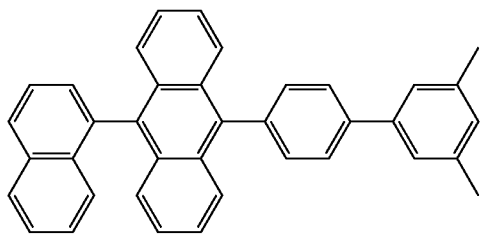

H17
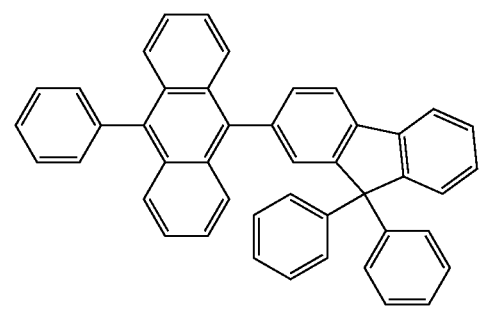
H18
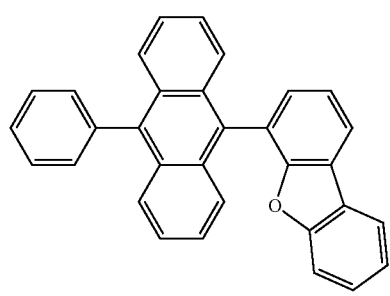
H19
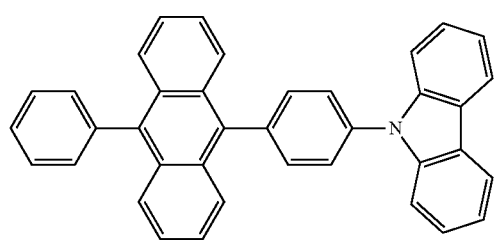
H20
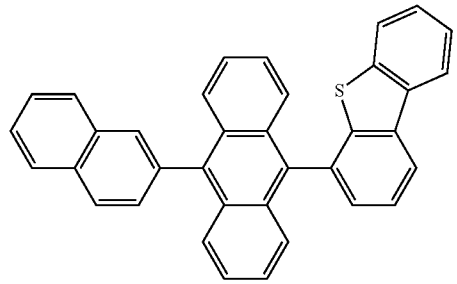
H21
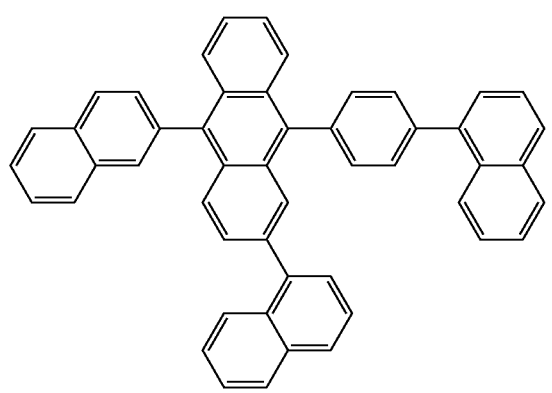
H22
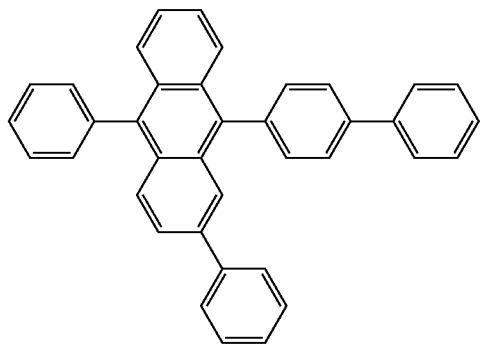
H23
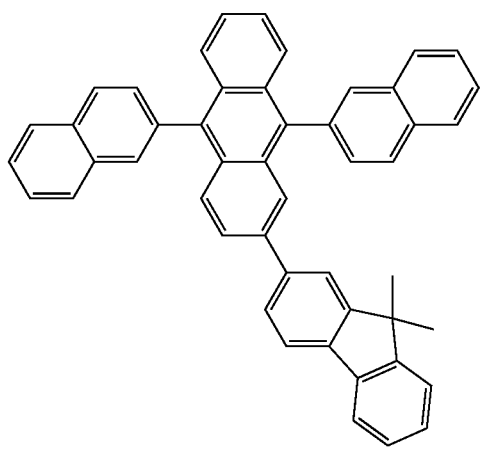
H24
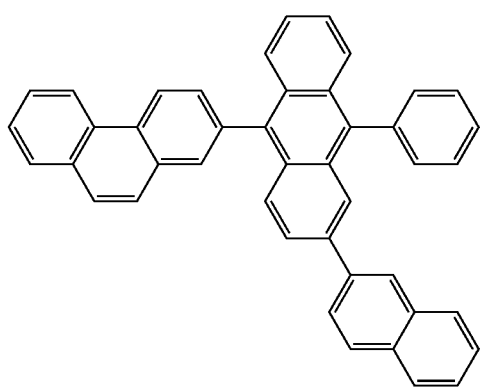

H25
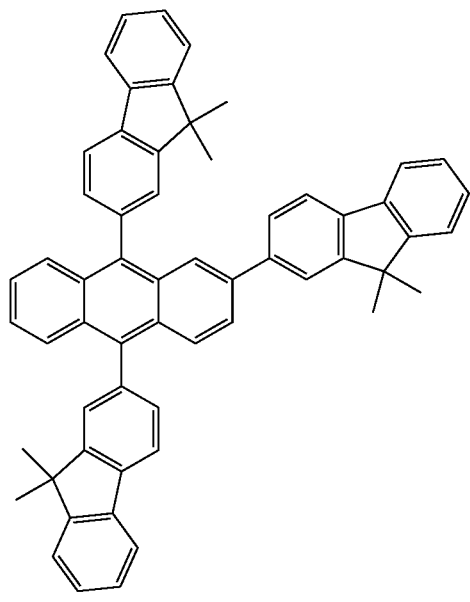
H27
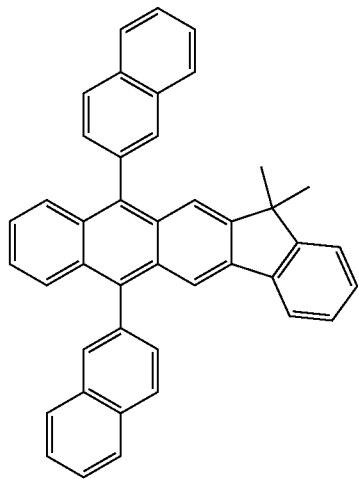
H28
H26
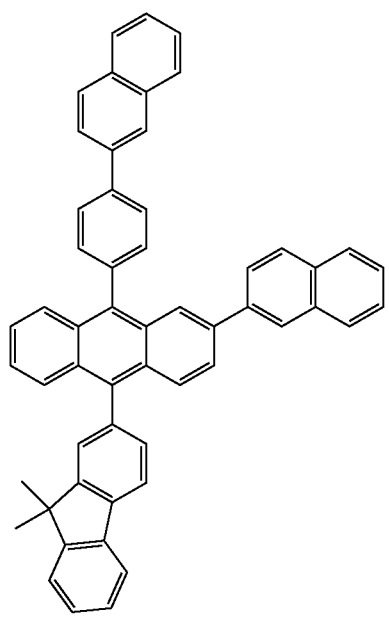
H29
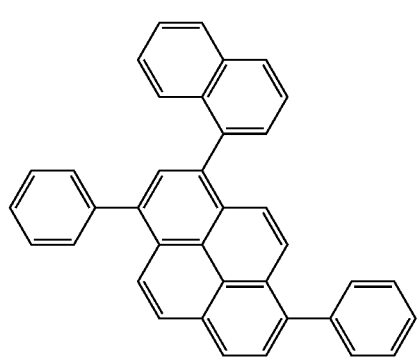

H30
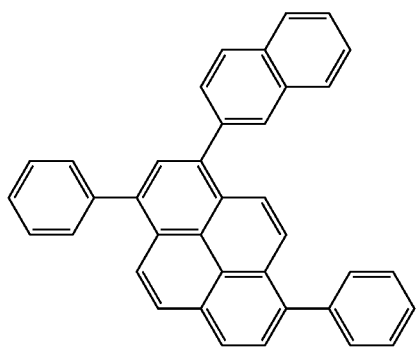
H31
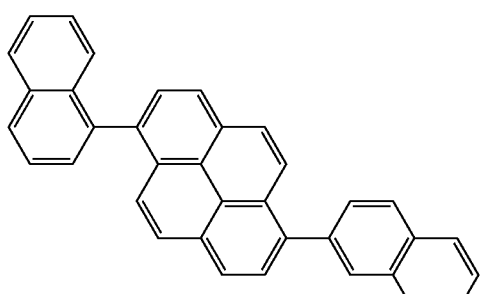
H32
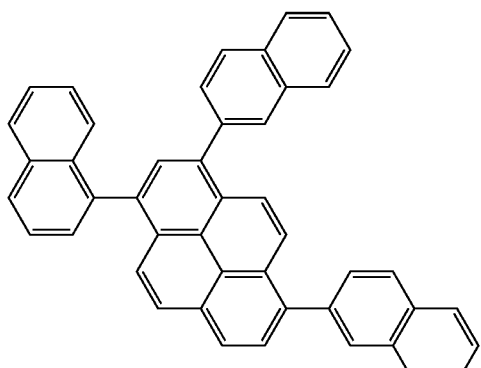
H33
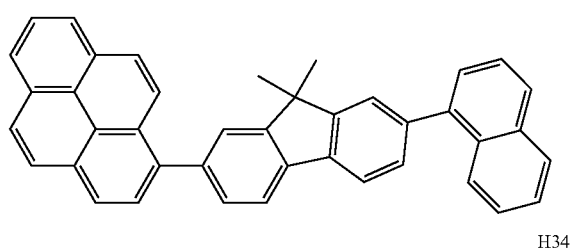
H34
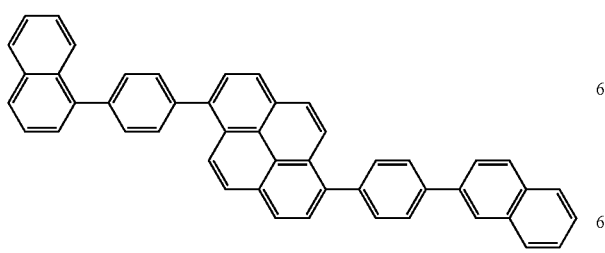
H35
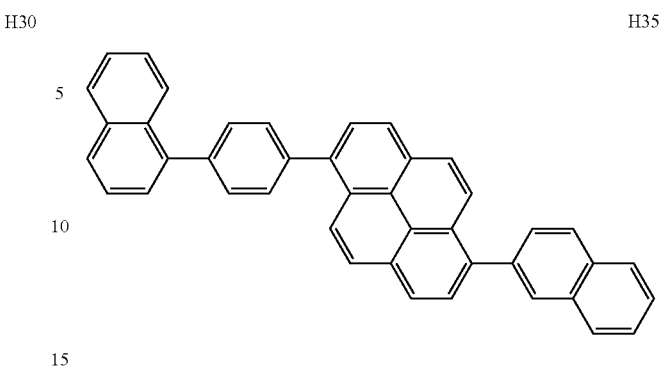
H36
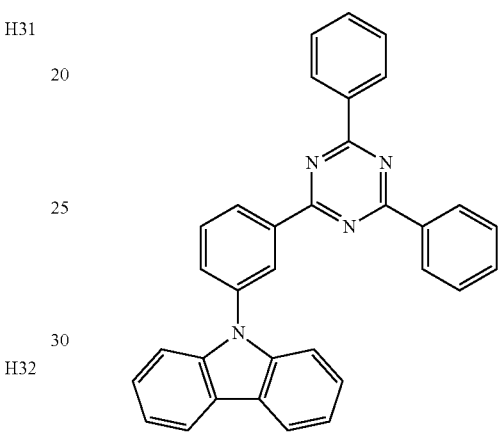
H37
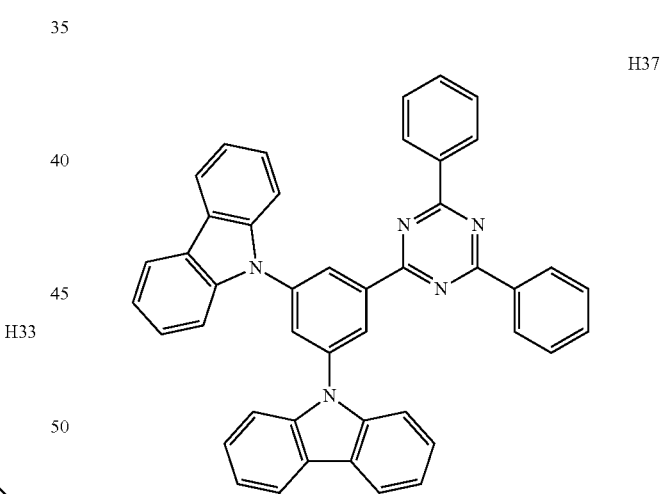
H38
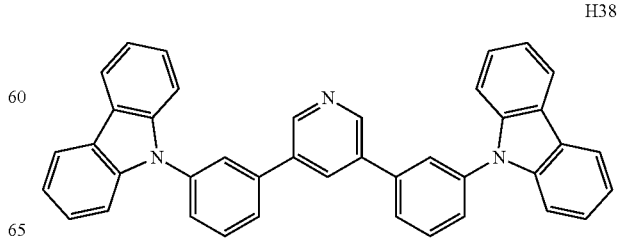

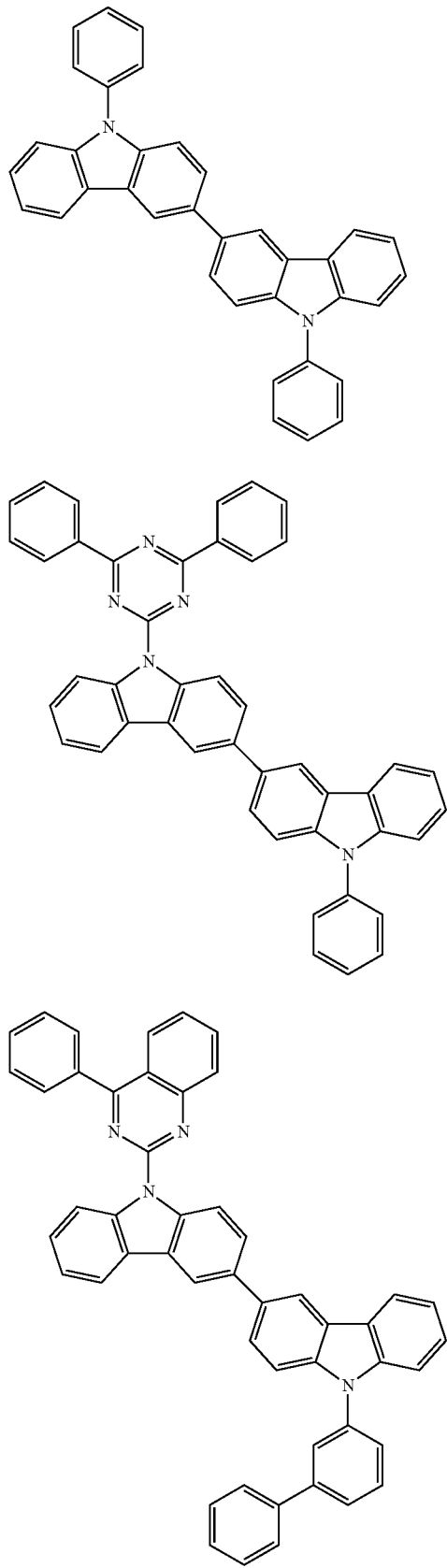
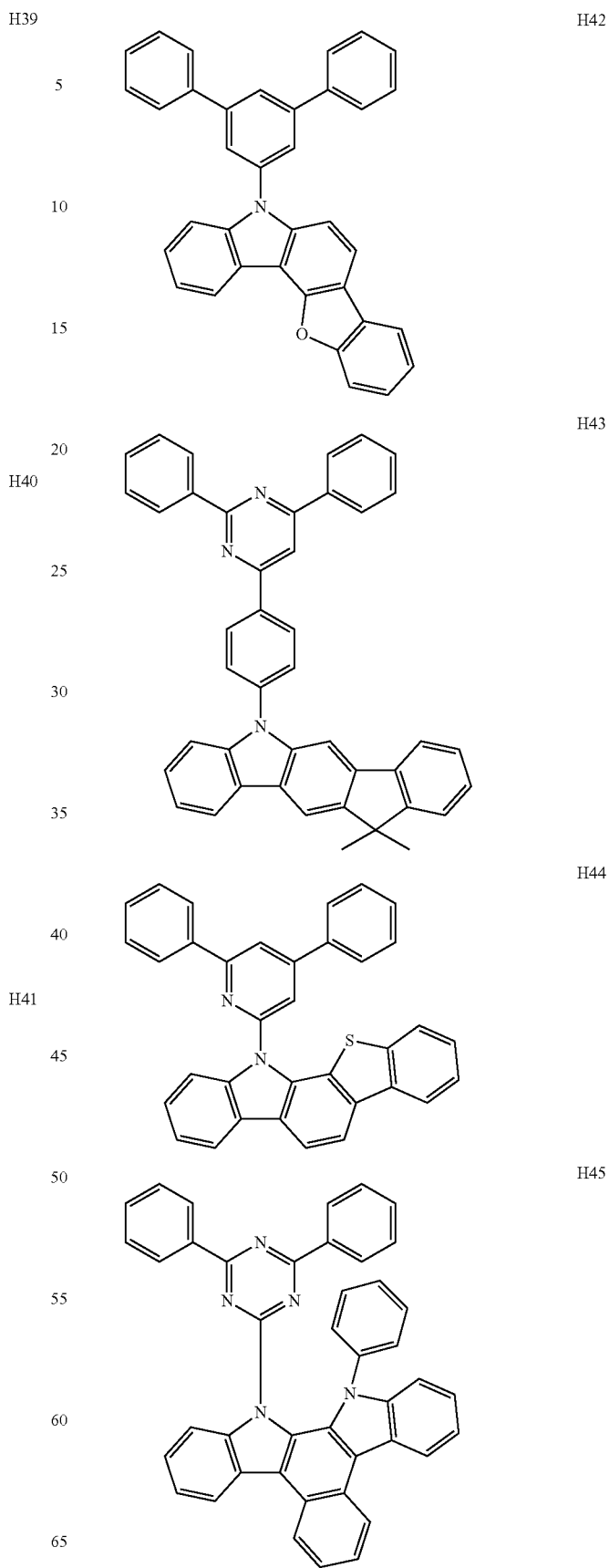

H46
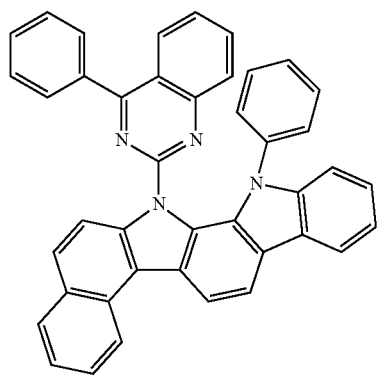
H52
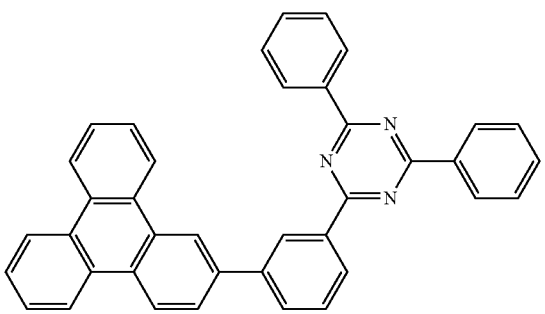
H47
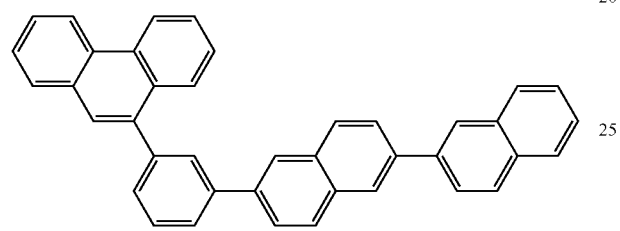
H53
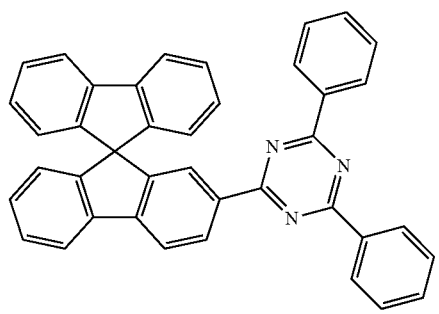
H48
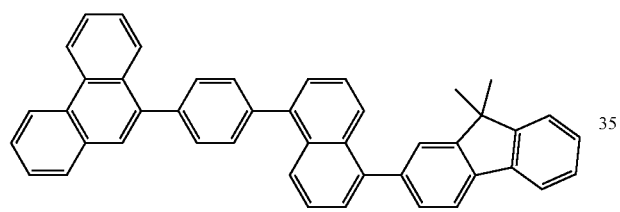
H49
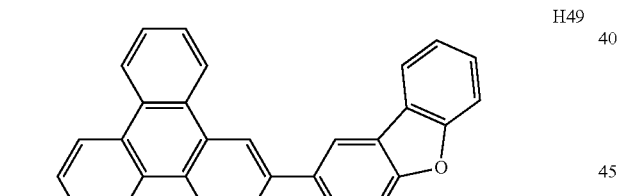
H54
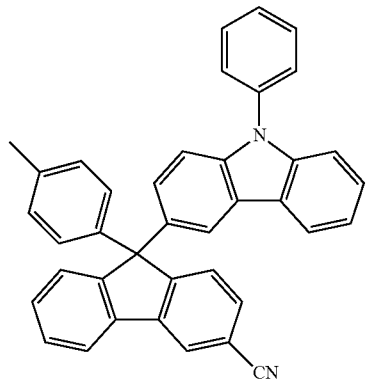
H50
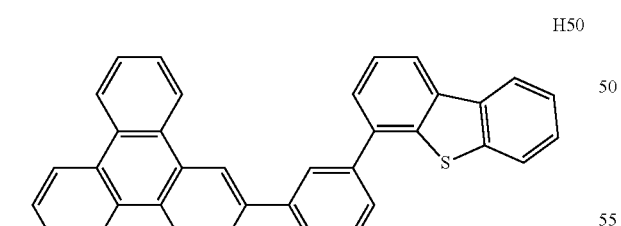
H51
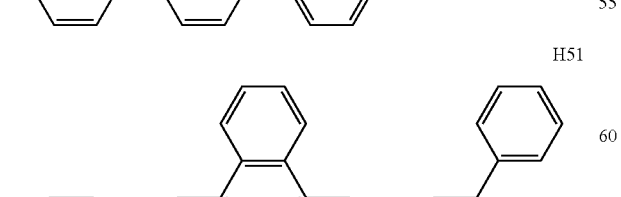
H55
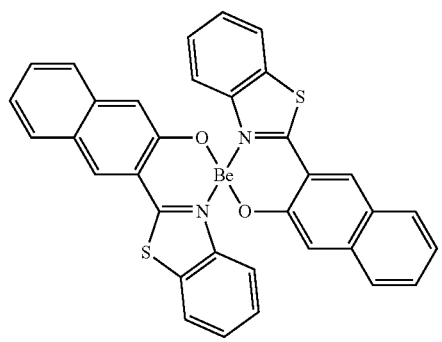

H56
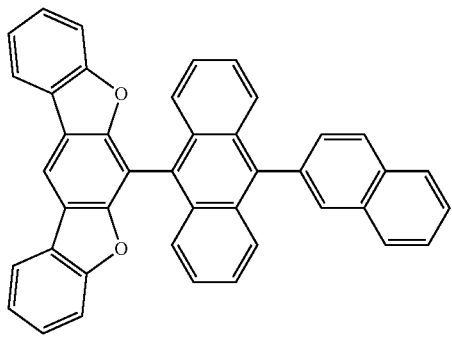
H57
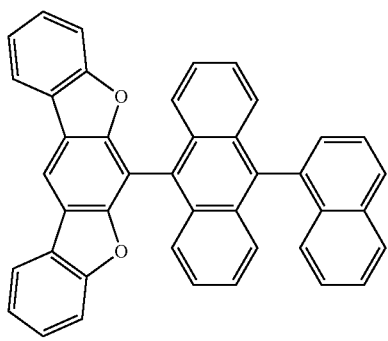
H58
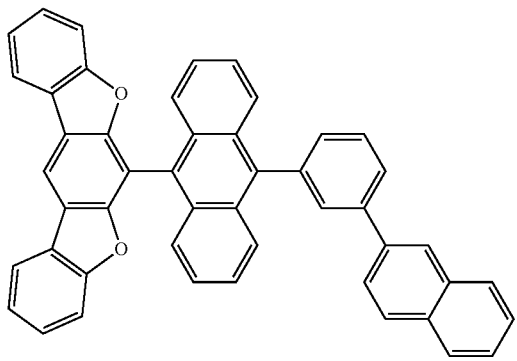
H59
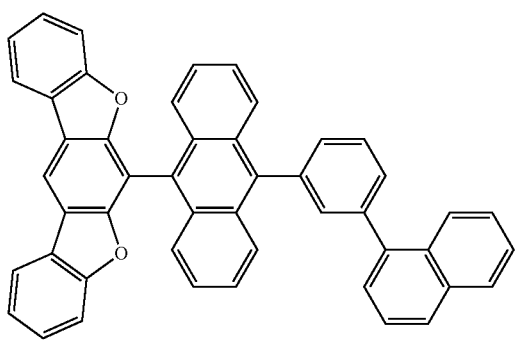
H60
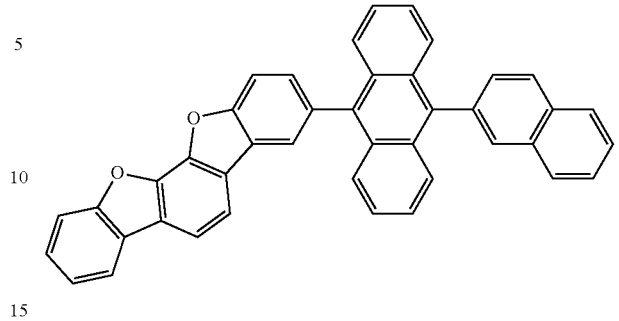
H61
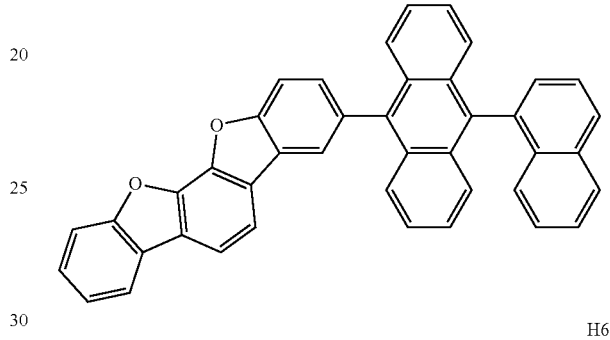
H62
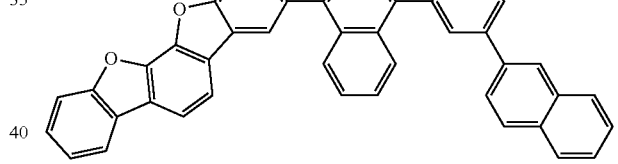
H63
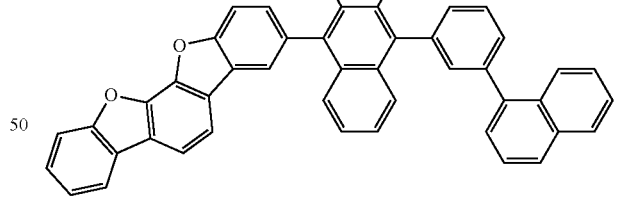
H64
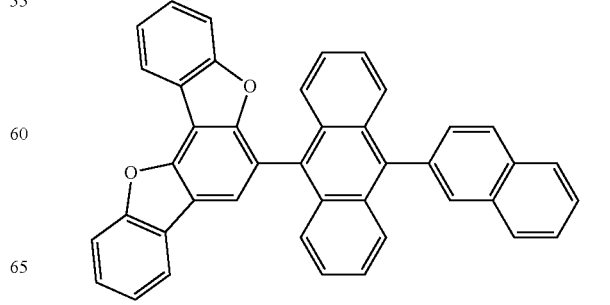

99
-continued
H65
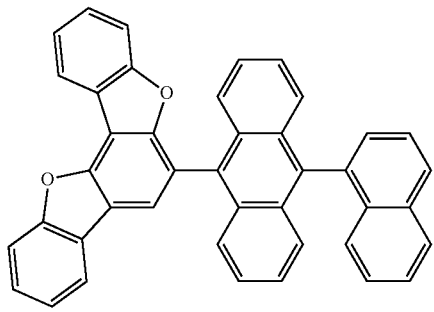
H66
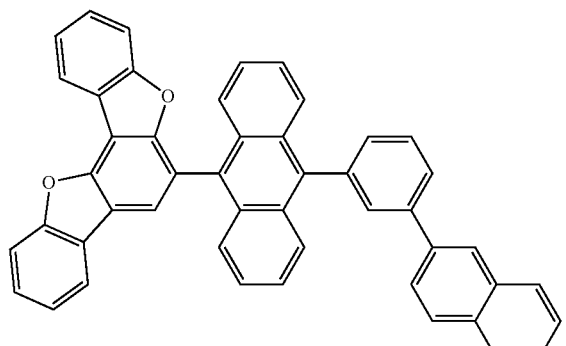
H67
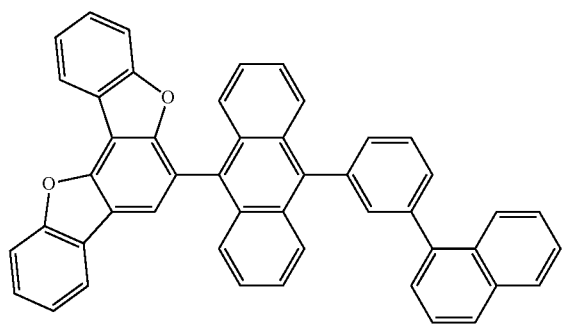
H68
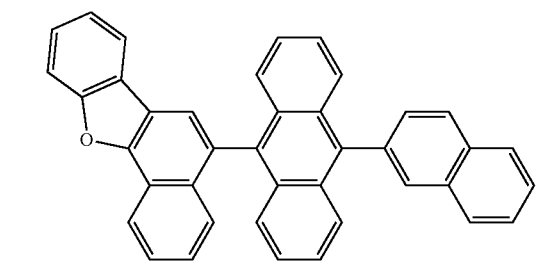
H69
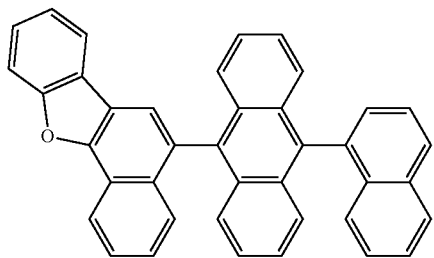
100
-continued
H70
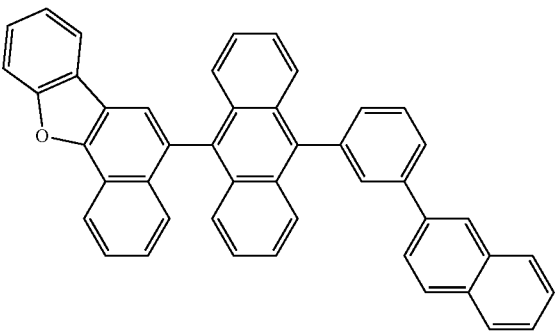
H71
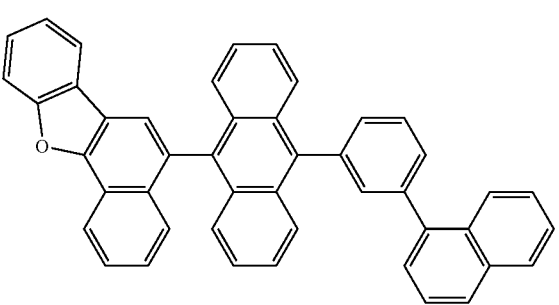
H72
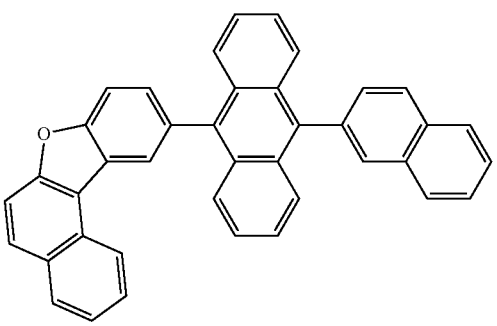
H73
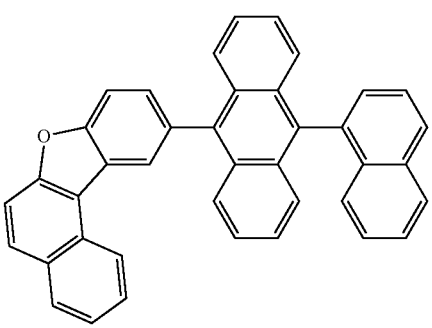

H74
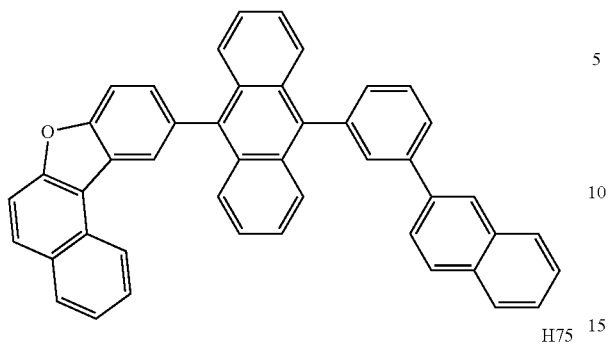
H75
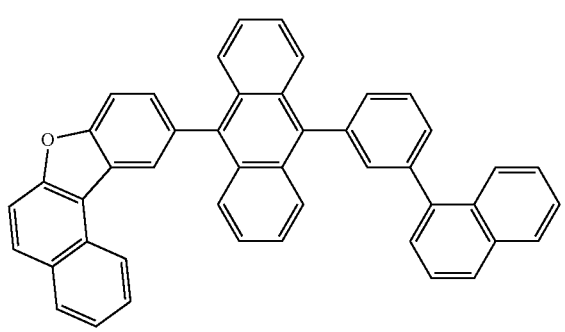
H76
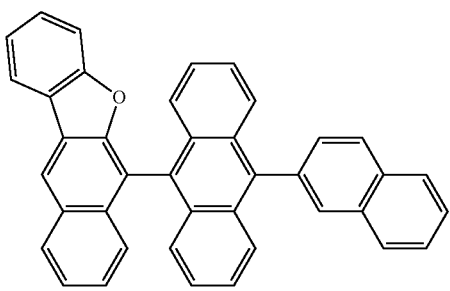
H77
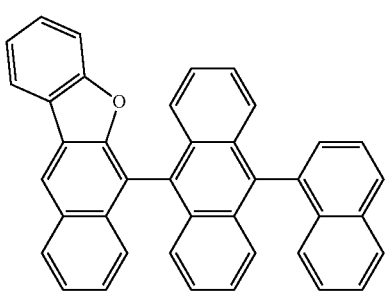
H78
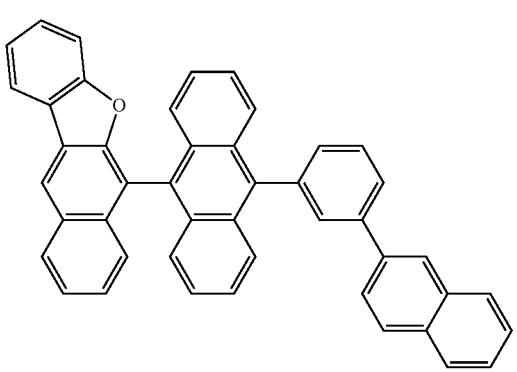
H79
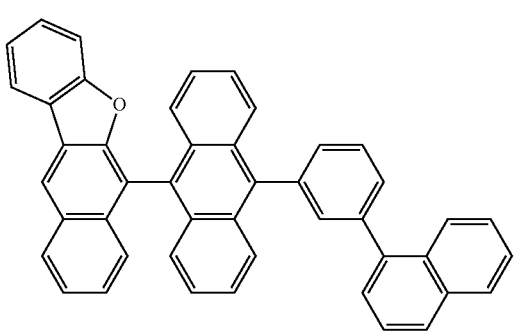
H80
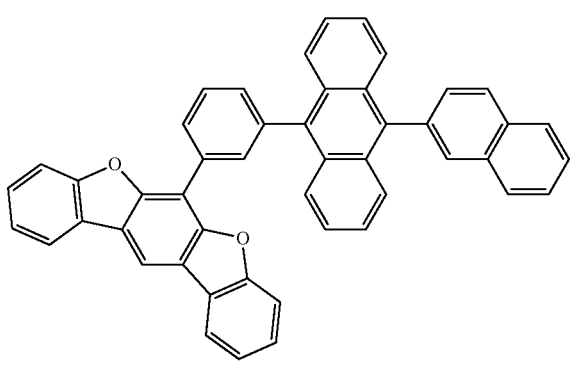
H81
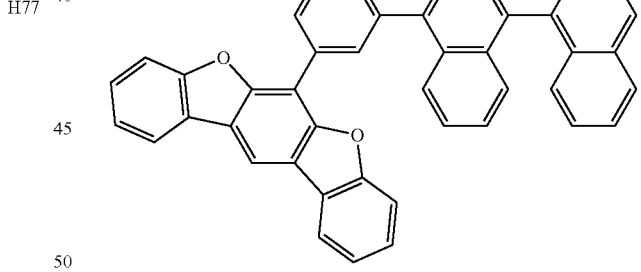
H82
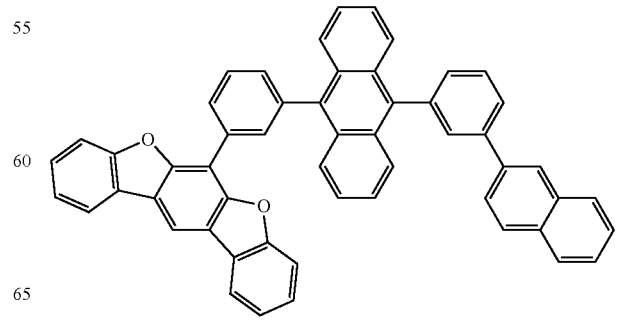

-continued
H83
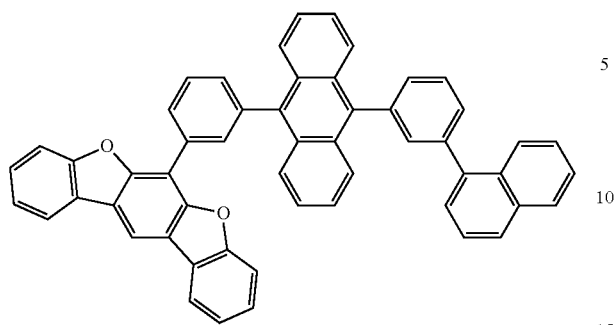
H84
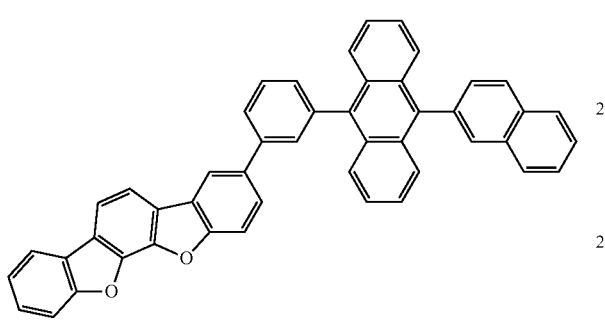
H85
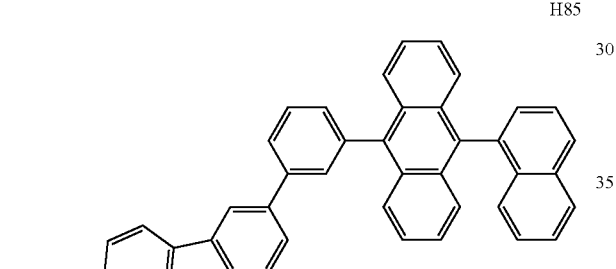
H86
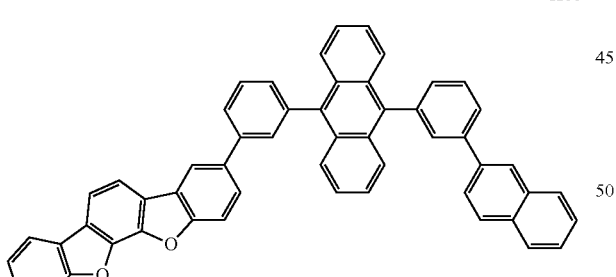
H87
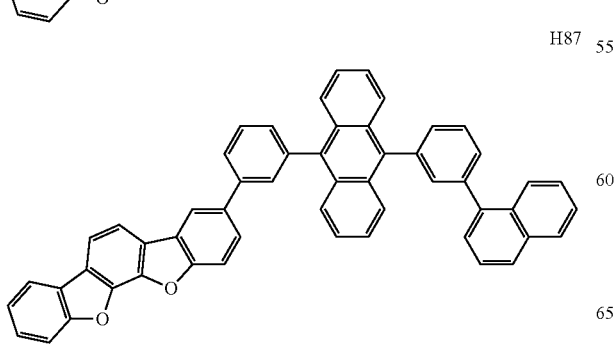
-continued
H88
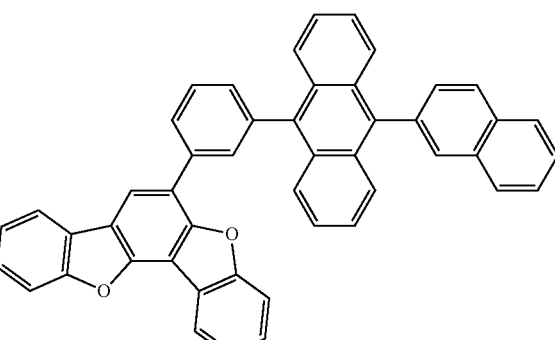
H89
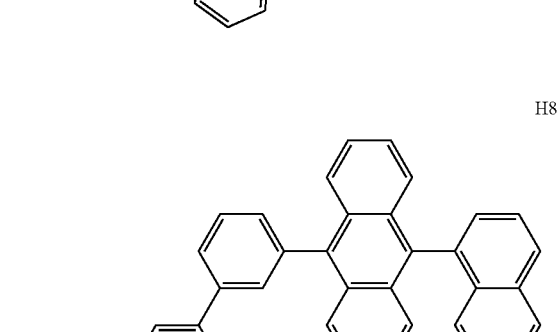
H90
H91
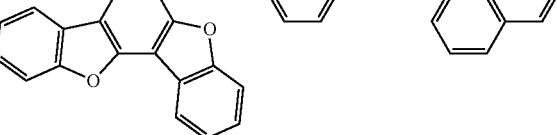

H92
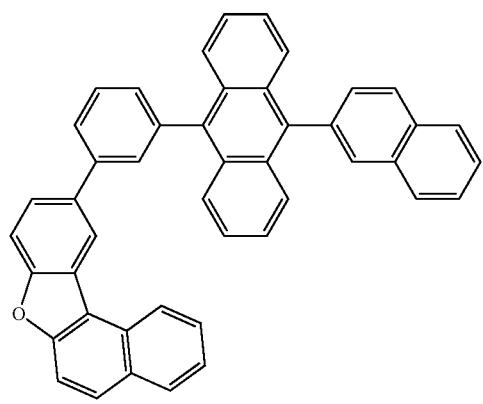
H93
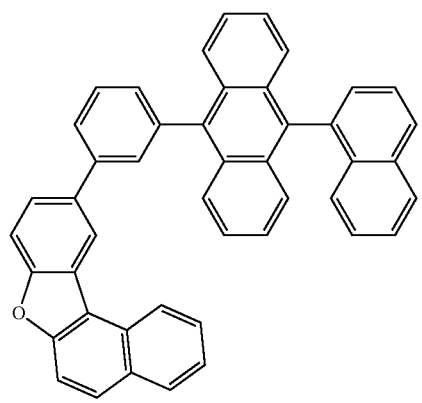
H94
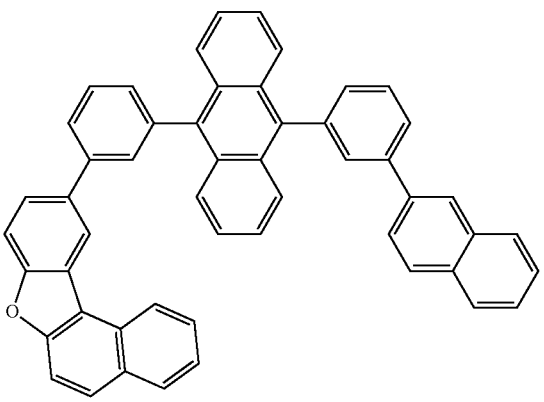
H95
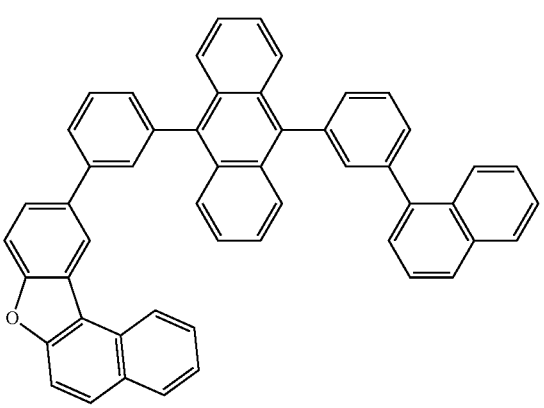
H96
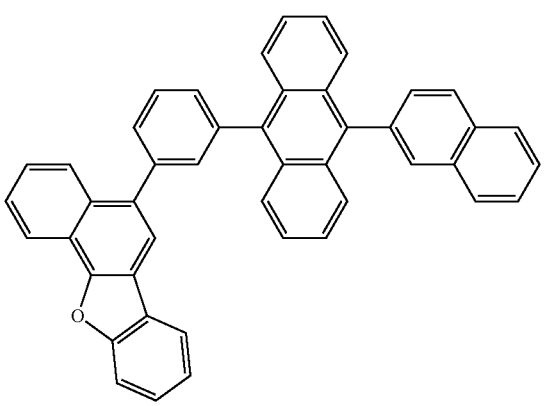
H97
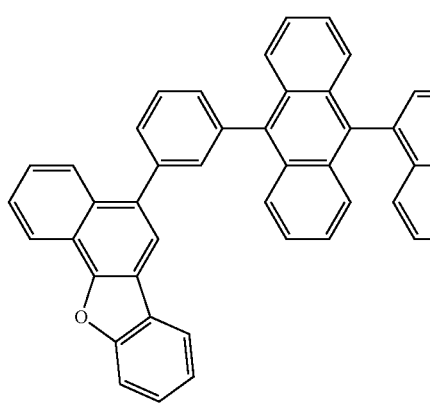
H98
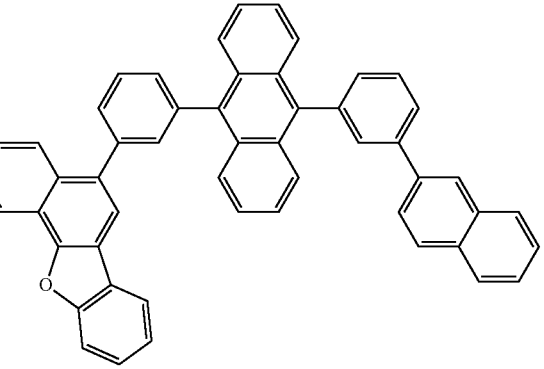
H99
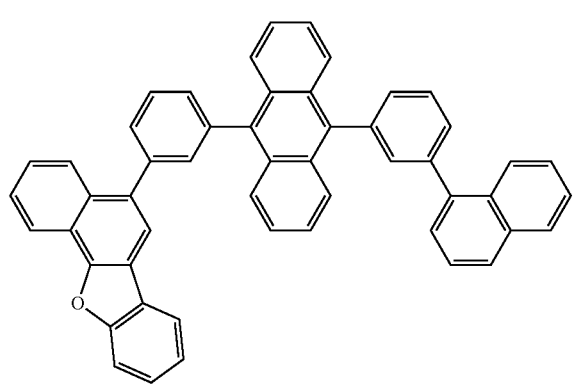

H100
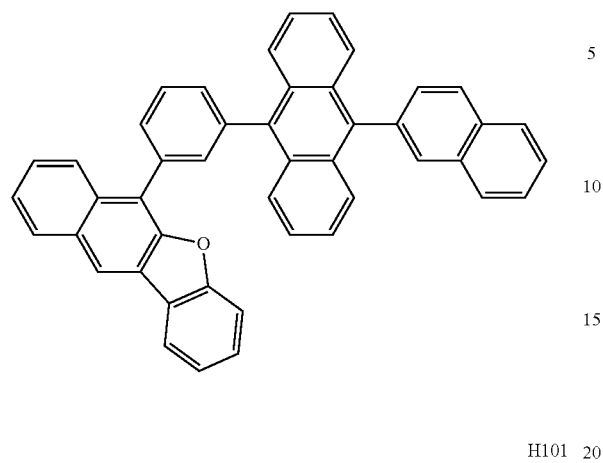
H101
H102
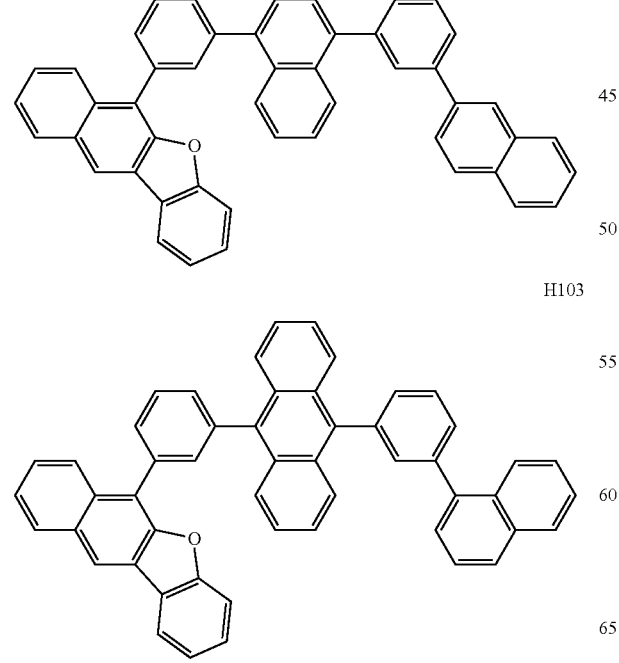
H103
H104
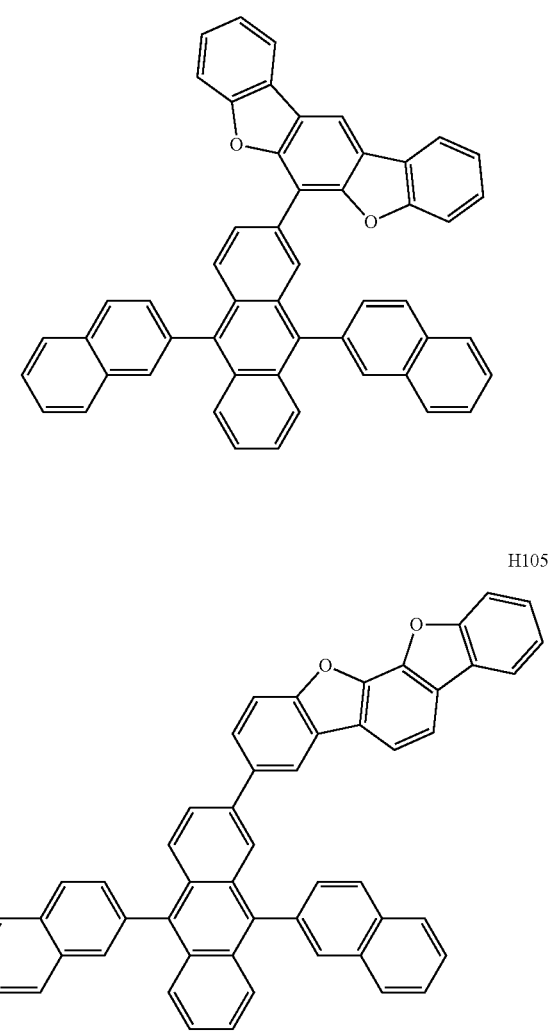
H105
H106
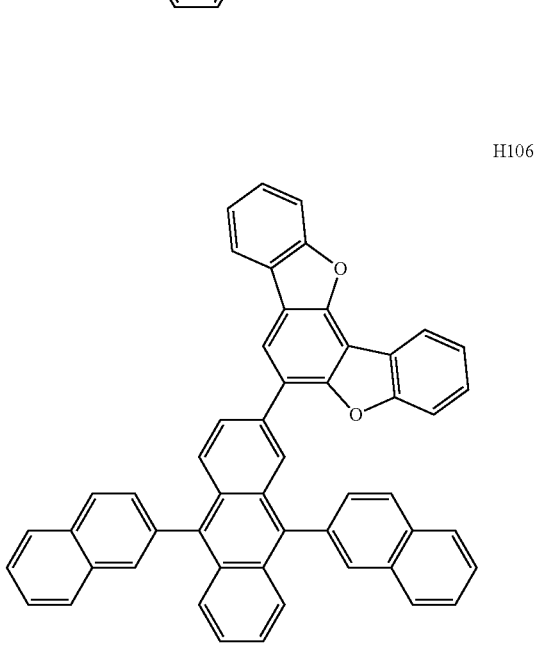

H107

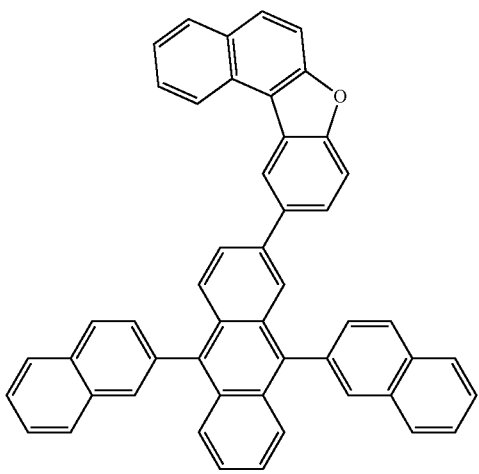

H118

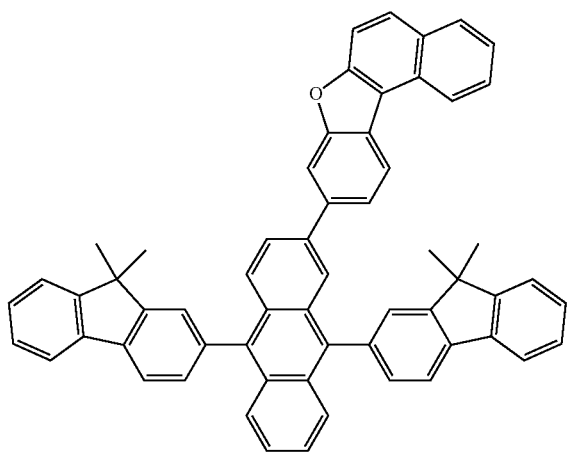

H119

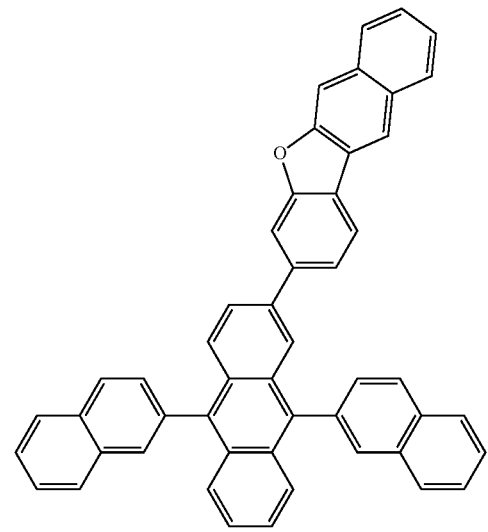

H120

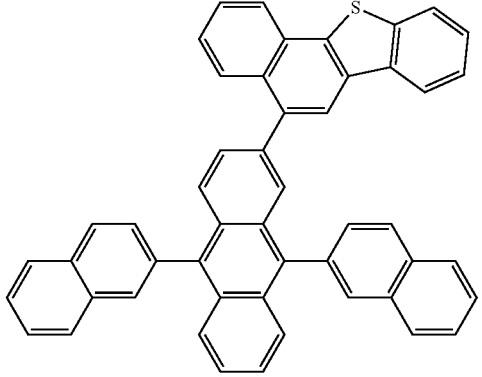

Phosphorescent dopant in emission layer of organic light-emitting device

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more exemplary embodiments, the phosphorescent dopant may include an organometallic compound represented by Formula 401:

$$M(L_{401})_{xc1}(L_{402})_{xc2} \qquad \text{<Formula 401>}$$

<Formula 402>

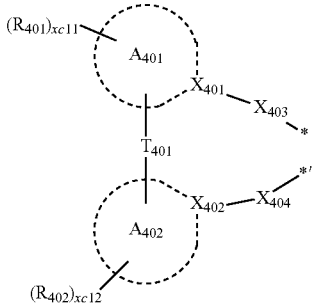

In Formulae 401 and 402,

M may be a transition metal (for example, iridium (Ir), platinum (Pt), palladium (Pd), osmium (Os), titanium (Ti), gold (Au) hafnium (Hf), europium (Eu), terbium (Tb), rhodium (Rh), rhenium (Re), or thulium (Tm)), $L_{401}$ may be a ligand represented by Formula 402, xc1 may be 1, 2, or 3, and when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N(Q_{411})—*', *—C(Q_{411})(Q_{412})—*', *—C(Q_{411})=C(Q_{412})—*', *—C(Q_{411})=*', or *=C=*', $X_{403}$ and $X_{404}$ may each independently be a chemical bond (for example, a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, or —$P(=O)(Q_{401})(Q_{402})$, $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more exemplary embodiments, in Formula 402, i) $X_{401}$ may be nitrogen, and $X_{402}$ may be carbon, or ii) each of $X_{401}$ and $X_{402}$ may be nitrogen.

In one or more exemplary embodiments, in Formula 402, when xc1 is 2 or more, two rings $A_{401}$(s) in two or more $L_{401}$(s) may optionally be linked to each other via $T_{402}$, which is a linking group, or two rings $A_{402}$(s) may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. For example, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof, but exemplary embodiments are not limited thereto.

The phosphorescent dopant may include, for example, a compound selected from Compounds PD1 to PD25, or any combination thereof, but exemplary embodiments are not limited thereto:

PD1

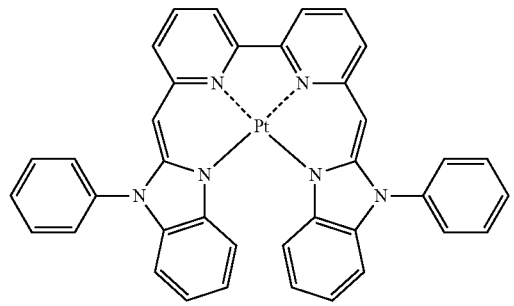

-continued

PD2

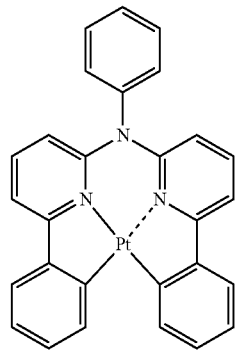

PD3

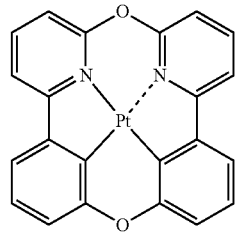

PD4

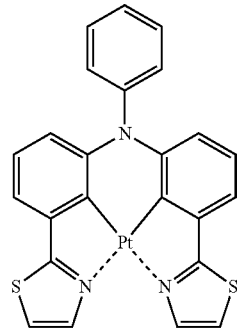

PD5

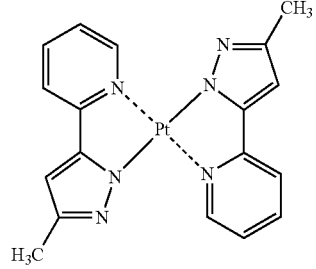

PD6

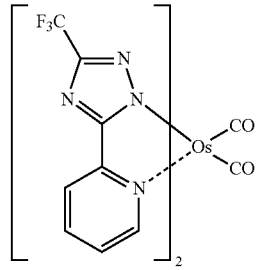

PD7
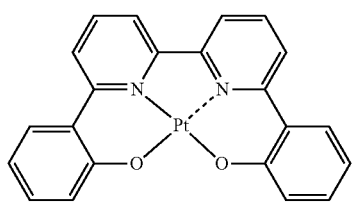
PD8
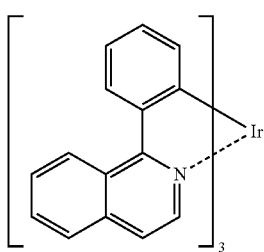
PD9
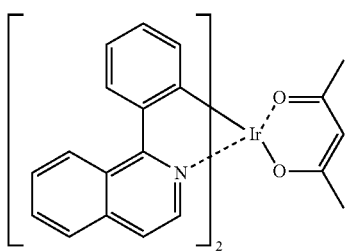
PD10
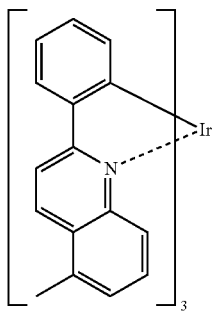
PD11
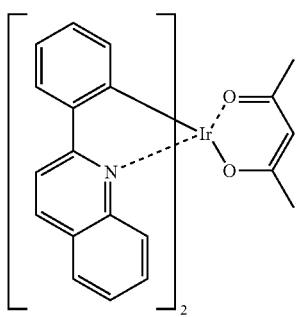
PD12
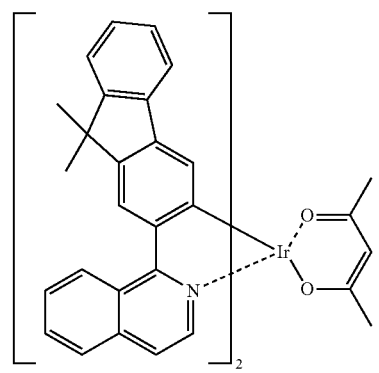
PD13
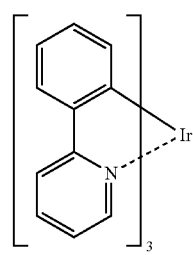
PD14
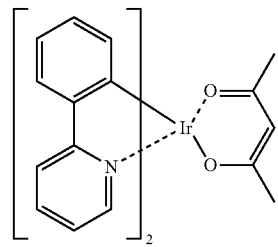
PD15
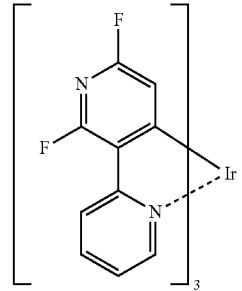
PD16
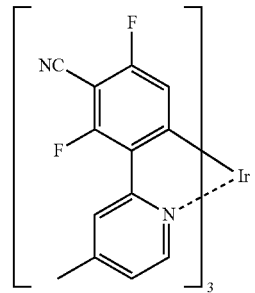

PD17
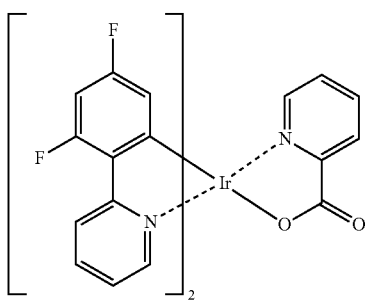
PD18
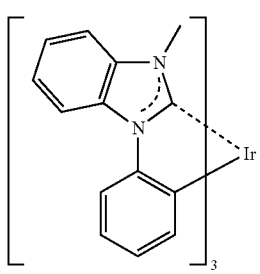
PD19
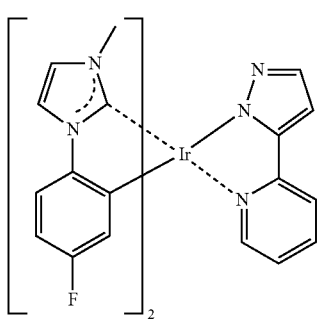
PD20
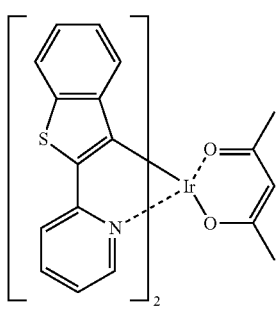
PD21
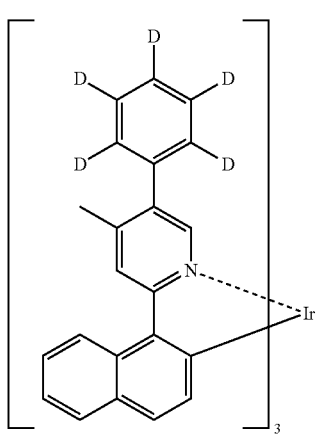
PD22
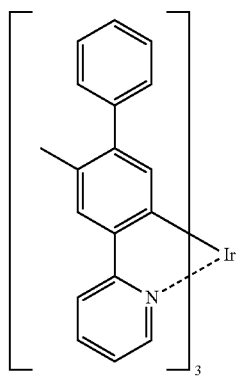
PD23
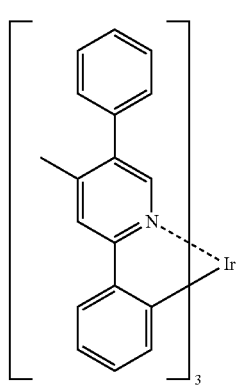
PD24
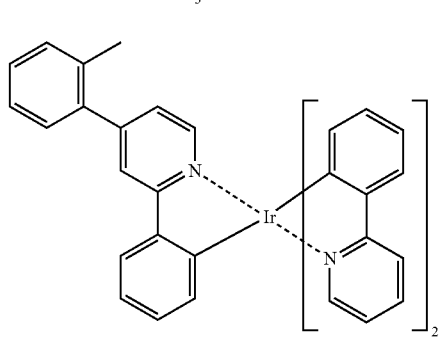
PD25
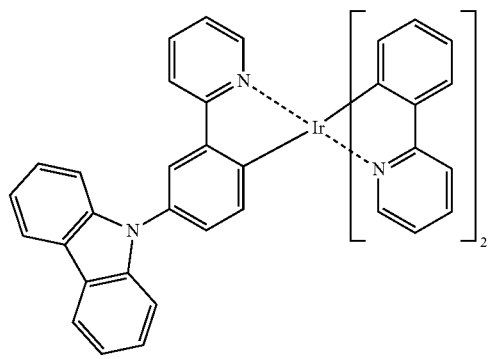
Fluorescent dopant in emission layer of organic light-emitting device
The fluorescent dopant may include an amine group-containing compound, a styryl group-containing compound, or any combination thereof.

For example, the fluorescent dopant may include a compound represented by Formula 501:

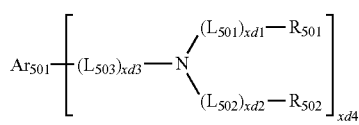
<Formula 501>

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic group (for example, an anthracene group, a chrysene group, a pyrene group, etc.) in which three or more monocyclic groups are condensed with each other.

In one exemplary embodiment, xd4 in Formula 501 may be 2, but exemplary embodiments are not limited thereto.

For example, the fluorescent dopant may include: one of Compounds FD1 to FD36; 4, 4'-bis(2,2'-diphenylethenyl)-biphenyl (DPVBi); 4,4'-bis[4-(di-p-tolylamino)styryl]biphenyl (DPAVBi); or any combination thereof:

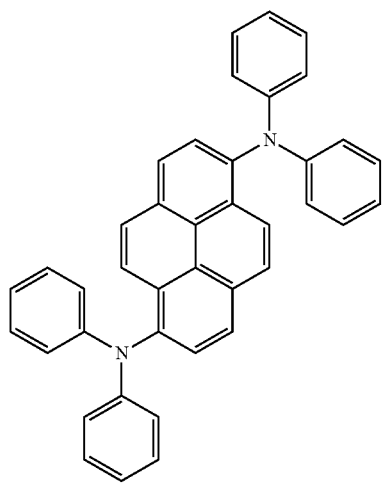

FD1

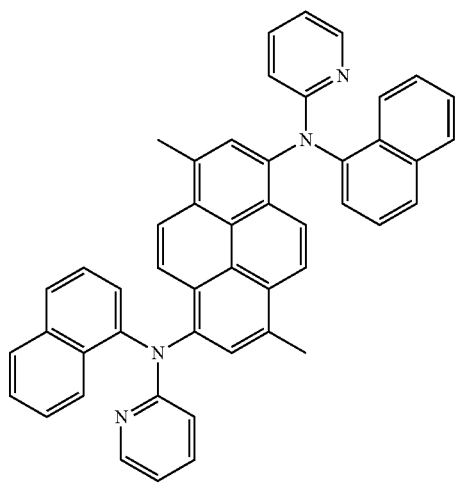

FD2

-continued
FD3
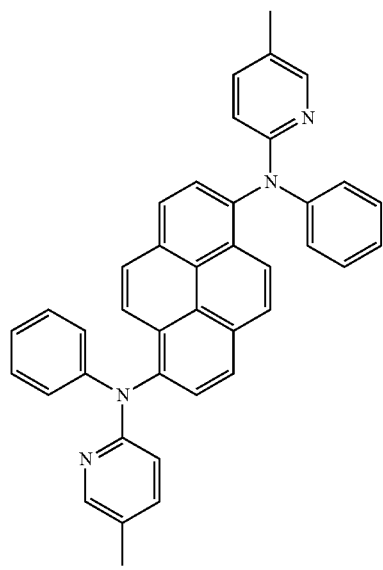
FD4
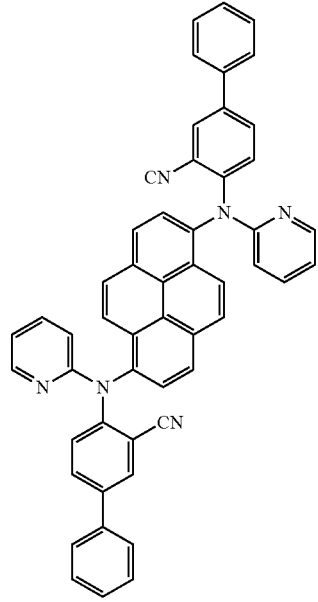
FD5
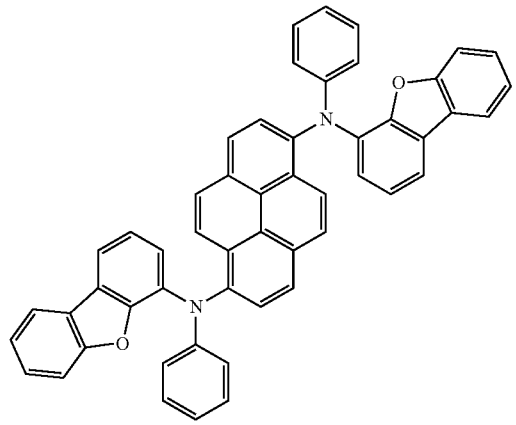
FD6
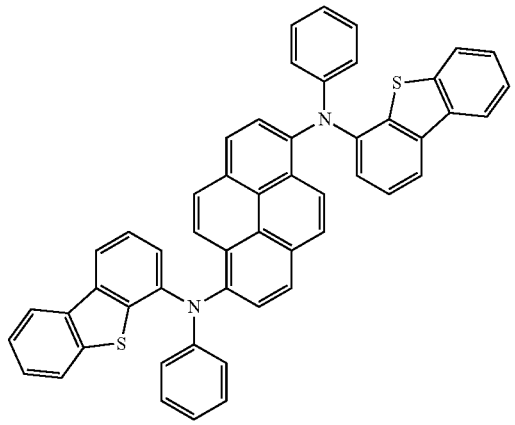
FD7
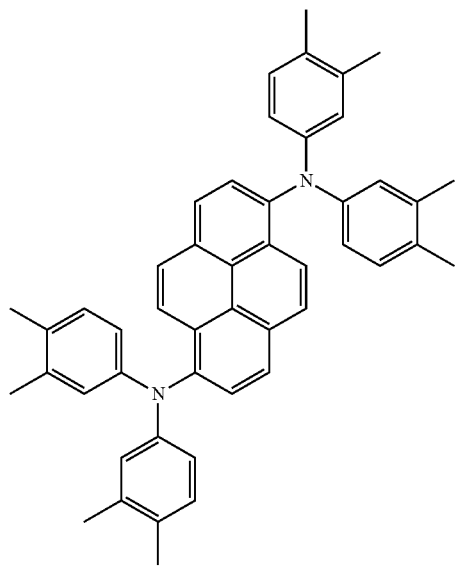
FD8
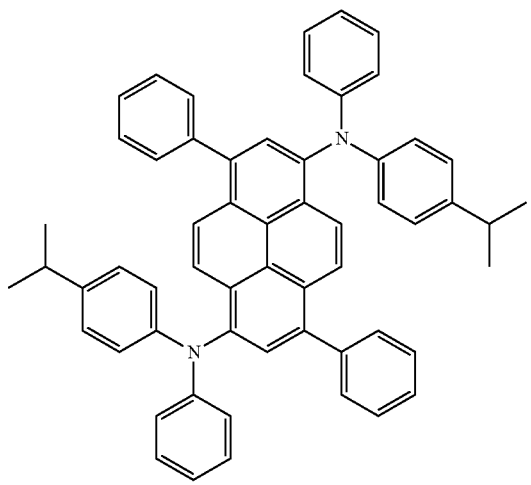

-continued
FD9
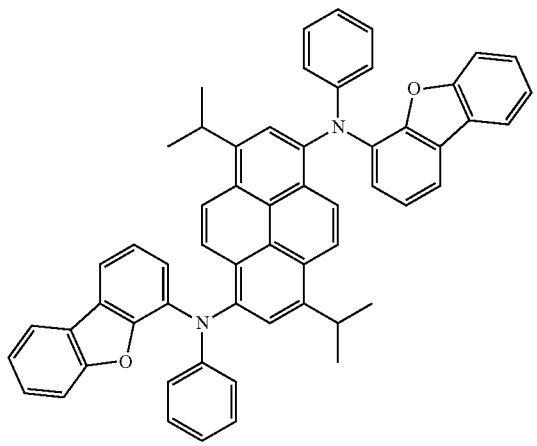
FD10
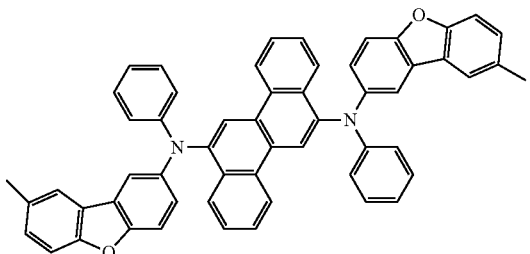
FD11
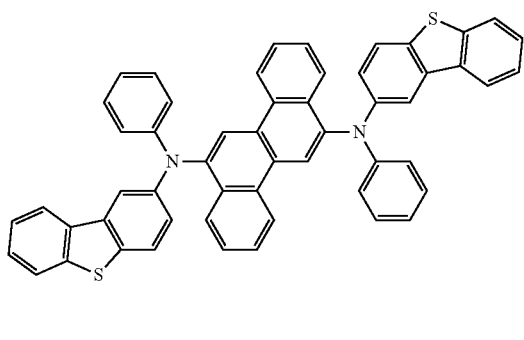
FD12
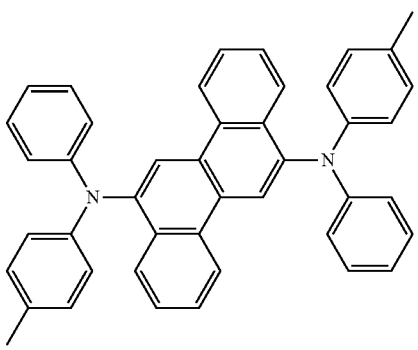
FD13
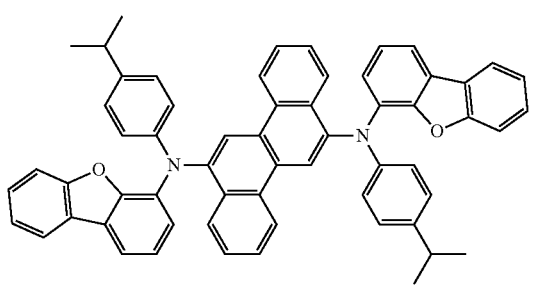
FD14
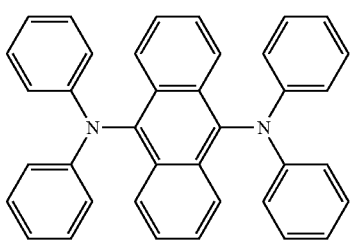
FD15
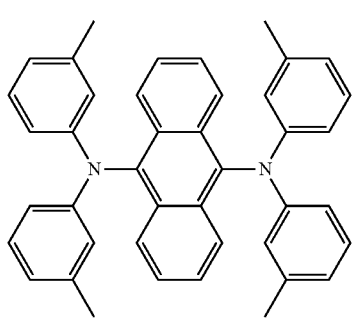
FD16
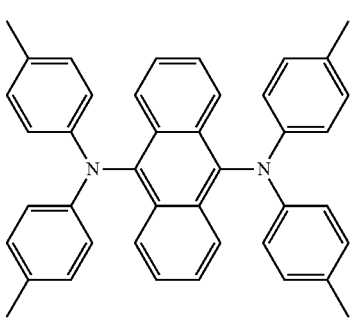

-continued
FD17
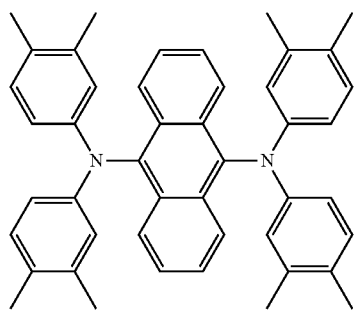
FD18
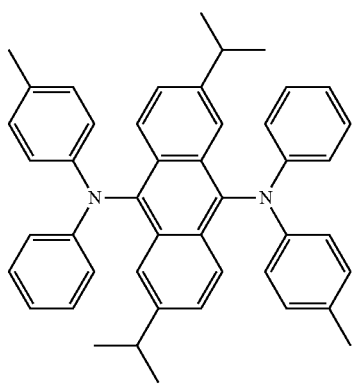
FD19
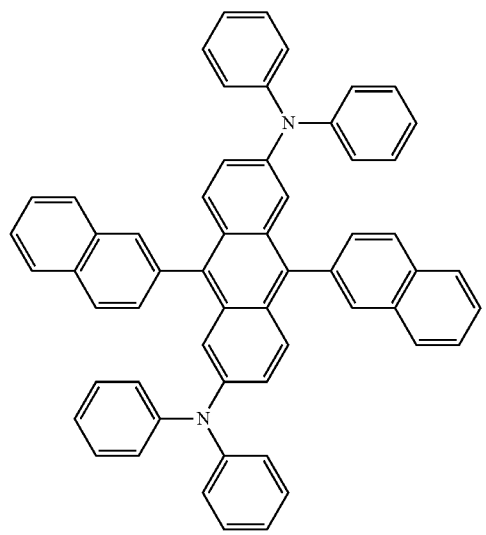
FD20
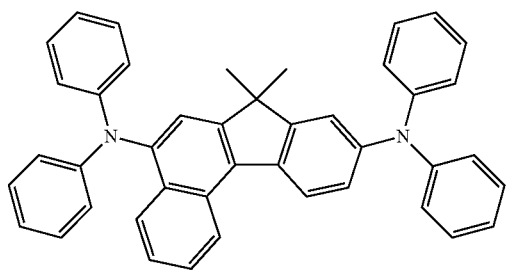
FD21
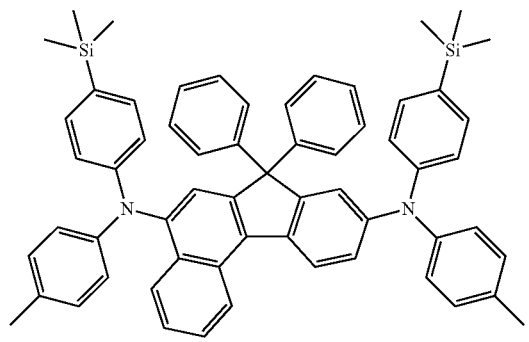
FD22
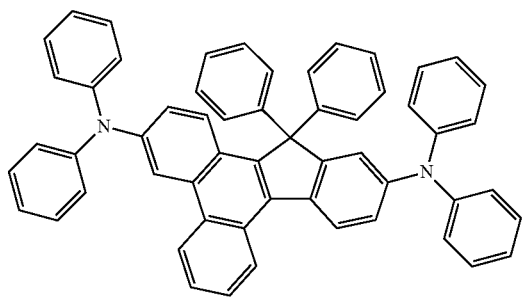
FD23
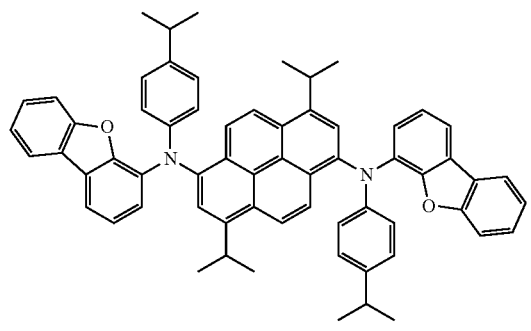
FD24
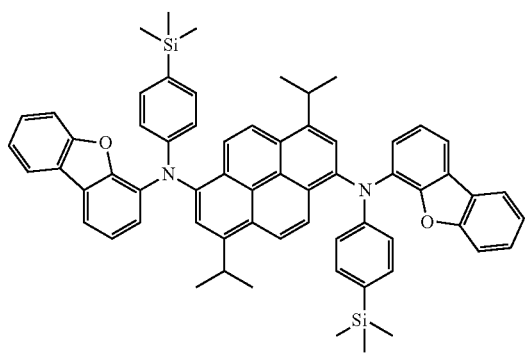

-continued
FD25
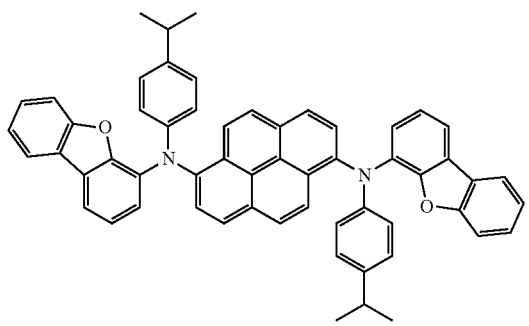
FD26
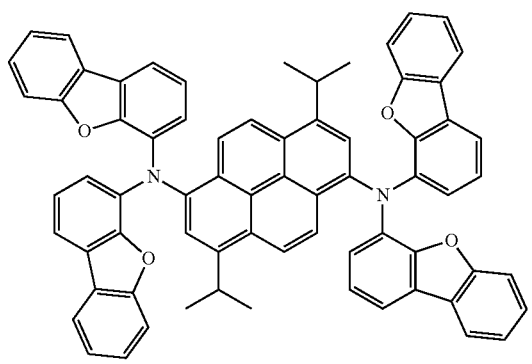
FD27
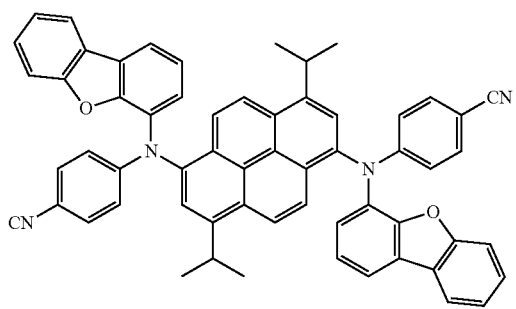
FD28
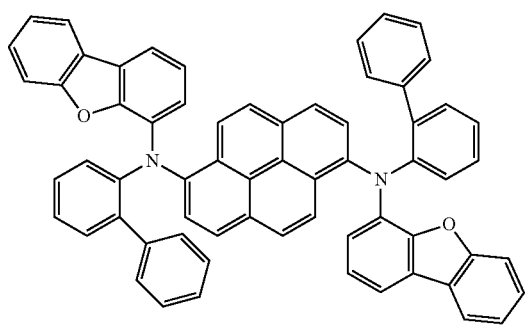
FD29
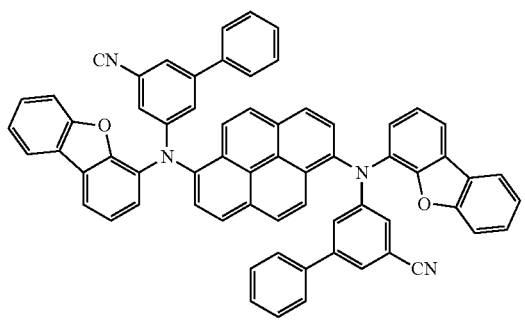
FD30
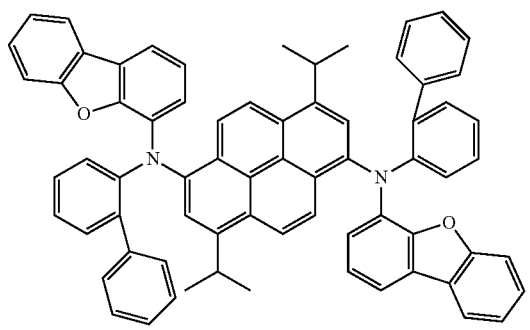
FD31
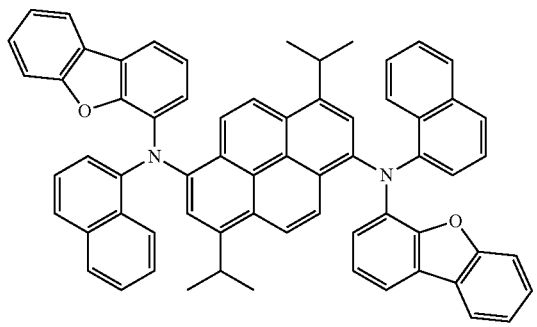
FD32
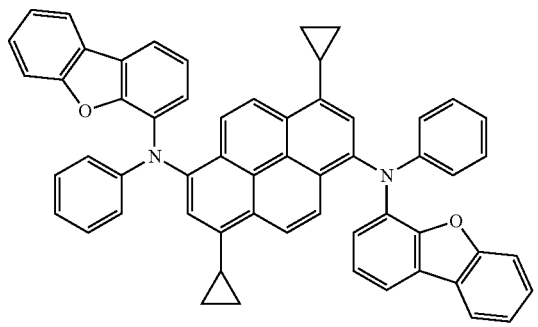

-continued

FD33
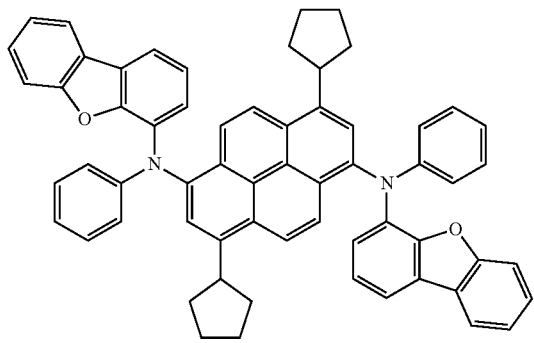

FD34
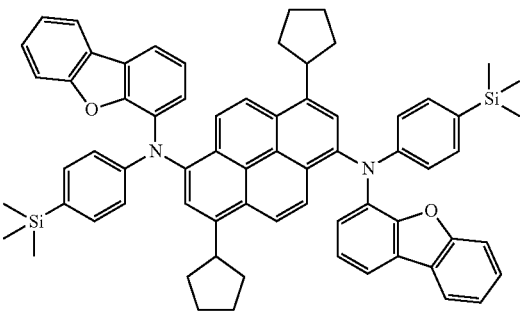

FD35
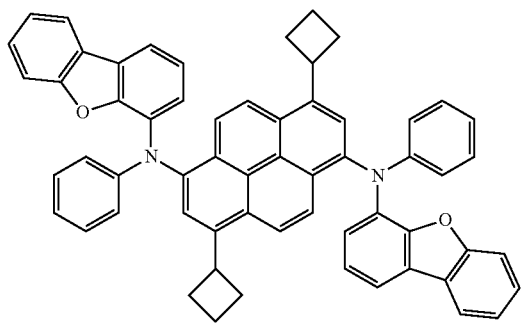

FD36
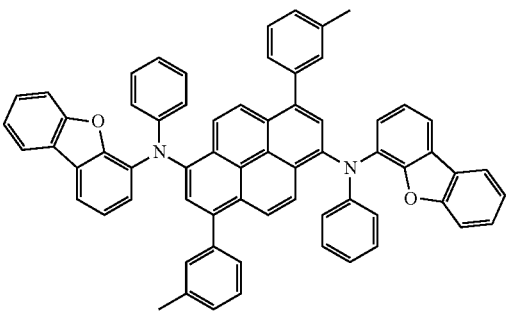

DPVBi
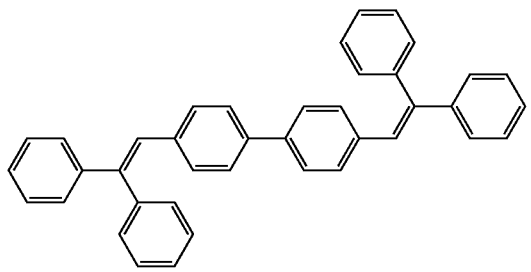

DPAVBi
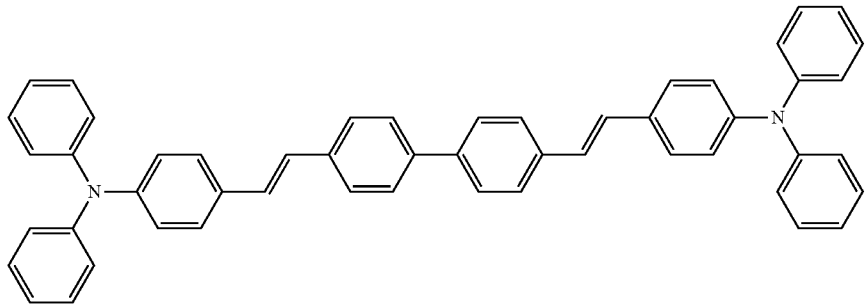

General Definition of Substituents

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having a structure corresponding to $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused with each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic fused polycyclic group" as used herein refers to a monovalent group (for example, having 8 to 60 carbon atoms) having two or more rings fused with each other, only carbon atoms as ring-forming atoms, and non-aromaticity in its entire molecular structure. An example of the monovalent non-aromatic fused polycyclic group is a fluorenyl group. The term "divalent non-aromatic fused polycyclic group" as used herein refers to a divalent group having a structure corresponding to the monovalent non-aromatic fused polycyclic group.

The term "monovalent non-aromatic fused heteropolycyclic group" as used herein refers to a monovalent group (for example, having 1 to 60 carbon atoms) having two or more rings fused with each other, at least one heteroatom selected from N, O, Si, P, and S, other than carbon atoms, as a ring-forming atom, and non-aromaticity in its entire molecular structure. An example of the monovalent non-aromatic fused heteropolycyclic group is a carbazolyl group. The term "divalent non-aromatic condensed heteropolycyclic group" as used herein refers to a divalent group having a structure corresponding to the monovalent non-aromatic condensed heteropolycyclic group.

The term "$C_4$-$C_{60}$ carbocyclic group" as used herein refers to a monocyclic or polycyclic group having 4 to 60 carbon atoms in which a ring-forming atom is a carbon atom only. The term "$C_4$-$C_{60}$ carbocyclic group" as used herein refers to an aromatic carbocyclic group or a non-aromatic carbocyclic group. The $C_4$-$C_{60}$ carbocyclic group may be a ring such as benzene, a monovalent group such as a phenyl group, or a divalent group such as a phenylene group. In one or more exemplary embodiments, depending on the number of substituents connected to the $C_4$-$C_{60}$ carbocyclic group, the $C_4$-$C_{60}$ carbocyclic group may be a trivalent group or a quadrivalent group.

The term "$C_2$-$C_{60}$ heterocyclic group" as used herein refers to a group having the same structure as the $C_4$-$C_{60}$ carbocyclic group, except that as a ring-forming atom, at least one heteroatom selected from N, O, Si, P, and S is used in addition to carbon (the number of carbon atoms may be in a range of 2 to 60).

The terms "hydrogen," "deuterium," "fluorine," "chlorine," "bromine," and "iodine" refer to their respective atoms and corresponding radicals.

As used herein, at least one substituent of the substituted $C_4$-$C_{60}$ carbocyclic group, the substituted $C_2$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_6$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_2$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a "substituted phenyl group" having a "$C_6$-$C_{60}$ aryl group" as a substituent.

The term "terphenyl group" as used herein refers to "a phenyl group substituted with a biphenyl group". In other words, the "terphenyl group" is a "substituted phenyl group" having a "$C_6$-$C_{60}$ aryl group substituted with a $C_6$-$C_{60}$ aryl group" as a substituent.

*, *', and *", as used herein, unless defined otherwise, each indicate a binding site to a neighboring atom in a corresponding formula.

Hereinafter, a compound according to exemplary embodiments and a light-emitting device according to exemplary embodiments will be described in detail with reference to Examples.

EXAMPLES

Synthesis Example 1

Formation of Quantum Dot-Containing Complex 1

Referring to "Tuning Quantum-Dot Organization in Liquid Crystals for Robust Photonic Applications," Chem. Phys. Chem., 15, p 1413-1421, a monodisperse quantum dot-containing complex 1 (a spherical particle) was manufactured. The followings are used as a polymerization initiator, a first monomer, and a quantum dot:

Polymerization initiator: potassium persulfate (KPS);
First monomer: ligand 1 as depicted above; and
Quantum dot: InP/ZnS core-shell quantum dot (average particle size: 3-8 nm).

Comparative Synthesis Example 1

A quantum dot-containing complex 2 was manufactured by using the same method as Synthesis Example 1, except that the following ligands were used instead of ligand 1.

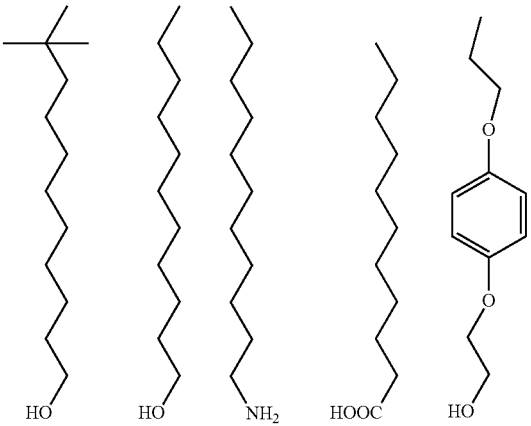

Example 1: Preparation of Quantum Dot-Containing Composition 1

As described below, a quantum dot-containing complex (15 wt %.), a second monomer (30 wt %.), a photopolymerization initiator (5 wt %.), a dispersant (5 wt %.), a first solvent (30 wt %.), and a second solvent (15 wt %.) based on the total mixture were mixed together to manufacture a quantum dot-containing composition 1.

Quantum dot-containing complex: quantum dot-containing complex 1

Second monomer: dipentaerythritol hexaacrylate (DPHA) (Aldrich 407283, of Merck KGaA, Darmstadt, Germany)

Photopolymerization initiator: Irgacure-907 (BASF Corporation of Ludwigshafen, Germany)

Dispersant: DISPER BYK-2011 (BYK-Chemie Corporation of Wesel, Germany)

First solvent: 3-phenyl-propionic acid ethyl ester

Second solvent: propylene glycol monomethyl ether acetate

Comparative Example 1

A quantum dot-containing composition 2 was manufactured by using the same method as Example 1, except that the quantum dot-containing complex 2 according to Comparative Synthesis Example 1 was used instead of the quantum dot-containing complex 1 according to Synthesis Example 1, as a quantum dot-containing complex.

Evaluation Example 1: Analysis of Optical Characteristics of Display

An organic light-emitting display device 1 was manufactured by sequentially stacking an anode including a metal material, an organic layer including a blue emission layer containing a light-emitting material, a cathode including a conductive material, and a sample 1 sampled from the quantum dot-containing composition 1.

An organic light-emitting display device 2 was manufactured by using the same method as the organic light-emitting display device 1, except that sample 2 sampled from the quantum dot-containing composition 2 was used instead of the sample 1.

Subsequently, the organic light-emitting display devices 1 and 2 were each stored for about 40 days at a temperature of 85° C. and under a relative humidity of 85%, respectively.

Figure 3:
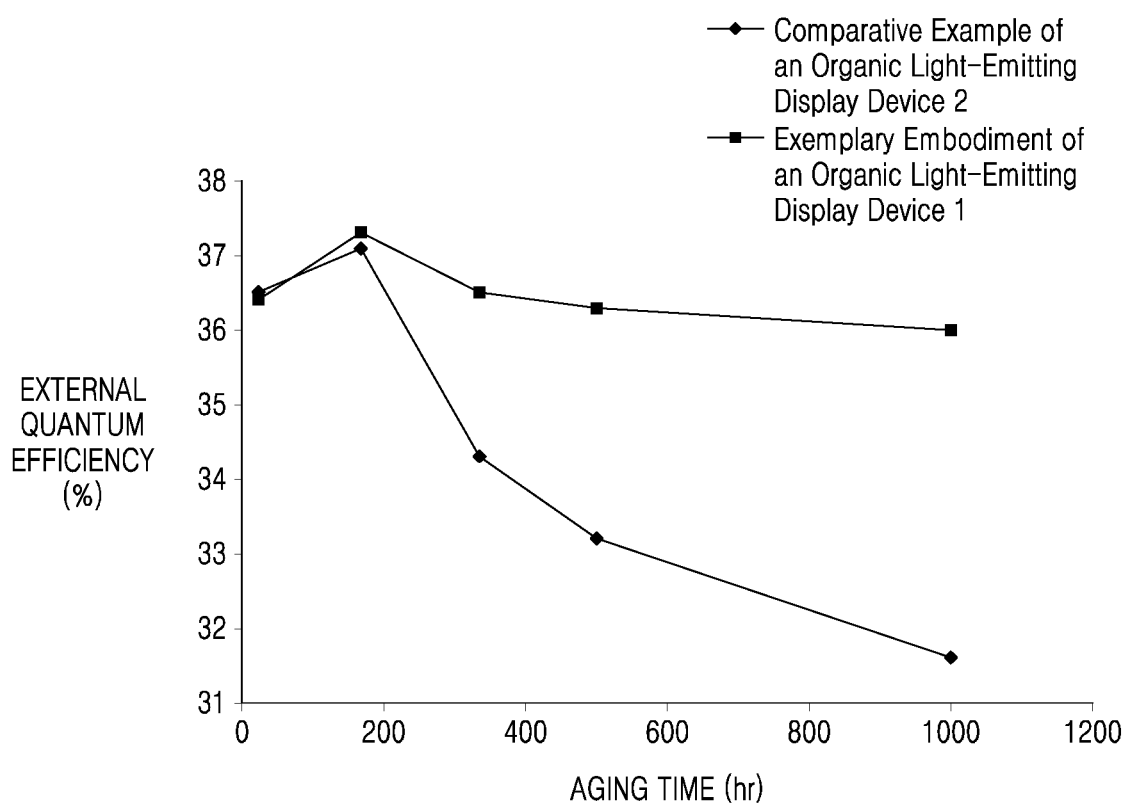
FIG. 3 is a graphical depiction illustrating changes in external quantum efficiency over time of an exemplary embodiment of an organic light-emitting device 1 and a comparative example of an organic light-emitting device 2.

FIG. 3 is a graphical depiction illustrating changes in external quantum efficiency over time of an exemplary embodiment of an organic light-emitting device 1 and a comparative example of an organic light-emitting device 2. Quantum efficiency was measured using an EQE (External Quantum Efficiency) measuring instrument using an integrating sphere.

Specifically, after measuring an initial EQE of the samples 1 and 2 coated on Bare Glass and reference (glass/QD/$SiN_x$), the changes in EQE is measured for each time while aging is performed on the organic light-emitting device.

Changes in external quantum efficiency of the organic light-emitting devices 1 and 2 were measured, and the results are shown in FIG. 3. From the results of FIG. 3, the light-emitting apparatus to which the quantum dot-containing composition according to the exemplary embodiments is applied has excellent efficiency.

According to the principles and exemplary implementations and/or exemplary methods of the invention, by introducing a polymerizable group into a reactive ligand coordinated to a quantum dot, the quantum dot-containing complex may improve stability and exhibit high efficiency.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A quantum dot-containing complex comprising:
   a quantum dot; and
   a plurality of ligands coordinated to the surface of the quantum dot and being a monomer represented by Formula 1:

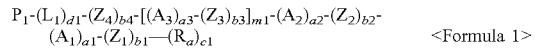
<Formula 1>

<Formula 2> wherein, in Formulae 1 and 2

$A_1$ to $A_3$ are each, independently from one another, a substituted or unsubstituted $C_3$-$C_{60}$ carbocyclic group or a substituted or unsubstituted $C_1$-$C_{60}$ heterocyclic group;

a1 is an integer from 1 to 6, and a2 and a3 are each, independently from one another, an integer from 0 to 6;

$Z_1$ to $Z_6$ are each, independently from one another, *—O—*', *—S*', *—C(=O)—*', *—C(=O)O—*', *—OC(=O)—*', *—O—C(=O)—O*', *—OCH$_2$—*', *—SCH$_2$—*', *—CH$_2$S—*', *—CF$_2$O*', *—OCF$_2$—*', *—CF$_2$S—*', *—SCF$_2$—*', *—(CH$_2$)$_{n1}$—*', *—CF$_2$CH$_2$—*', *—CH$_2$CF$_2$—*', *—(CF$_2$)$_{n1}$—*', *—CH=CH—*', *—CF=CF—*', *—C≡C—*', *—CH=CH—C(=O)O—*', *—OC(=O)—CH=CH—*', *—C(Q$_1$)(Q$_2$)-*', *—CH(—(S$_p$)$_{e1}$—P$_3$)—*', *—CH$_2$CH(—(S$_p$)$_{e1}$—P$_3$)—*', *—(CH(—(S$_p$)$_{e1}$—P$_3$)CH(—(S$_p$)$_{e2}$—P$_3$)—*', or *—O—(CH$_2$)—O(C=O)—(CH$_2$)$_{n2}$—*';

n1 is an integer from 1 to 4, and n2 is an integer from 0 to 2;

b1 to b6 are each, independently from one another, an integer from 0 to 6;

m1 is an integer from 0 to 6;

$L_1$ is a substituted or unsubstituted $C_3$-$C_{60}$ carbocyclic group, a substituted or unsubstituted $C_1$-$C_{60}$ heterocyclic group, *—S(=O)(Q$_1$)-*', *—S(=O)$_2$—*', *—P(=O)(Q$_1$)-*', *—P(=O)$_2$—*', *—P(=S)(Q$_1$)-*', or *—P(=S)$_2$—*';

d1 is an integer from 0 to 4;

$S_p$ is a spacer group or a single bond;

e1 to e2 are each, independently from one another, an integer from 1 to 4;

$R_a$ is an anchoring group;

c1 is an integer from 1 to 6;

$P_1$ to $P_3$ are each, independently from one another, a polymerizable group of Formulae P-1 to P-8;

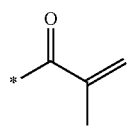
P-1

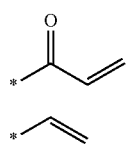
P-2

P-3

-continued

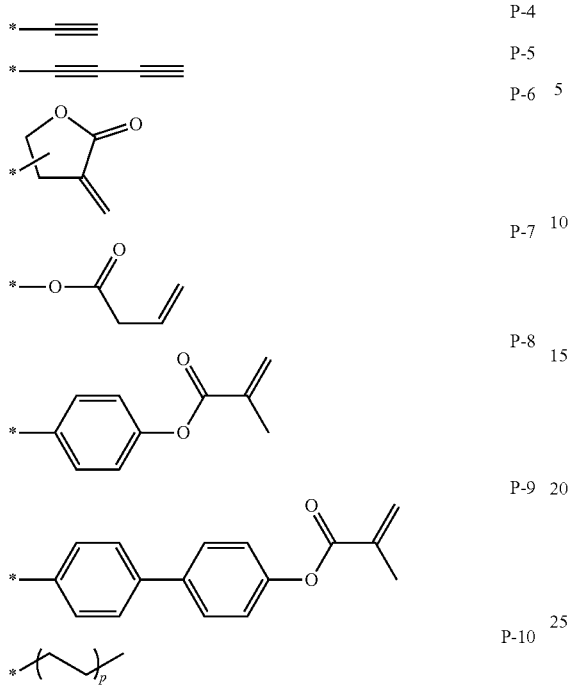

wherein, in Formulae P-1 to P-8, * indicates a binding site to a neighboring atom, at least one substituent of the substituted $C_3$-$C_{60}$ carbocyclic group and the substituted $C_1$-$C_{60}$ heterocyclic group is a group of Formula 2, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

$Q_1$ to $Q_2$ and $Q_{11}$ to $Q_{13}$ are each, independently from one another, hydrogen, deuterium, —F, —Cl, —Br, —I, a hydroxyl group, a cyano group, a nitro group, an amino group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group; and

* and *' each indicate a binding site to a neighboring atom, wherein the polymerizable groups of neighboring ligands are polymerized to form a network.

2. The quantum dot-containing complex of claim 1, wherein $A_1$ to $A_3$ are each, independently from one another:

a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each, independently from one another, optionally substituted with at least one of a group of Formula 2, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a pyridinyl group, a pyrazinyl group, a pyrimidinyl group, a pyridazinyl group, a quinolinyl group, an isoquinolinyl group, a benzofuranyl group, a benzothiophenyl group, —NCO, —NCS, —OCN, —SCN, —C(=O)N($Q_{11}$)$_2$, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$) and —P(=O)($Q_1$)($Q_{12}$);

wherein $Q_{11}$ to $Q_{13}$ are each, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group.

3. The quantum dot-containing complex of claim 1, wherein *-($A_1$)-*' to *-($A_3$)-*' are each, independently from one another, a group of Formulae A-1 to A-22:

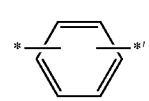

A-1

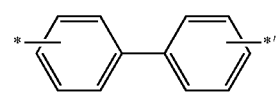

A-2

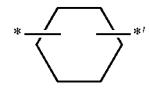

A-3

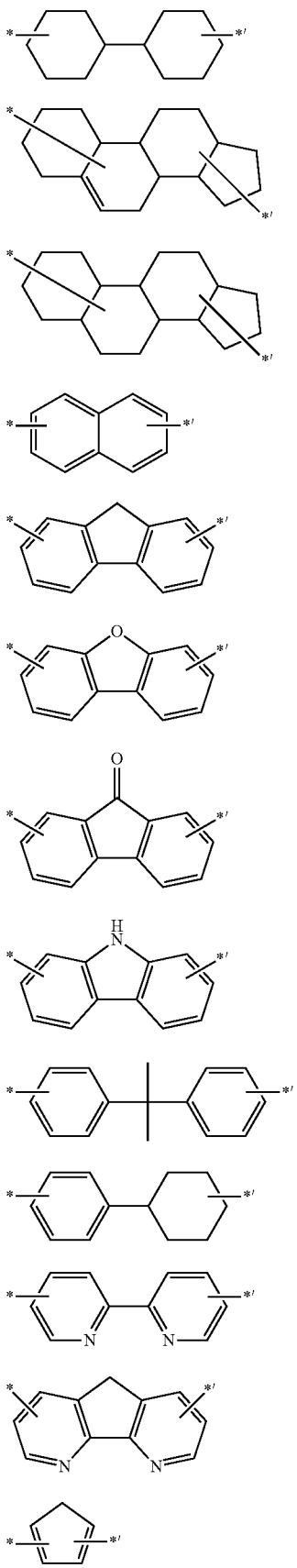

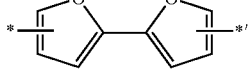

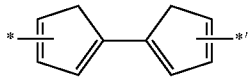

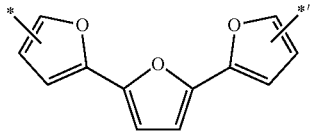

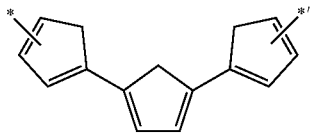

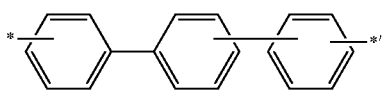

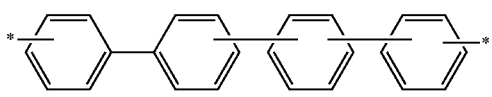

wherein, in Formulae A-1 to A-22;
* and *' each indicate a binding site to a neighboring atom and a1 to a3 have the same meanings as in claim 1.

4. The quantum dot-containing complex of claim 1, wherein
the spacer group is *—N($Q_1$)-*', *—O—*', *—S—*', *—Si($Q_1$)($Q_2$)-*', a divalent $C_1$-$C_{20}$ alkyl group, or a divalent $C_1$-$C_{20}$ alkoxy group; wherein each of the divalent $C_1$-$C_{20}$ alkyl group and divalent $C_1$-$C_{20}$ alkoxy group, independently from one another, optionally substituted with at least one of deuterium, —F, —Cl, —Br, —I, a hydroxyl group, a cyano group, a $C_1$-$C_{10}$ alkyl group, a $C_1$-$C_{10}$ alkoxy group, —NCO, —NCS, —OCN, and —SCN;
wherein $Q_1$ to $Q_2$ are each, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group; and
* and *' each indicate a binding site to a neighboring atom.

5. The quantum dot-containing complex of claim 1, wherein
—($S_p$)$_{e1}$—*' and *—($S_p$)$_{e2}$—*' are each, independently from one another, a single bond, *—(CH$_2$)$_{i1}$—*', *—(CH$_2$CH$_2$O)$_{i1}$—CH$_2$CH$_2$—*', *—CH$_2$CH$_2$—S—CH$_2$CH$_2$—*', *—CH$_2$CH$_2$—NH—CH$_2$CH$_2$—*', or *-(SiQ$_1$Q$_2$-O)$_{i1}$—*';
wherein i1 is an integer from 1 to 12;
$Q_1$ to $Q_2$ are each, independently from one another, hydrogen, a $C_1$-$C_{20}$ alkyl group, a $C_1$-$C_{20}$ alkoxy group, a phenyl group, a biphenyl group, a terphenyl group, a naphthyl group, or a pyridinyl group; and
* and *' each indicate a binding site to a neighboring atom.

6. The quantum dot-containing complex of claim 1, wherein $R_a$ is an organic salt, *—OH, *—NO$_2$, *—COOH, —F, —Cl, —Br, —I, *—(O(C(Q$_1$)(Q$_2$))$_{n3}$—O—C(Q$_3$)(Q$_4$)(Q$_5$))$_{n4}$, *—N(Q$_1$)(Q$_2$), a substituted or unsubstituted C$_1$-C$_{30}$ alcohol group, a substituted or unsubstituted C$_1$-C$_{30}$ carboxylic acid group, a substituted or unsubstituted C$_3$-C$_{60}$ carbocyclic group, or a substituted or unsubstituted C$_1$-C$_{60}$ heterocyclic group; and at least one substituent of the substituted C$_3$-C$_{60}$ carbocyclic group, the substituted C$_1$-C$_{60}$ heterocyclic group, the substituted C$_1$-C$_{30}$ alcohol group, and the substituted C$_1$-C$_{30}$ carboxylic acid group is a group of Formula 2, deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic fused polycyclic group, a monovalent non-aromatic fused heteropolycyclic group, —NCO, —NCS, —OCN, —SCN, —C(=O)N(Q$_{11}$)$_2$, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), and —P(=O)(Q$_{11}$)(Q$_{12}$);

wherein Q$_1$ to Q$_5$ and Q$_{11}$ to Q$_{13}$ are each, independently from one another, hydrogen, deuterium, —F, —Cl, —Br, —I, a hydroxyl group, a cyano group, a nitro group, an amino group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_1$-C$_{60}$ heteroaryl group, a monovalent non-aromatic fused polycyclic group, a monovalent non-aromatic fused heteropolycyclic group, a biphenyl group, or a terphenyl group;

n3 and n4 are each, independently from one another, an integer from 1 to 6; and

* indicates a binding site to a neighboring atom.

7. The quantum dot-containing complex of claim 1, wherein R is a group of Formulae E-1 to E-28:

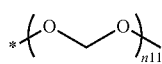

E-1

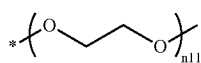

E-2

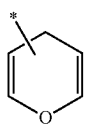

E-3

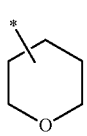

E-4

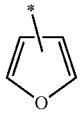

E-5

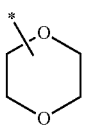

E-6

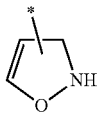

E-7

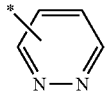

E-8

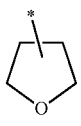

E-9

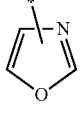

E-10

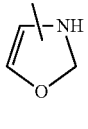

E-11

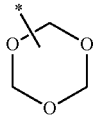

E-12

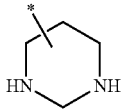

E-13

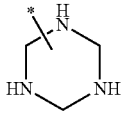

E-14

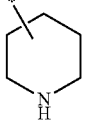

E-15

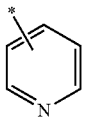

E-16

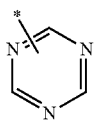 E-17

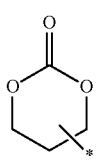 E-18

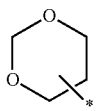 E-19

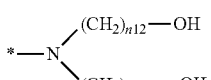 E-20

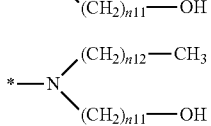 E-21

*—OH  E-22

*—NH$_2$  E-23

*—NO$_2$  E-24

*—COOH  E-25

*—Cl  E-26

*—Br  E-27

*—I  E-28 wherein, in Formulae E-1 to E-28;
n11 and n12 are each, independently from one another, an integer from 1 to 12; and
* indicates a binding site to a neighboring atom.

8. The quantum dot-containing complex of claim 1, wherein the quantum dot comprises a core including a first semiconductor having a crystal structure and a shell including a second semiconductor having a crystal structure, or is a Perovskite compound.

9. The quantum dot-containing complex of claim 8, wherein the first semiconductor and the second semiconductor each, independently from one another, comprise Group 12-Group 16-based compounds, Group 13-Group 15-based compounds, Group 14-Group 16-based compounds, Group 14-based compounds, Group 11-Group 13-Group 16-based compounds, Group 11-Group 12-Group 13-Group 16-based compounds, or any combination thereof.

10. The quantum dot-containing complex of claim 8, wherein the first semiconductor and the second semiconductor each, independently from one another, comprise:
CdS, CdSe, CdTe, ZnS, ZnSe, ZnTe, ZnO, HgS, HgSe, HgTe, MgS, and MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe; CdZnSeS, CdZnSeTe, CdZnSTe, CdHgSeS, CdHg-SeTe, CdHgSTe, HgZnSeS, HgZnSeTe, HgZnSTe,
GaN, GaP, GaAs, GaSb, AlN, AlP, AlAs, AlSb, InN, InP, InAs, and InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP; GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb,
InZnP,
SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, SnPbSTe,
Si, Ge, SiC, SiGe,
AgInS, AgInS$_2$, CuInS, CuInS$_2$, CuGaO$_2$, AgGaO$_2$, AgAlO$_2$, or
any combination thereof.

11. The quantum dot-containing complex of claim 8, wherein
the first semiconductor comprises GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and
the second semiconductor comprises CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

12. The quantum dot-containing complex of claim 1, wherein an average particle diameter (D50) of the quantum dot is about 2 to about 10 nm.

13. A quantum dot-containing complex comprising:
a quantum dot; and
a plurality of ligands coordinated to the surface of the quantum dot and being a monomer represented by one of ligand 1 to ligand 13:

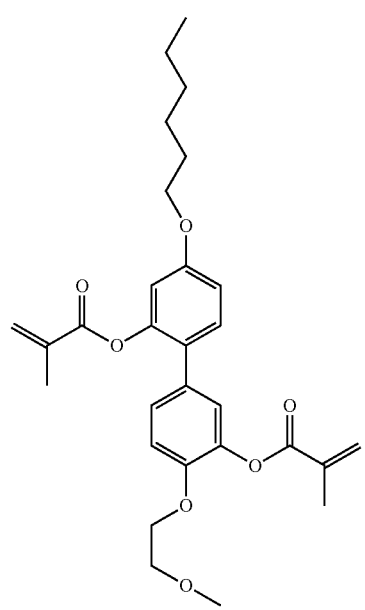

1

143
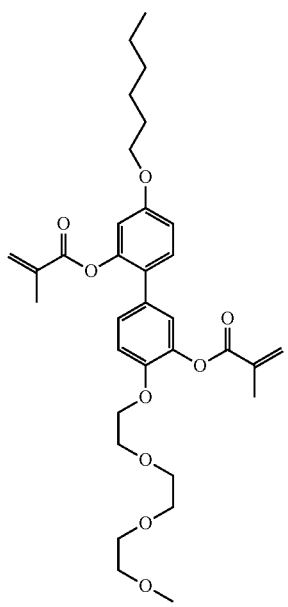
2
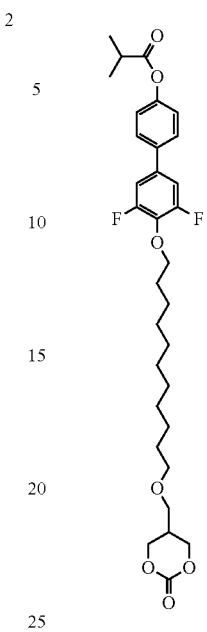
3
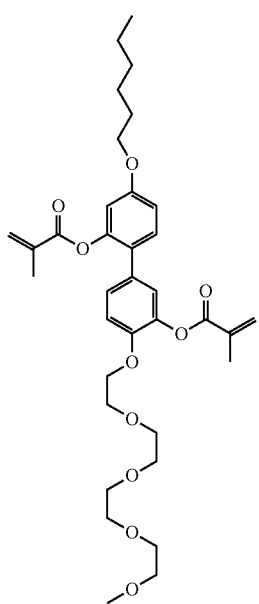
144
4
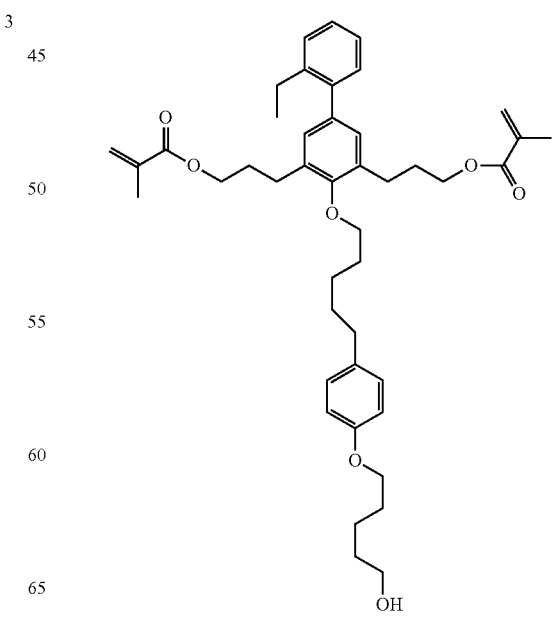
5

145
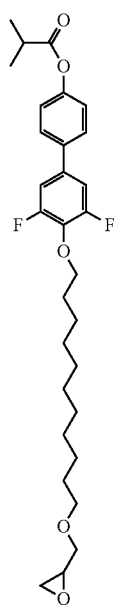
146
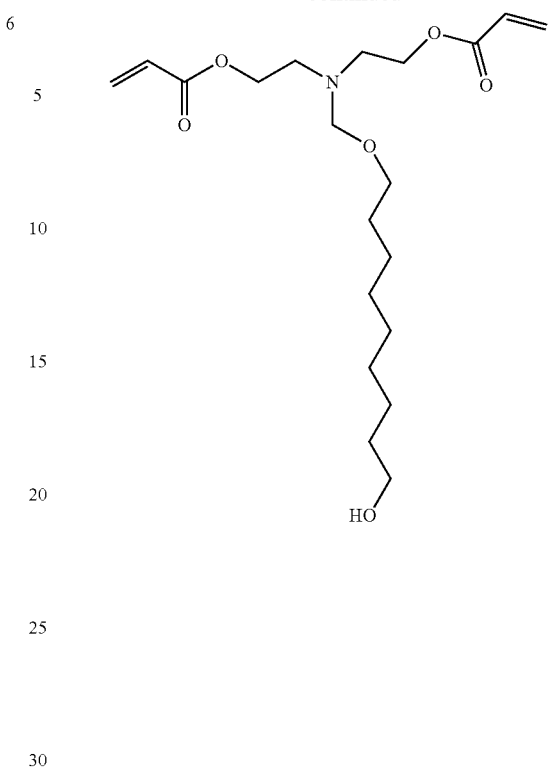
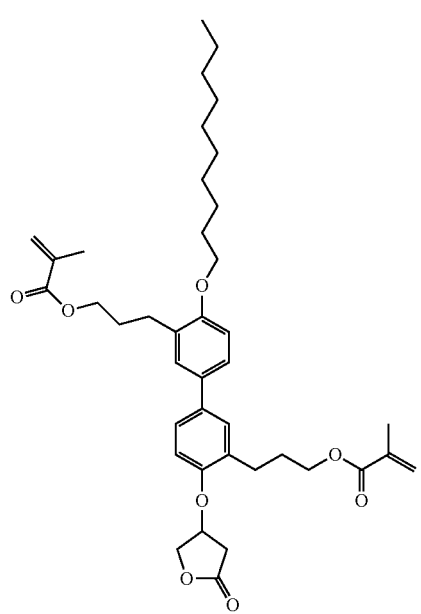
7
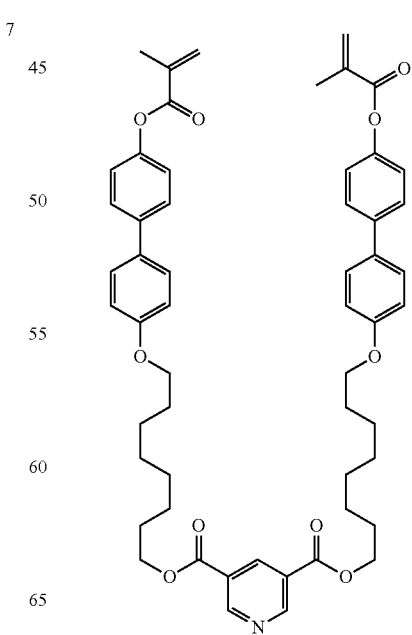
8

147
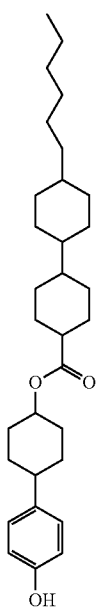
148
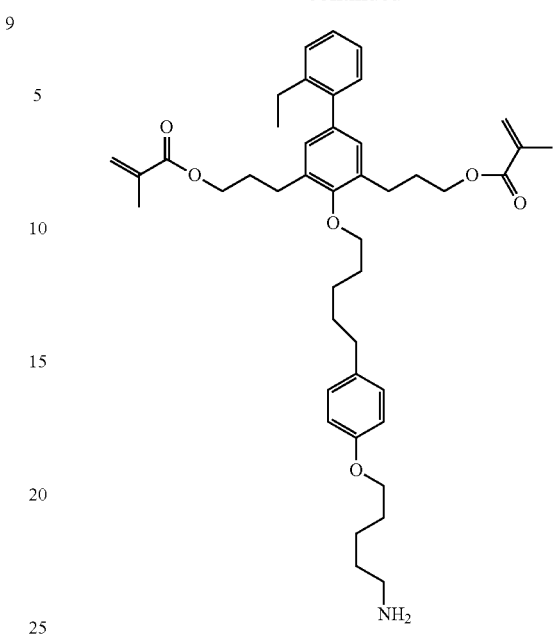
9
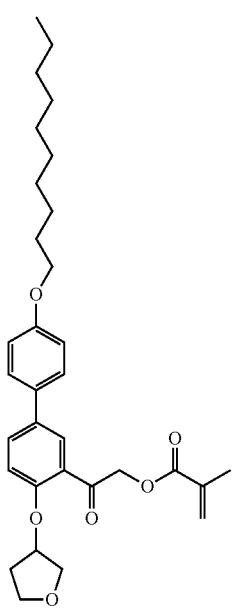
10
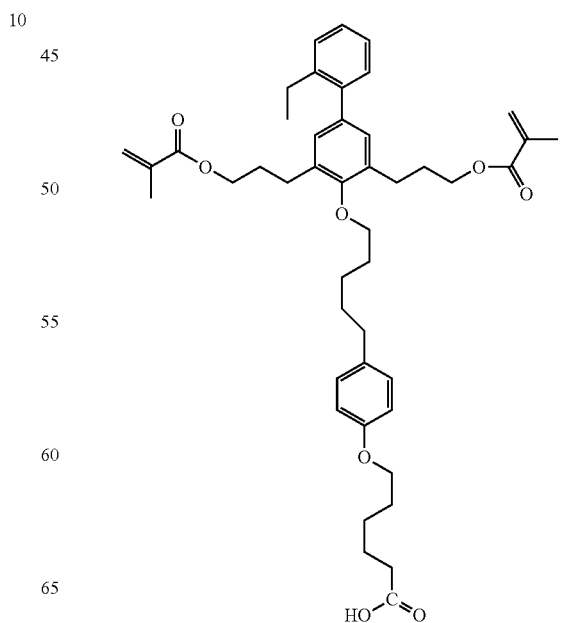

-continued

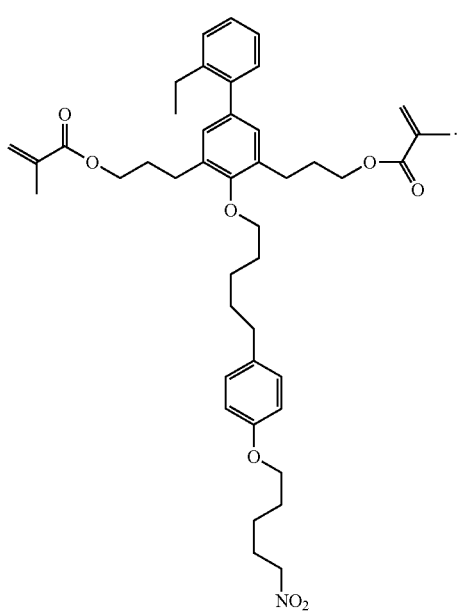

14. A light-emitting device comprising:
a first electrode;
a second electrode facing the first electrode; and
an emission layer disposed between the first electrode and the second electrode,
wherein the emission layer comprises the quantum dot-containing complex of claim 1.

15. An optical member comprising the quantum dot-containing complex of claim 1.

16. The optical member of claim 15, wherein the optical member comprises a color conversion member.

17. A device comprising the quantum dot-containing complex of claim 1.

18. The device of claim 17, further comprising a light source, wherein the quantum dot-containing complex is located in a path of light to be emitted from the light.

19. The device of claim 18, wherein the light source comprises an organic light emitting diode or a light-emitting diode.

* * * * *